(12) United States Patent  
Cohen

(10) Patent No.: US 8,639,018 B2  
(45) Date of Patent: Jan. 28, 2014

(54) SYSTEMS AND METHODS FOR IMAGING MULTIPLE SIDES OF OBJECTS

(75) Inventor: Shy Cohen, Yokneam Moshava (IL)

(73) Assignee: Camtek Ltd., Migdal Haemek, IL (US)

( * ) Notice: Subject to any disclaimer, the term of this patent is extended or adjusted under 35 U.S.C. 154(b) by 599 days.

(21) Appl. No.: 12/723,702

(22) Filed: Mar. 15, 2010

(65) Prior Publication Data

US 2011/0102574 A1 May 5, 2011

Related U.S. Application Data

(60) Provisional application No. 61/180,863, filed on May 24, 2009.

(51) Int. Cl.
  *G06K 9/00* (2006.01)
  *G06K 7/00* (2006.01)
  *G01R 31/12* (2006.01)

(52) U.S. Cl.
  USPC ............ 382/144; 382/145; 382/312; 324/548

(58) Field of Classification Search
  USPC .................. 382/141, 144, 145, 312; 250/306, 250/442.11; 356/237.1; 209/571; 348/86, 348/61, E5.024, E5.008, E7.009, E7.024, 348/E5.006, E7.07, E7.085; 324/548; 705/53

See application file for complete search history.

(56) References Cited

U.S. PATENT DOCUMENTS

| | | | | |
|---|---|---|---|---|
| 4,403,726 | A * | 9/1983 | Snyder et al. | 227/149 |
| 7,251,354 | B2 * | 7/2007 | Kanno et al. | 382/145 |
| 7,812,941 | B2 * | 10/2010 | Cameron et al. | 356/237.1 |
| 7,928,378 | B2 * | 4/2011 | Kimba et al. | 250/307 |

* cited by examiner

*Primary Examiner* — Sheela Chawan
(74) *Attorney, Agent, or Firm* — Oren Reches

(57) ABSTRACT

A system for acquiring multiple images of objects, the system includes: a lateral transferor that comprises multiple lateral transferor portions adapted to transfer the objects to a lateral imaging area in a lateral manner; wherein each lateral transferor portion comprises a object receiver and a transfer element; wherein the transfer element moves the object receiver towards an imaging area unless encountering a resistance that is above a predefined resistance; and an imager that is configured to obtain images of two opposite sides of the object when the objects are positioned at the lateral imaging area.

30 Claims, 47 Drawing Sheets

Side view

Front view

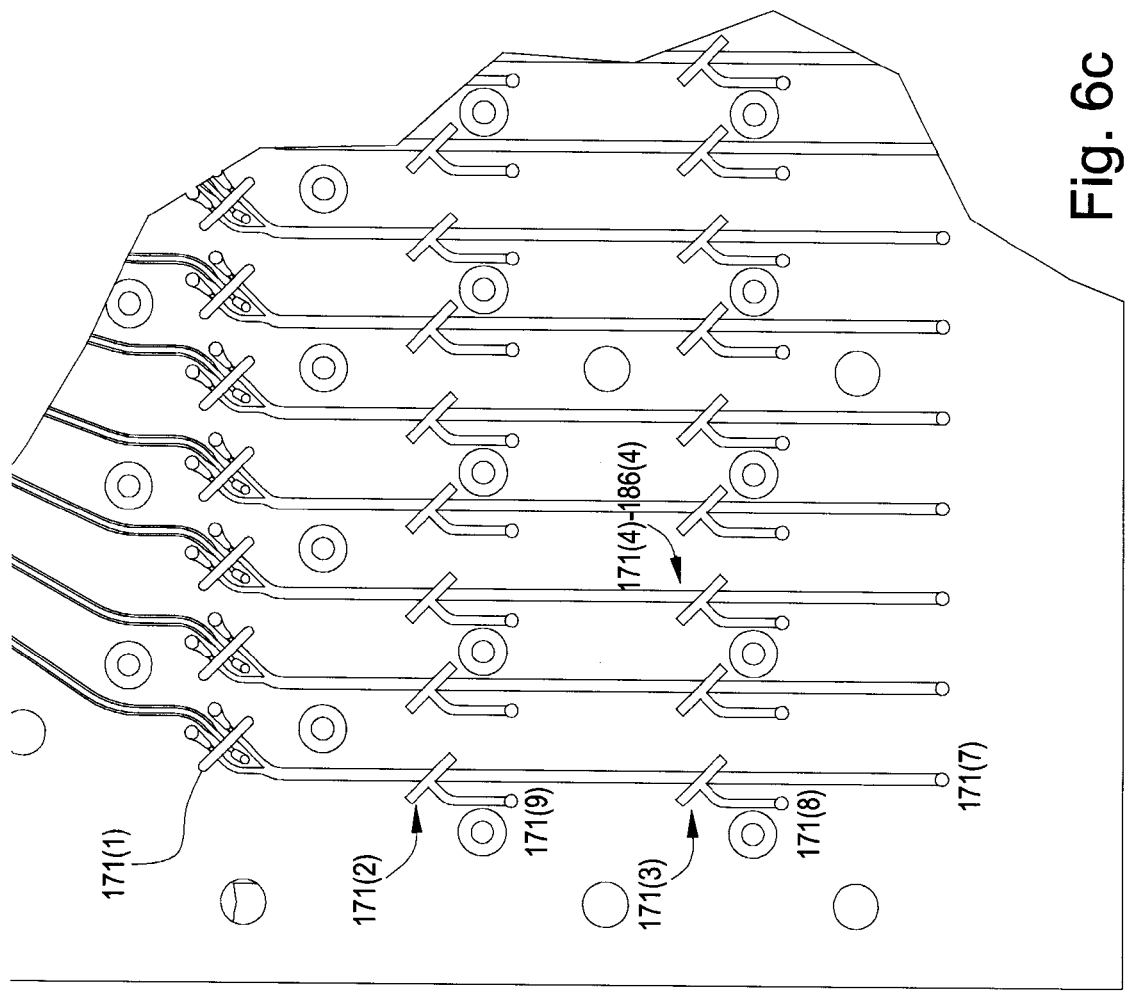

SYSTEMS AND METHODS FOR IMAGING MULTIPLE SIDES OF OBJECTS

RELATED APPLICATIONS

This application claims priority from U.S. provisional patent Ser. No. 61/180,863 filing date May 24, 2009, which is incorporated herein in its entirety.

FIELD OF THE INVENTION

The present invention relates to systems and methods for inspecting objects such as electrical objects and especially small and elongated electrical objects such as but not limited to capacitors.

BACKGROUND OF THE INVENTION

External appearance is one of the inspection methods that are done by comparing images of an inspected object with a reference image. In case of one or two sides imaging e.g., wafers or Printed Circuit Boards an image is captured from a perpendicular view or from a below view for inspection, which are simple tasks.

In the case of a six-faced object, the procedure is more complicated. Such an inspection is needed for many products and some of these products are very small or in large quantities. For instance, there is a need to inspect the whole sides of electrical objects that are used in microelectronic production (Ceramic Capacitors, Chips and Resistors); a wide range of defects such as dimensional measurements, ceramic defects and termination defects can be recognized by using automatic optical inspection systems.

Systems that use imaging of the overall sides of an object were disclosed in U.S. Pat. No. 4,912,318 "inspection Equipment for Small Bottles" and U.S. Pat. No. 4,219,269 "External Appearance Inspection System" both assigned to Kajiura et al. additionally, these systems have some shortcomings.

Objects such as but not limited to small capacitors can be damaged during the inspection process or before the inspection process. Dirt as well as objects pieces can jam an inspection device.

The measurement of absolute electrical characteristics of objects, such as capacitors is a relatively long process that limits the throughput of the inspection process.

There is a growing need to provide efficient systems and methods for inspecting objects.

SUMMARY OF EMBODIMENTS OF THE INVENTION

A system for acquiring multiple images of objects, the system includes: a lateral transferor that includes multiple lateral transferor portions adapted to transfer the objects to a lateral imaging area in a lateral manner; wherein each lateral transferor portion includes a object receiver and a transfer element; wherein the transfer element moves the object receiver towards an imaging area unless encountering a resistance that is above a predefined resistance; and an imager that is configured to obtain images of two opposite sides of the object when the objects are positioned at the lateral imaging area.

The predefined resistance can indicate that an object is stuck between the object receiver and a loading element.

The transfer element can move the object receiver in a reciprocating manner.

The transfer element can move the object receiver to multiple initial positions so that the object receiver receives multiple objects, moves the object receiver to a lateral imaging position and then moves the object receiver to an additional position; wherein the multiple initial positions are located between the additional position and the lateral imaging position.

Each transfer element can include a rotational movement to linear movement converter that converts a rotational movement of at least one rotating element to a linear movement of the object receiver unless encountering a resistance that is above the predefined resistance.

The rotational movement to linear movement converter can include at least one rotating element that loosely connected to a linear structural element.

The multiple transfer elements can share at least one rotational element that performs a rotational movement that is translated to a linear movement of each of the multiple transfer elements.

The multiple transfer elements can share a multi-clutch.

Each bus receiver can include multiple spaces in which objects are positioned in a lateral manner.

Each bus receiver can receive the objects from a loading element that is substantially vertical to the bus receiver; wherein objects move within the loading element in a longitudinal manner.

The objects can be millimeteric capacitors—capacitors that at least one of their dimensions is few millimeters long.

The system can further include a sorting unit adapted to sort in parallel multiple objects according to their functionality.

The system can further include multiple longitudinal transferors that comprise multiple tunnels through which the objects propagate to multiple imaging areas; wherein the multiple longitudinal transferors utilize gas pressure differentials to convey the objects through the tunnels; a plurality of rotation modules configured to rotate objects about a longitudinal axis of the objects; wherein each rotating module is located between two longitudinal transferors; wherein the imager is configured to obtain, in each of the multiple imaging areas, an image of a side of the objects.

The system can further include a feeder that receives objects from an inlet and supplies objects to a lateral transferor via tunnels of the feeder, introduces at least one inducing gas pulse that induces objects to enter the tunnels of the feeder; introduces at least one rejecting gas pulse that rejects objects from the tunnels of the feeder; wherein the introduction of the at least one rejecting gas pulse is followed by introducing at least one inducing gas pulse.

The system can include a longitudinal transferor that includes multiple tunnels through which the objects propagate to an imaging area; wherein the longitudinal transferor utilizes gas pressure differentials to convey the objects through the tunnels; and an object grouping module that receives objects and partitions the received objects to substantially fixed sized groups of objects and sends each of the substantially fixed sized groups a tunnel out of the multiple tunnels of the longitudinal transferor.

A system acquiring multiple images of objects, the system includes: a longitudinal transferor that includes multiple tunnels through which the objects propagate to an imaging area; wherein the longitudinal transferor utilizes gas pressure differentials to convey the objects through the tunnels; an imager that is configured to obtain, in the imaging area, an image of a side of the objects; and an object grouping module that receives objects and partitions the received objects to substantially fixed sized groups of objects and sends each of the substantially fixed sized groups a tunnel out of the multiple tunnels of the longitudinal transferor.

The object grouping module can include multiple pairs of stopping elements; wherein each pair of stopping elements includes a first stopping element and a stopping element that are spaced apart from each other; wherein the second stopping elements allows a transfer of objects towards a tunnel of the longitudinal transferor during a fixed time period; wherein the first stopping element prevents objects from passing it during the fixed time period.

The object grouping module can include multiple pairs of stopping elements that are moved from an object stopping position to an object unstopping position by applying a gas differential.

Each stopping element can include a piston that is connected to a vertical rod; wherein the piston reciprocates within a space that has an inlet and an outlet; wherein the inlet and outlet facilitate introduction of gas to the space such as to induce the reciprocation of the piston; wherein the piston reciprocates between an object stopping position in which the vertical rod stops objects from passing it and an object unstopping position in which the vertical rod allows objects to pass it.

The system can include multiple lateral transferor portions adapted to transfer the objects to a lateral imaging area in a lateral manner; wherein each lateral transferor portion includes a object receiver and a transfer element; wherein the transfer element moves the object receiver towards an imaging area unless encountering a resistance that is above a predefined resistance; and an imager that is configured to obtain images of two opposite sides of the object when the objects are positioned at the lateral imaging area.

The system can include a feeder that receives objects from an inlet and supplies objects to a lateral transferor via tunnels of the feeder, introduces at least one inducing gas pulse that induces objects to enter the tunnels of the feeder; introduces at least one rejecting gas pulse that rejects objects from the tunnels of the feeder; wherein the introduction of the at least one rejecting gas pulse is followed by introducing at least one inducing gas pulse.

A system acquiring multiple images of objects, the system includes: a transferor that includes multiple tunnels through which the objects propagate to an imaging area; wherein the transferor utilizes gas pressure differentials to convey the objects through the tunnels; an imager that is configured to obtain, in the imaging area, an image of a side of the objects; and a feeder that receives objects from an inlet and supplies objects to the transferor via tunnels of the feeder, introduces at least one inducing gas pulse that induces objects to enter the tunnels of the feeder; introduces at least one rejecting gas pulse that rejects objects from the tunnels of the feeder; wherein the introduction of the at least one rejecting gas pulse is followed by introducing at least one inducing gas pulse.

The system can repetitively induce rejecting gas pulses and inducing gas pulses.

The feeder can induce a rejecting gas pulse in response to a transfer of objects through the tunnels of the feeder.

The feeder can induce a rejecting gas pulse in a periodical manner.

The tunnels of the feeder can be preceded by a space that is arranged to receive the objects; wherein a height of the space is designed to prevent objects from being positioned above another object.

The pressure differential introduced by an inducing gas pulse can differ from a pressure differential introduced by a rejecting gas pulse.

A method for imaging objects, the method includes: receiving multiple objects by multiple object receivers of multiple lateral transferor portion of a lateral transferor; laterally transferring objects to a lateral imaging area by each lateral transferor portion that does not encounter a resistance that is above a predefined resistance; and obtaining images of two sides of objects that are positioned in the lateral imaging area.

Each lateral transferor portion can include an object receiver and a transfer element. The laterally transferring can include moving object receivers by transfer elements that do not encounter a resistance that is above a predefined resistance.

The predefined resistance can indicate that an object is stuck between the object receiver and a loading element.

The method can include moving, by the transfer element, the object receiver in a reciprocating manner.

The method can include moving, by the transfer element, the object receiver to multiple initial positions so that the object receiver receives multiple objects, moving the object receiver to a lateral imaging position and then moving the object receiver to an additional position; the multiple initial positions are located between the additional position and the lateral imaging position.

The method can include converting, by each transfer element, a rotational movement of at least one rotating element to a linear movement of the object receiver unless encountering a resistance that is above the predefined resistance.

The converting can be implemented by a rotational movement to linear movement converter that includes at least one rotating element that is loosely connected to a linear structural element.

The method can include converting a rotational movement of a shared rotational element to a linear movement of each of the multiple transfer elements.

The method can include converting a rotational movement to a linear movement by a multi-clutch.

The method can include receiving multiple objects by multiple object receivers, wherein each bus receiver includes multiple spaces in which objects are positioned in a lateral manner.

The method can include receiving multiple objects by multiple object receivers from loading elements that are substantially vertical to the bus receivers; and objects can move within the loading element in a longitudinal manner.

The method can include sorting in parallel multiple objects according to their functionality.

The method can further include: transferring objects through multiple tunnels of multiple longitudinal transferors to multiple imaging areas; the multiple longitudinal transferors utilize gas pressure differentials to convey the objects through the tunnels; rotating the objects by a plurality of rotation modules configured to rotate objects about a longitudinal axis of the objects; each rotating module is located between two longitudinal transferors; and obtaining, in each of the multiple imaging areas, an image of a side of the objects.

The method can further include: receiving objects by a feeder; introducing at least one inducing gas pulse that induces objects to enter the tunnels of the feeder; introducing at least one rejecting gas pulse that rejects objects from the tunnels of the feeder; and introducing at least one inducing gas pulse; the introducing of the at least one inducing gas pulses is followed by supplying objects to a lateral transferor via tunnels of the feeder.

The method can include receiving, by an object grouping module, objects; partitioning the objects by the object grouping module to substantially fixed sized groups of objects; and sending each of the substantially fixed sized groups to a tunnel out of the multiple tunnels of a longitudinal transferor.

A method for acquiring multiple images of objects, the method includes: receiving objects by an object grouping module; partitioning the objects by the object grouping module to substantially fixed sized groups of objects; and sending each of the substantially fixed sized groups to a tunnel out of the multiple tunnels of a longitudinal transferor; the objects are millimetric objects that propagate in a longitudinal manner through the multiple tunnels of the longitudinal transferor towards an imaging area; and acquiring images of the objects.

The method can include utilizing pairs of stopping elements; each pair of stopping elements includes a first stopping element and a stopping element that are spaced apart from each other; the partitioning includes allowing, by the second stopping elements, a transfer of objects towards a tunnel of the longitudinal transferor during a fixed time period and preventing, by the first stopping element, objects from passing it during the fixed time period.

The method can include utilizing multiple pairs of stopping elements; the partitioning includes moving stopping elements that form the pairs of stopping elements from an object stopping position to an object unstopping position by applying a gas differential.

The method can include utilizing multiple pairs of stopping elements; each stopping element includes a piston that is connected to a vertical rod; the partitioning includes reciprocating the piston within a space that has an inlet and an outlet by introducing gas to the space; the piston reciprocates between an object stopping position in which the vertical rod stops objects from passing it and an object unstopping position in which the vertical rod allows objects to pass it.

The method can include: receiving objects by a feeder; introducing at least one inducing gas pulse that induces objects to enter the tunnels of the feeder;

introducing at least one rejecting gas pulse that rejects objects from the tunnels of the feeder; and introducing at least one inducing gas pulse; the introducing of the at least one inducing gas pulses is followed by supplying objects to a lateral transferor via tunnels of the feeder.

The method can include receiving multiple objects by multiple object receivers of multiple lateral transferor portion of a lateral transferor; laterally transferring objects to a lateral imaging area by each lateral transferor portion that does not encounter a resistance that is above a predefined resistance; and obtaining images of two sides of objects that are positioned in the lateral imaging area.

A method acquiring multiple images of objects, the method includes: receiving objects by a feeder; introducing at least one inducing gas pulse that induces objects to enter the tunnels of the feeder; introducing at least one rejecting gas pulse that rejects objects from the tunnels of the feeder; and introducing at least one inducing gas pulse; the introducing of the at least one inducing gas pulses is followed by supplying objects to a lateral transferor via tunnels of the feeder.

The method can include repetitively inducing rejecting gas pulses and inducing gas pulses.

The method can include inducing a rejecting gas pulse in response to a transfer of objects through the tunnels of the feeder.

The method can include inducing a rejecting gas pulse in a periodical manner.

The method can include providing objects to a space that precedes the tunnels of the feeder; a height of the space is designed to prevent objects from being positioned above another object.

The pressure differential introduced by an inducing gas pulse differs from a pressure differential introduced by a rejecting gas pulse.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of various embodiments of the present invention. In the figures:

FIG. 6a-6d illustrate portions of a sorting unit according to an embodiment of the invention;

DETAILED DESCRIPTION OF THE DRAWINGS

Figure 1A:
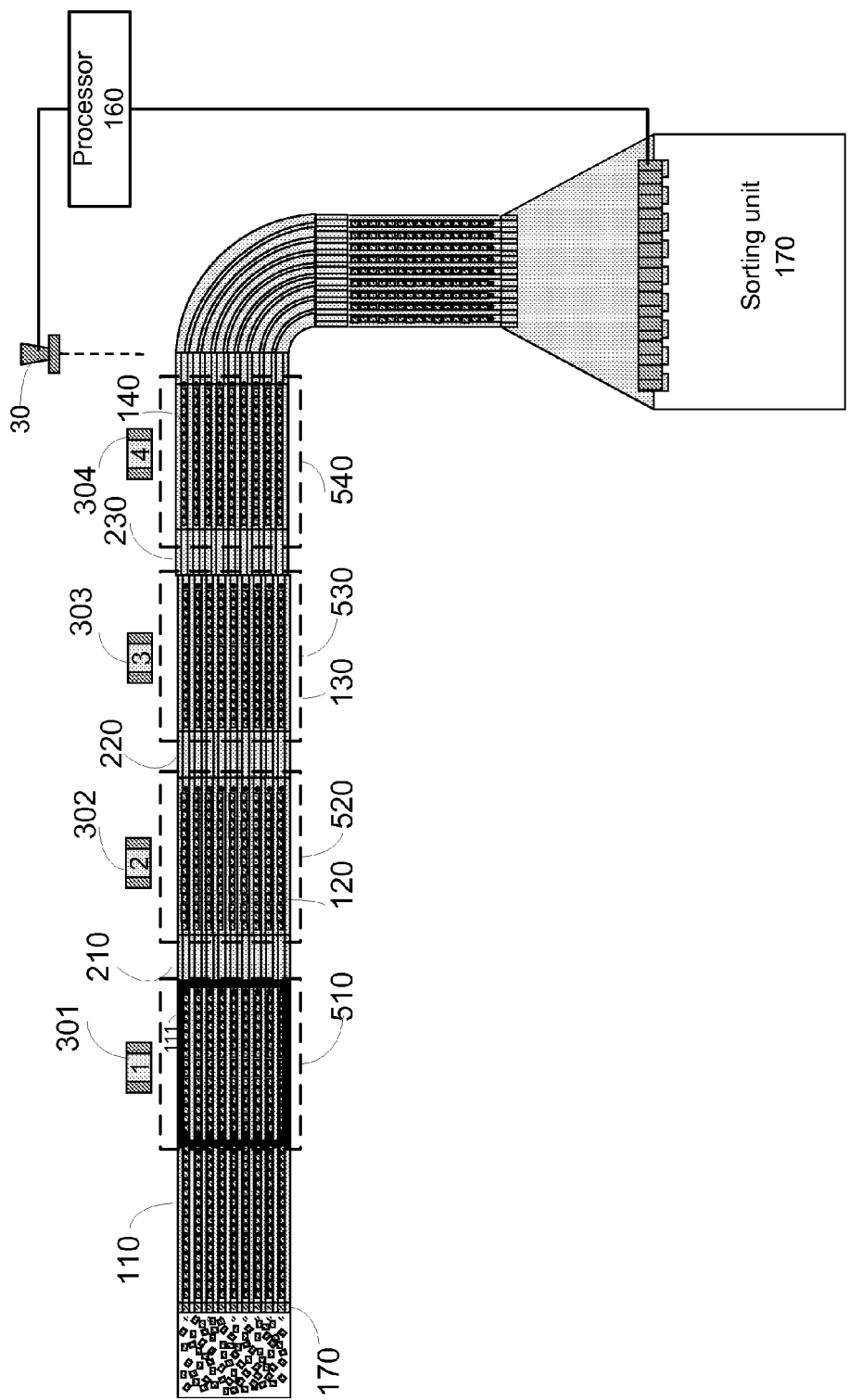
FIGS. 1a-1b illustrate a system for imaging objects according to an embodiment of the invention.

In the following specification, the invention will be described with reference to specific examples of embodiments of the invention. It will, however, be evident that various modifications and changes may be made therein without departing from the broader spirit and scope of the invention as set forth in the appended claims.

Because the apparatus implementing the present invention is, for the most part, composed of electronic objects and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Multiple sides of an object such as an electrical object and especially a small elongated electrical object are imaged. The length of the small elongated electrical objects usually does not exceed few millimeters. The following description will refer to such objects. It is noted that these objects are conveniently small elongated electrical objects such as millimeteric capacitors that later form a part of electrical circuits such as PCBs. Such millimeteric capacitors can be but are not limited to multi layer ceramic capacitors (MLCCs) that are 0.06 Inch long and 0.03 Inch wide, MLCCs that are 0.04 Inch long and 0.02 Inch wide, MLCCs that are 0.02 Inch long and 0.01 Inch wide and MLCCs that are 0.01 Inch long and 0.005 Inch wide, as well as millimeteric resistors.

Multiple sides (or faces) of objects are imaged and these images are then processed to determine, for example, the functionality of these objects. Conveniently, many objects can be imaged per second by illuminating multiple sides of objects and imaging these sides Any of the mentioned systems and methods can imagine one side of an object at a time or more sides of an object at a time. For example, if the object has six sides that the system can image one side at a time, can image a pair of sides at a time, can image three sides at a time or a combination thereof. For example, the system can have six imaging zones wherein each imaging zone is used for imaging each side, five imaging zones wherein one imaging zone is used to image two sides, four imaging zones, three imaging zones in which each imaging zone is used to image two sides of the objects and the like. In an imaging zone that is used to image two sides of the object—the imaged zones can be opposite to each other but this is not necessarily so. The same applies to imaging methods for imaging the object. Imaging of more than one side of an object at an imaging zone can be obtained by using sensors that are located at different locations in relation to the object, can obtained by optics that direct light from different sides of the object to one or more imagers and the like.

A robust and high throughput imaging system includes multiple tunnels through which objects can propagate. The imaging system includes one or more movable portions that when moved expose tunnels of the imaging system and facilitate cleaning of these channels. Conveniently, the movable portions are transparent and the objects can be imaged through the movable portions.

The movable portion can be rigid and does not include any optical elements that require fine adjustments after being placed back to its initial position.

The imaging includes obtaining an image of one side of the objects at a time and does not require time consuming optical path adjustments required when imaging multiple sides at a time. This allows moving movable portions during cleaning and then placing them back without performing any adjustments or calibrations of the optical components of the imaging system.

Yet according to another embodiment of the invention the objects are electrically tested by comparing one or more electrical characteristic of these objects to one or more electrical characteristic of reference objects. These tests are faster than so-called absolute tests.

The capacitance of capacitors can be compared to the capacitance of reference capacitors at a short time and without using costly testing equipment.

The objects can be resistors and their resistance can be compared to the resistance of reference resistors.

The difference between the compared electrical tested objects can be used to classify the objects.

Conveniently, a non-comparison based electrical test can be applied.

According to another embodiment of the invention, images of lateral sides of small elongated electrical circuits, at high throughput, can be achieved by laterally transferring small elongated electrical objects.

The objects can be conveyed in tunnels by using gas differences—thus reducing the chances that the small elongated electrical circuits are damaged during the inspection and transfer sessions.

It is noted that the system includes multiple tunnels. These tunnels are equivalent to pipes, lines, trenches or any other elements through which objects can propagate, especially sealed or partially sealed elements. The tunnels can have a square cross section or a round cross section or any combination of rectangular shapes.

They are conveniently not equipped with folding mirrors, sloped mirrors or other optics that allow obtaining side views of the objects located within them. A side view is a view that is not taken from a side that faces an imager.

The tunnels can be very small—and can be slightly larger than the objects that propagate within them. They can be located in close proximity to each other. For example—each tunnel can be about two millimeters wide and spaced apart from another tunnel by less then three millimeters.

Figure 1B:
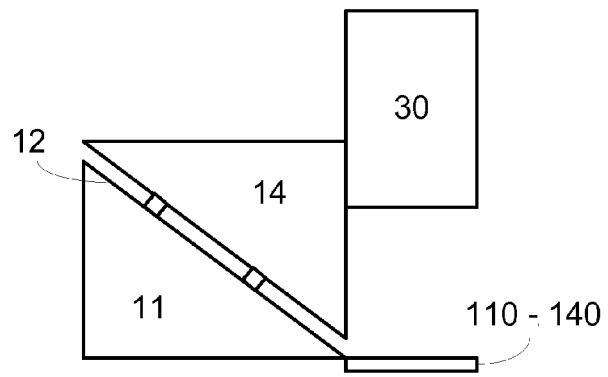
Figure 1B:
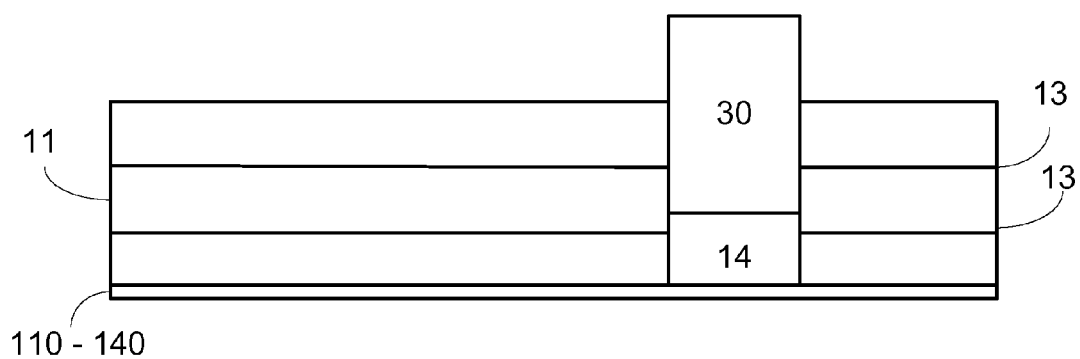

Referring to FIG. 1 a which is a schematic illustration of system 10. System 10 includes imager 30 that can obtain images of objects located in first imaging area 510, second imaging area 520, third imaging area 530 and fourth imaging area 540. Imager 30 can obtain these images in a serial manner or in parallel.

It is noted that system 10 can include multiple image sensors, each positioned above one or more imaging area but it can also include a single image sensor (as illustrated in FIG. 1) that obtains images from one imaging area after the other.

Imager 30 can be moved from one imaging area to another in various manners. For example, as illustrated in FIG. 1*b*—imager 30 is can be moved from location to the other by a combination of a supporting element 11 that that includes sloped portion 12, at least one movement control component such as rails 13 that are coupled to the sloped portion and movable element 14 that is adapted to move along the at least one movement control component. Movable element 14 is adapted to support the imager. When movable element 14 supports the imager a center of gravity of a combination of movable element 14 and the imager is positioned above the sloped portion or in proximity to the sloped portion. An example of such a combination of elements is illustrated in PCT patent application WO 2008/090559 titled "METHOD AND SYSTEM FOR SUPPORTING A MOVING OPTICAL COMPONENT ON A SLOPED PORTION" which is incorporated herein by reference.

Referring back to FIG. 1*a*—system 10 also includes illustrates first longitudinal transferor 110, first rotation module 210, second longitudinal transferor 120, second rotation module 220, third longitudinal transferor 130, third rotation module 230, fourth longitudinal transferor 140, delay element 150, sorting unit 170 and processor 160.

At least one of the mentioned above longitudinal transferors and preferably all longitudinal transferors 110, 120, 130 and 140 include a movable portion that once moved to a certain position exposes tunnels of these longitudinal transferors and allow these tunnels (as well as other portions of these longitudinal transferors—including the movable portions themselves) to be cleaned.

Figure 2A:
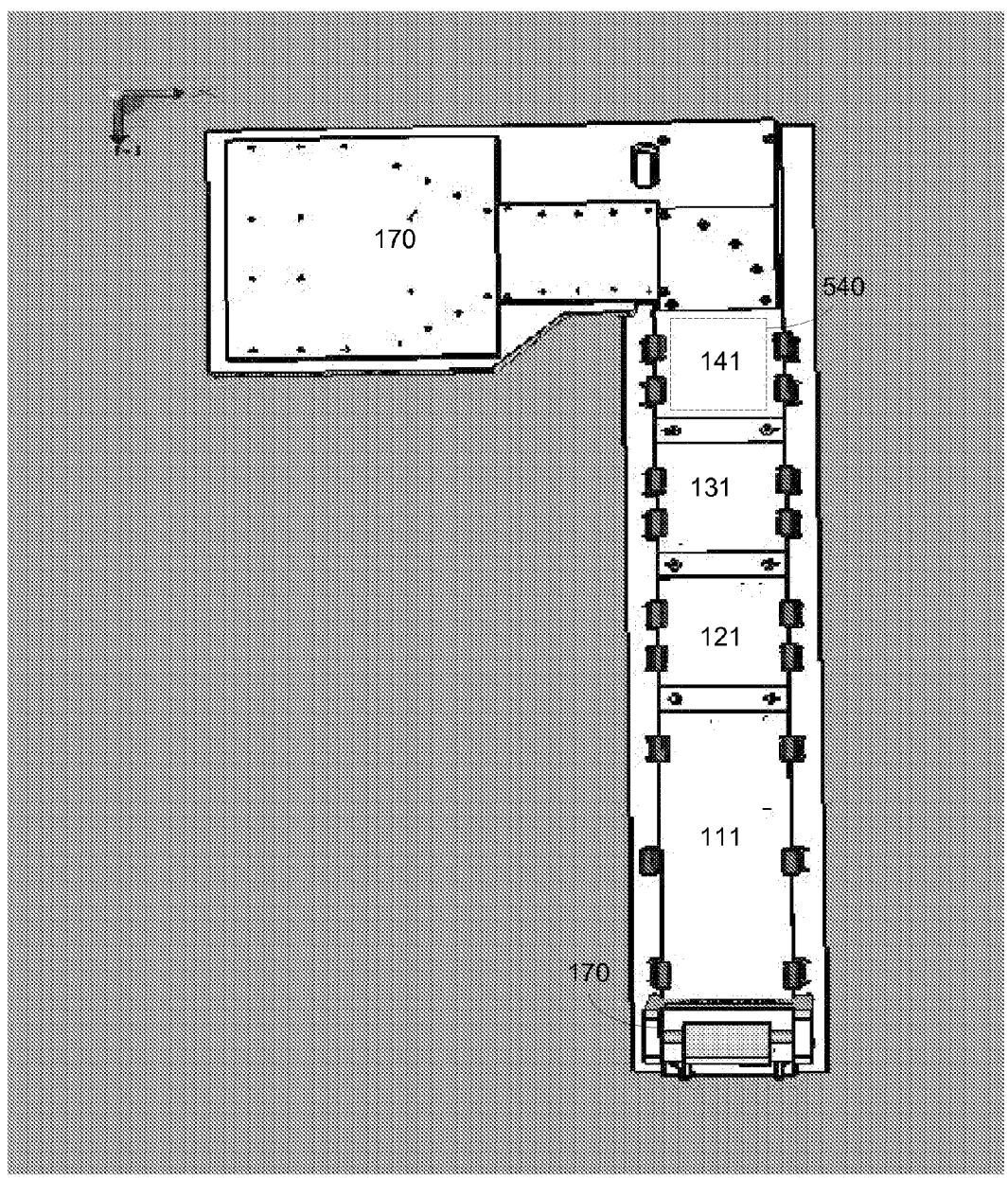
FIGS. 2a-2c and 3 illustrate portions of a system for imaging objects according to an embodiment of the invention.
Figure 2B:
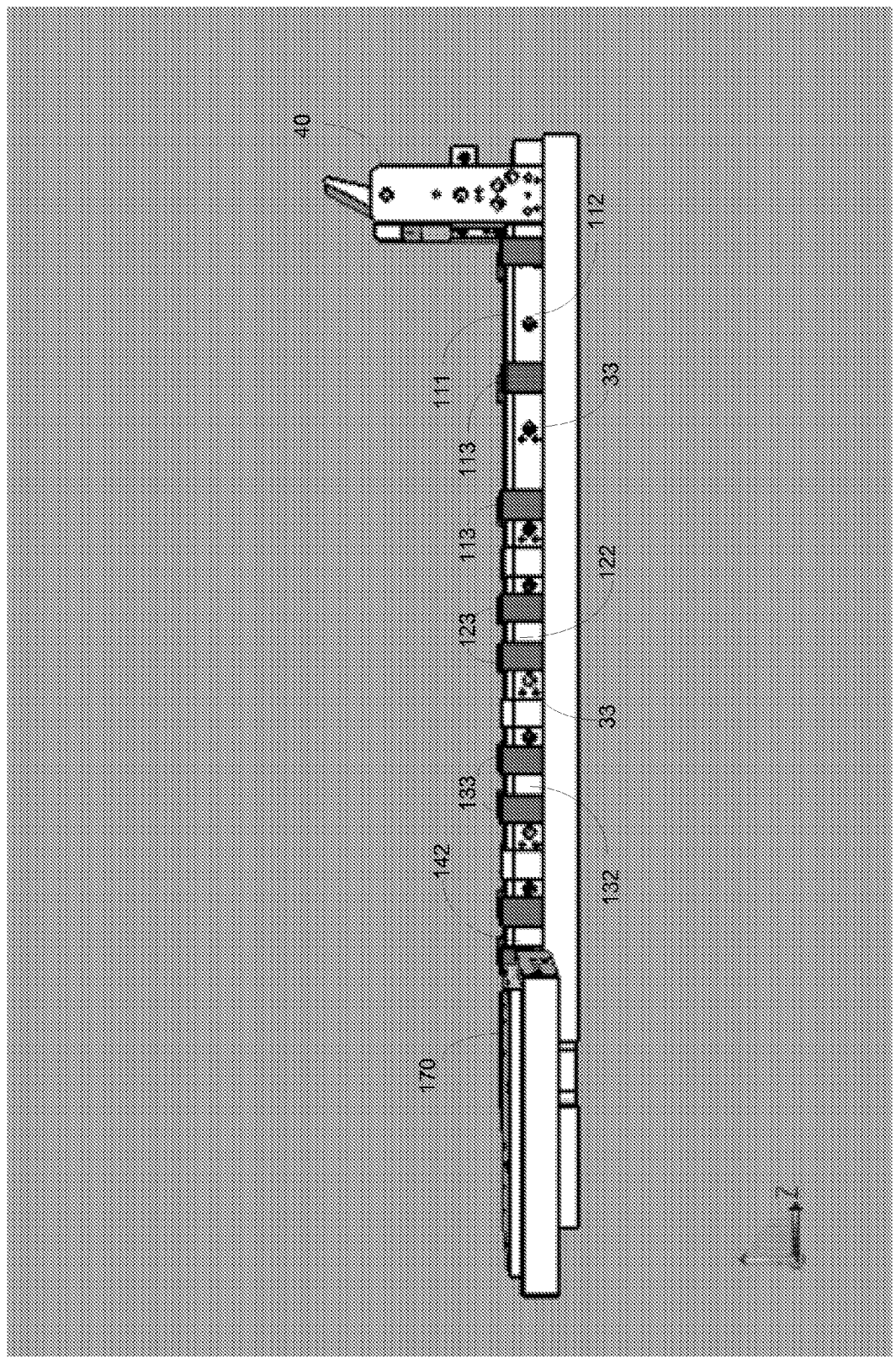
Figure 2C:
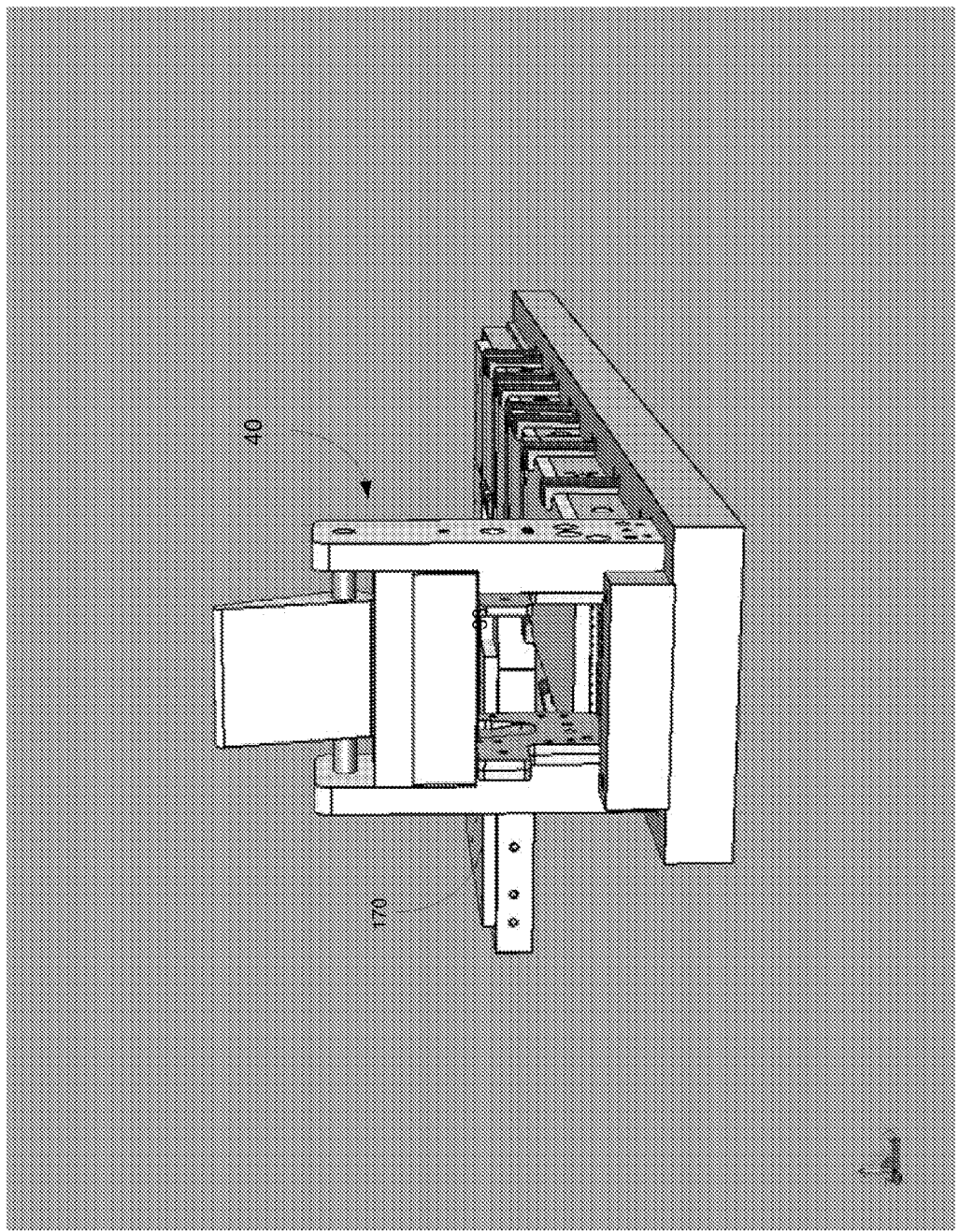
Figure 3:
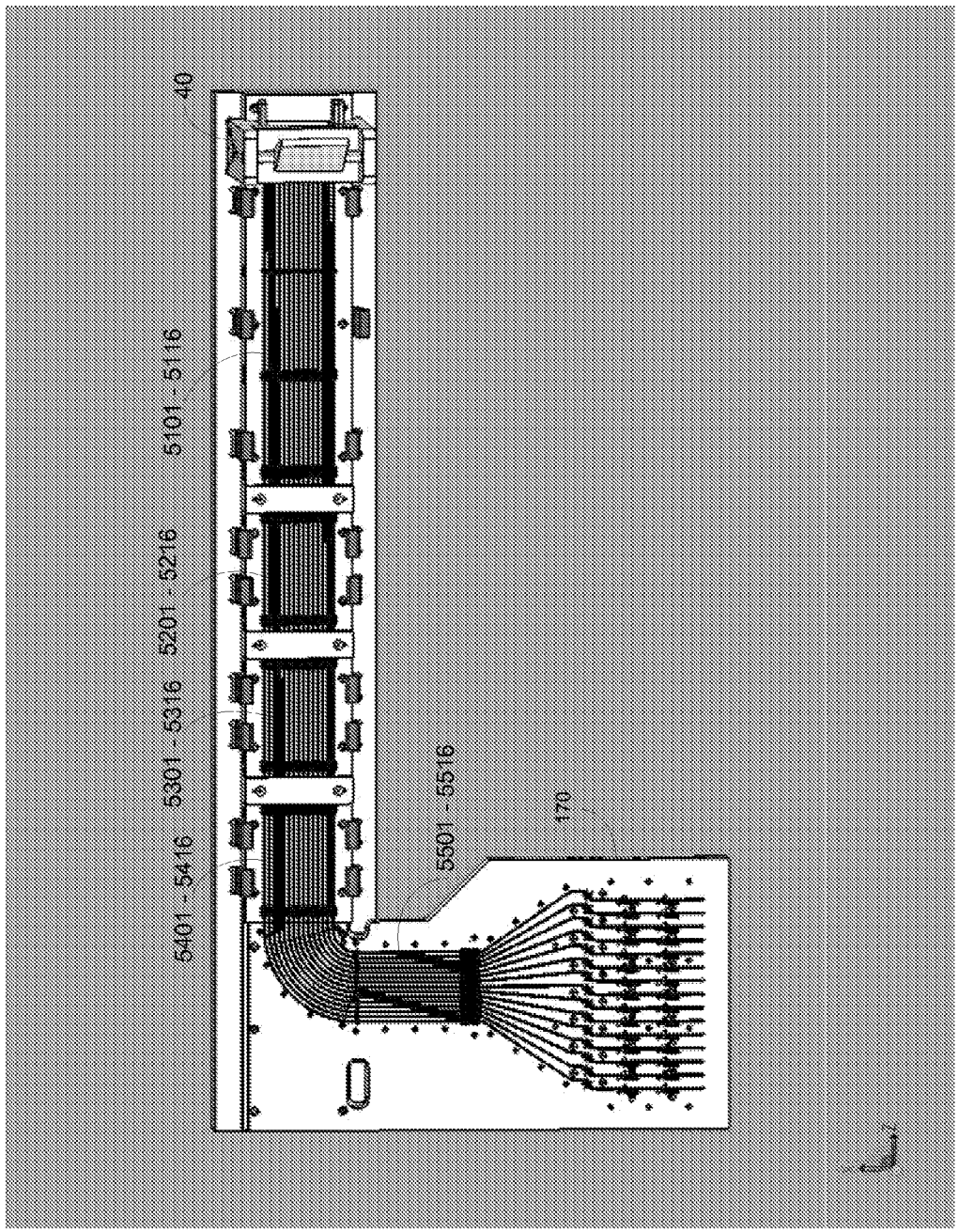

FIGS. 2a, 2b, 2c and 3 illustrate various portions of system 10. FIGS. 2a, 2b, 2c illustrate a portion when removable portions are at a position that allows imaging objects while FIG. 3 illustrates the portion once the movable portion is removed—thus exposing tunnels 5101-5116, 5201-5216, 5301-5316, 5401-5416 and 5501-5516. These tunnels, as well as grooves within rotating elements 210, 220 and 230 form sixteen propagation paths that are substantially parallel to each other—at least till reaching sorting unit 170.

System 10 includes supply element 40, first longitudinal transferor 110, first rotation module 210, second longitudinal transferor 120, second rotation module 220, third longitudinal transferor 130, third rotation module 230, fourth longitudinal transferor 140, delay element 150 and sorting unit 170.

First till first longitudinal transferors 110, 120, 130 and 140 include movable portions such as transparent upper movable portions 111, 121, 131 and 141 respectively that once removed expose the tunnels of these transferors. The tunnels are formed in lower portions 112, 122, 132 and 142 of these longitudinal transferors.

First longitudinal transferor 110 includes lower portion 112 in which tunnels 5101-5116 are formed, transparent upper movable portion 111, stopping elements 148 and 149 (shown in FIG. 4) and gas related elements (illustrated in FIG. 2b as inlets 33). Second longitudinal transferor 120 includes lower portion 122 in which tunnels 5201-5216 are formed, transparent upper movable portion 121 as well gas related elements and stopping elements. Third longitudinal transferor 130 includes lower portion 132 in which tunnels 5301-5316 are formed, transparent upper movable portion 131 as well gas related elements and stopping elements. Fourth longitudinal transferor 140 includes lower portion 142 in which tunnels 5401-5416 are formed, transparent upper movable portion 141 as well gas related elements and stopping elements.

System 10 further includes delay element 150 and sorting unit 170.

Movable portions 111, 121, 131 and 141 are forced against lower portions 112, 122, 132 and 142 by clips 113, 123, 133 and 143. This allows to substantially sealing the tunnels of First till first longitudinal transferors 110, 120, 130 and 140 during the imaging process. Clips can move within openings such as openings 114 and 144.

It is noted that the upper portion and the lower portion of each longitudinal transferor can be held together in various other manners known in the art.

Conveniently, system 100 operates in a pipelined manner—groups of elements are moved from imaging area to the other, and images from multiple imaging areas can be obtained during each imaging cycle.

Table 1 illustrates the initialization of a pipelined process by which system 100 operates. "Cycle" indicates an inspection cycle during which a stage occurs. LTS1-LTS4 are the first till fourth longitudinal transferor 110-140, "image" indicate which images are taken, Sx (Gy) means the image of the x'th side of the y'th group of electrical circuits. For simplicity of explanation the rotation module of electrical circuits is not shown.

| Cycle | LTS1 | Image  | LTS2 | Image  | LTS3 | Image  | LTS4 | Image  |
|-------|------|--------|------|--------|------|--------|------|--------|
| C1    | G1   | S1 (G1)|      |        |      |        |      |        |
| C2    | G2   | S1 (G2)| G1   | S2 (G1)|      |        |      |        |
| C3    | G3   | S1 (G3)| G2   | S2 (G2)| G1   | S3 (G1)|      |        |
| C4    | G4   | S1 (G4)| G3   | S2 (G3)| G2   | S3 (G2)| G1   | S4 (G1)|
| C5    | G5   | S1 (G5)| G4   | S2 (G4)| G3   | S3 (G3)| G2   | S4 (G2)|
| C6    | G6   | S1 (G6)| G5   | S2 (G5)| G4   | S3 (G4)| G3   | S4 (G3)|
| C7    | G7   | S1 (G7)| G6   | S2 (G6)| G5   | S3 (G5)| G4   | S4 (G4)|
| C8    | G8   | S1 (G8)| G7   | S2 (G7)| G6   | S3 (G6)| G5   | S4 (G5)|
| C9    | G9   | S1 (G9)| G8   | S2 (G8)| G7   | S3 (G7)| G6   | S4 (G6)|

Figure 4:
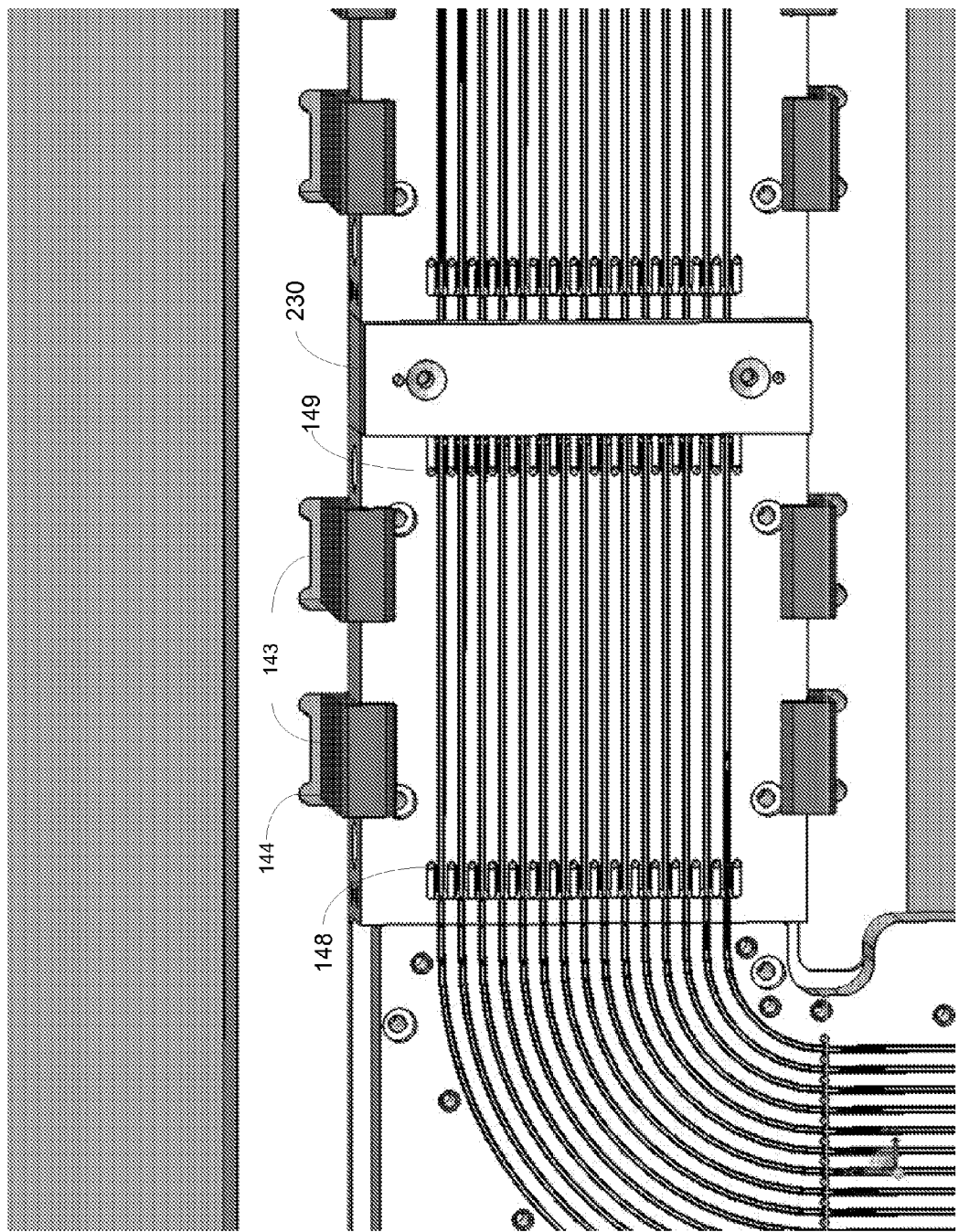
FIG. 4 illustrates a portion of two longitudinal transferors and multiple stopping elements according to an embodiment of the invention.

FIG. 4 illustrated stopping elements 148 and 149. One located just after third rotation module 230 and the other located at an opposite end of fourth longitudinal transferor 140—towards the tunnels that end at delay unit 150.

These stopping elements can be pins that can be elevated or lowered—when elevated they prevent objects to pass through the tunnels. The top portion of each stopping element is clearly shown in FIG. 4. These stopping elements can be located within a recess that is also shown in FIG. 4.

It is noted that lower portion 112, 122, 132 and 142 can be transparent—allowing to obtain images through the lower portion. Such images can be acquired in parallel to the images acquired by imager 30 located above longitudinal transferors 120 and 130.

Conveniently, system 10 includes topping elements (not shown) that can be located in first, second third and fourth longitudinal transferors 110, 120, 130 and 140, near the first second and third rotation modules 210, 220 and 230 and near delay unit 150. These stopping elements can pop into (or otherwise enter) the tunnels are temporarily preventing the propagation of objects from one module to the other. These stopping elements can be values.

FIGS. 5a-5f illustrate supply element 40 and portions thereof according to an embodiment of the invention.

Objects can be sucked (or otherwise provided) to one or more inlets (such as inlets 41) 41 of supply element 40 and then fall (through beveled inner space 46) via outlet 45 of the supply element towards tunnels of first longitudinal transferor 110.

Supply element 40 has an upper portion 42 that receives the objects, a middle portion 44 that defines a beveled inner space 46 (that has a long and narrow opening 45) and a bottom portion 48.

The bottom portion includes four horizontal (sub-surface) air conduits 301, 302, 303 and 304. Multiple openings at the upper level of bottom portion 48 can drive air provided through these conduits such as to affect capacitors that fall via opening 45 towards a beveled space 310.

Objects arrive to beveled space 310 that is shaped such as to prevent objects from being stack one above the other. It can be relatively narrow—its height is approximately equal to the height of the objects. Accordingly, in this space objects can not pile on each other (in the vertical dimension).

It is noted that the beveled space can be replaced by a substantially horizontal space that is also relatively narrow.

Objects can be forced to move towards tunnels 5001-5006 by air pulses (or a continuous gas pressure) that arrive via conduit 301 and then through openings 306. This air pulses can be applied when the beveled space 310 is only partially filled or includes only few objects.

According to another embodiment of the invention space 310 is not beveled and it can be horizontal.

Figure 26A:
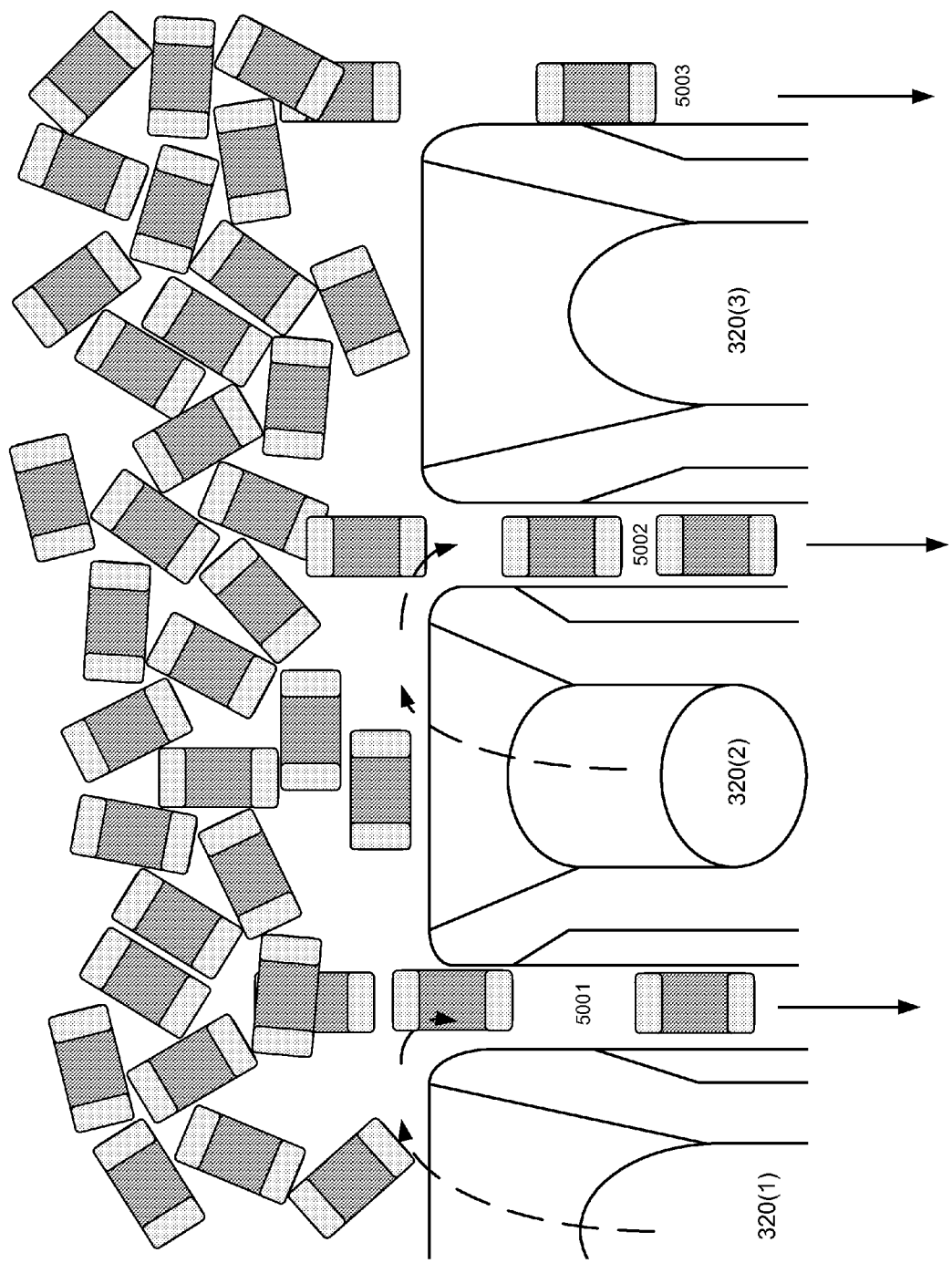
FIGS. 26a-26c illustrates tunnels of a feeder and objects according to an embodiment of the invention.
Figure 26B:
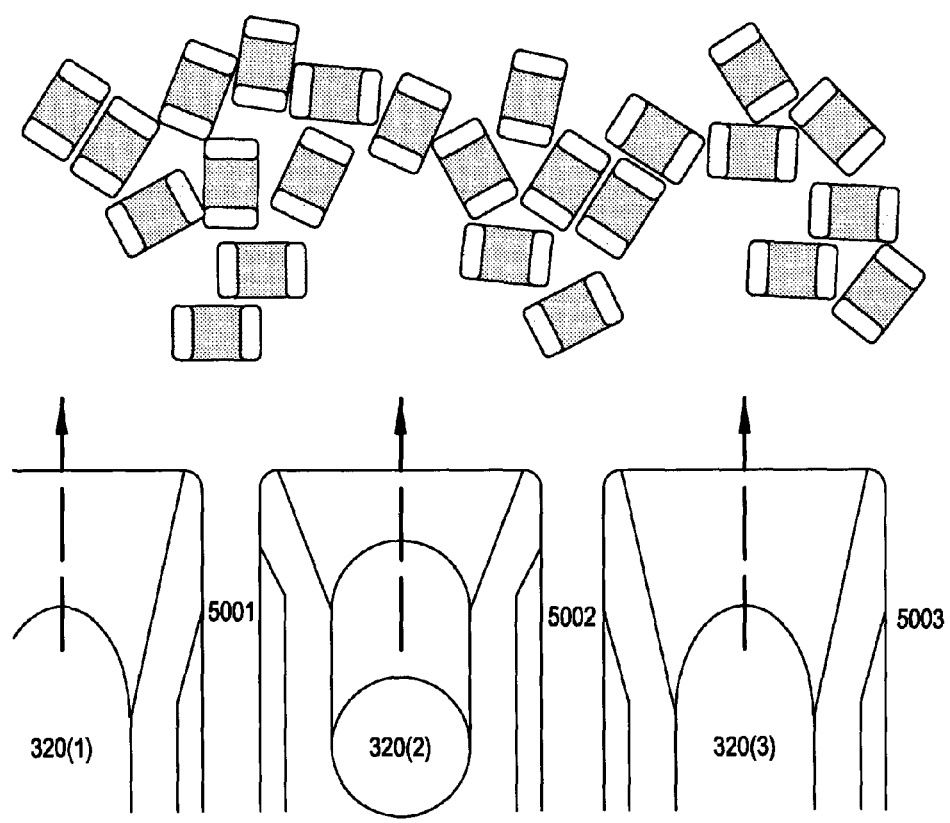
Figure 26C:
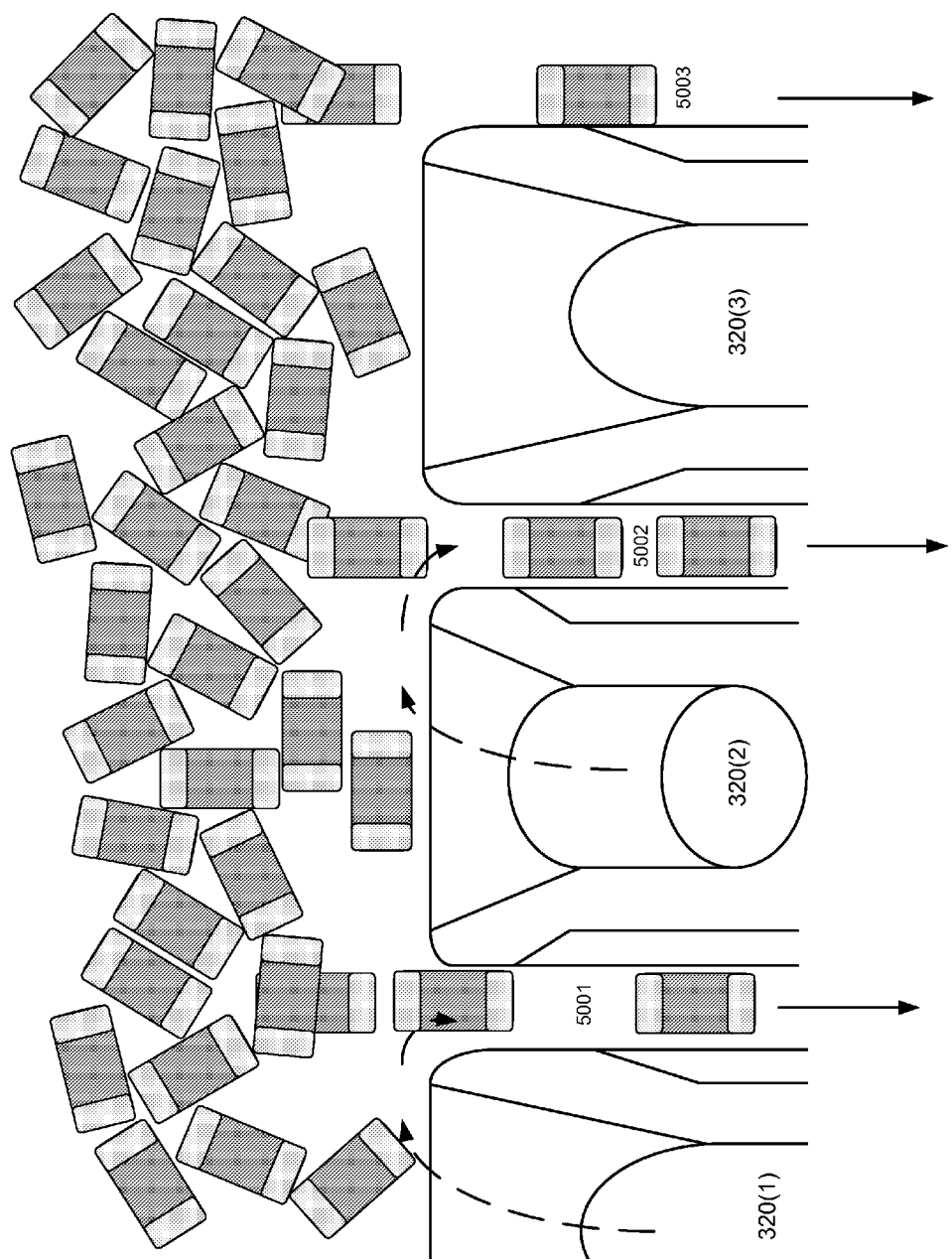

Objects that are proximate to the inputs of tunnels 5001-5016 can be induced to move into the tunnel by gas pulses (also referred to as inducing gas pulses) or gas pressure provided vie either one of openings 320(1)-320(16) and 330(1)-330(16). According to an embodiment of the invention objects can be rejected from the tunnel openings by introducing one or more rejecting gas pulses or gas pressure. This is illustrated in FIGS. 26a-26c.

Openings 320(1)-320(16) are arranged in a staggered manner—the odd openings receive gas via conduit 302 while the even openings receive gas via conduit 303. The gas can be provided in a pulsed manner, a continuous manner or a combination thereof. The gas pulses can be provided simultaneously to conduits 302 and 303, in an overlapping manner or in a non-overlapping manner.

Rejecting gas pulses or rejecting gas pulses can be provided via openings 320(1)-320(16) or by other openings (not shown).

Conduit 304 provides gas (in a pulsed or continuous manner or a combination thereof) via openings 330(1)-330(16). The gas enters tunnels 5001-5016 via openings (such as openings 340(12) and 350(12) that are formed at both sides of tunnel 5012 and are illustrated in FIG. 5e.). The openings can be formed at the sidewalls of the tunnels and can direct objects to exit the tunnels. It can prevent object from returning (via the tunnels) to beveled space 310. They can be used to inject relatively strong gas pulses that assist in cleaning the tunnels.

It is noted that either one of gas conduits 304, 303, 302 (or another gas conduit which is not shown) can be used when applying rejecting gas pulses or rejecting gas pressure that rejects objects within beveled space 310 from the openings of the tunnels.

Figure 6A:
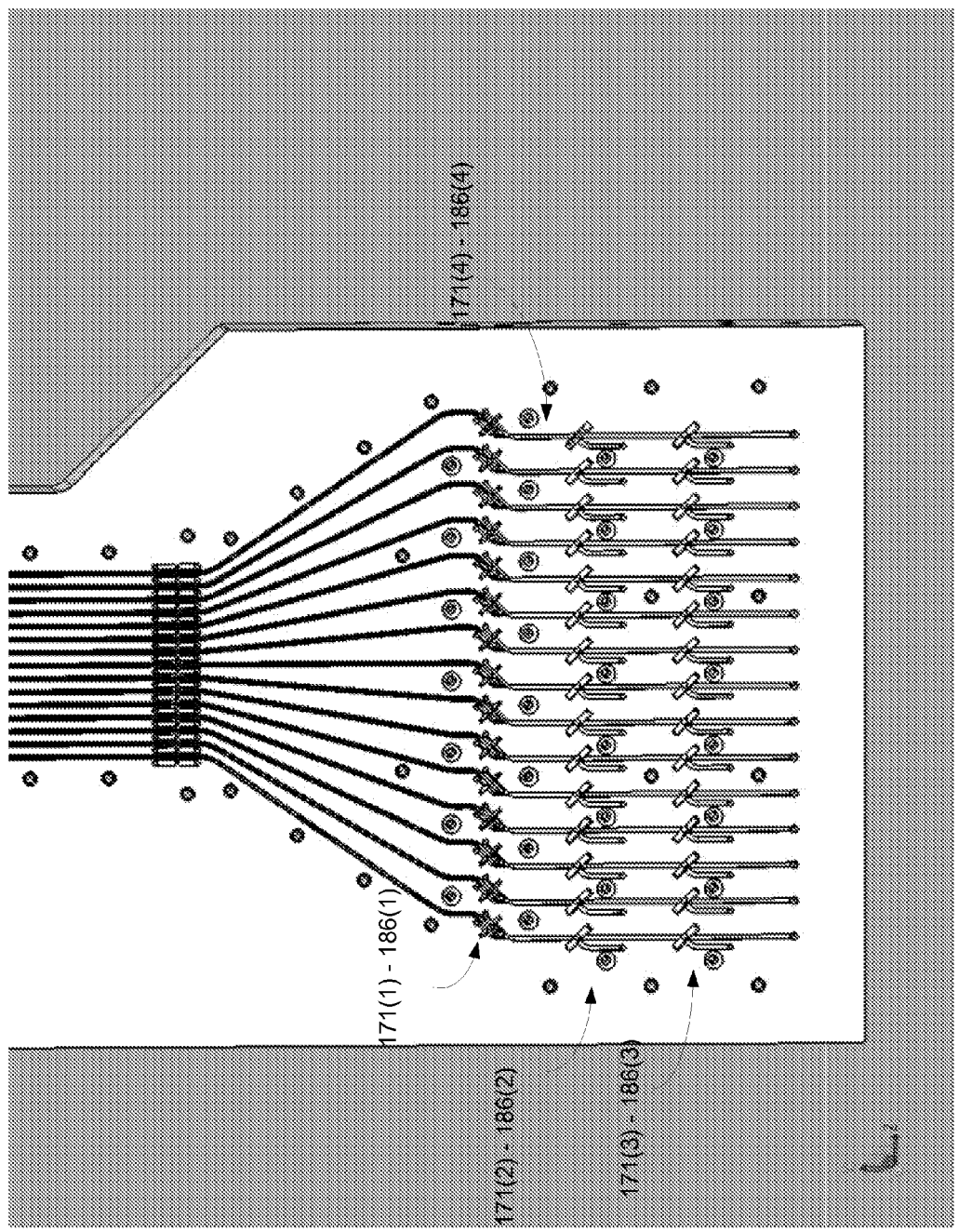
Figure 6B:
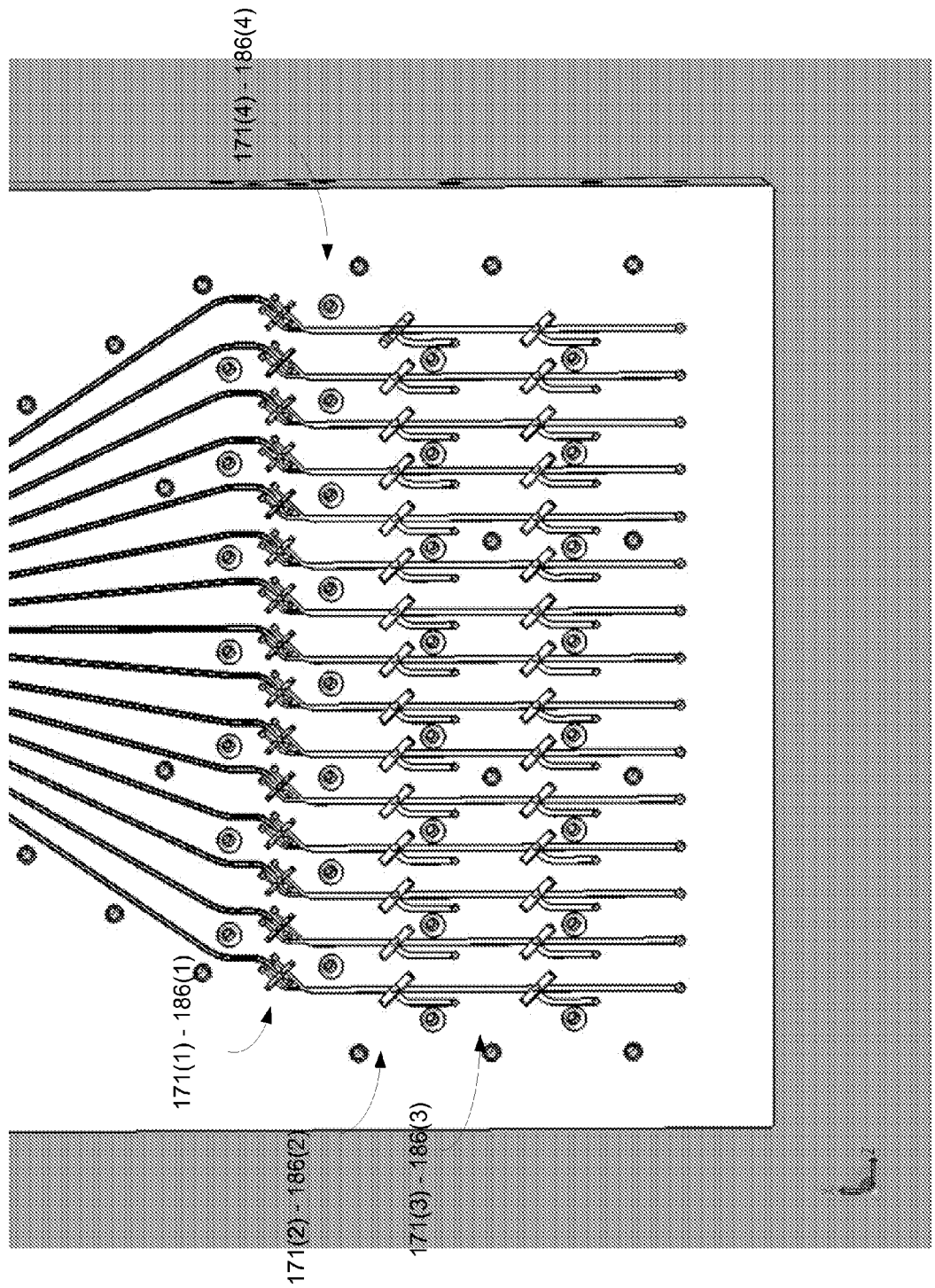

FIGS. 6a-6c illustrate sorting unit 170 according to an embodiment of the invention.

Sorting unit 170 can include a set of sorting element per each channel of fourth longitudinal transferor 140. For example—sixteen tunnels require sixteen sets of sorting elements.

The spacing between the channels of sorting unit 170 is larger than the spacing between the tunnels of the longitudinal transferors 110, 120, 130 and 140. This allows placing multiple sorting elements per each sorting unit channel. The tunnels of the longitudinal transferors 110, 120, 130 and 140 are close to each other in order to reduce the size of the imaging areas.

Sorting unit 170 can include multiple control elements that are movable by gas. An example of a gas driven control element and a sorting unit is illustrated in PCT patent application WO 2007/129322 titled "System and method for imaging objects" which is incorporated herein by reference.

In a nut-shell, each sorting channel includes one inlet, multiple outlets and multiple control elements that assist in directing the electrical element to one of the multiple outlets.

FIGS. 6a and 6b illustrate three groups of control elements-first group includes control elements 171(1)-186(1), second group of control elements includes control elements 171(2)-186(2) and third group of control elements includes control elements 171(3)-186(3). FIG. 6c illustrates few sorting channels.

The first group of control elements 171(1)-186(1) includes sixteen control elements that selectively allow objects to enter the sorting channels—one object per sorting channel at a time. The objects can be electrically tested when they are located at the first group.

The second and third groups of control elements include binary sorting element—each capable of directing an object to one out of two output paths.

All control elements of a group are parallel to each other and are oriented in relation to a longitudinal axis of the tunnel that precedes this control element.

An object can be sorted in few milliseconds but is can be sorted either more quickly or more slowly.

Figure 6D:
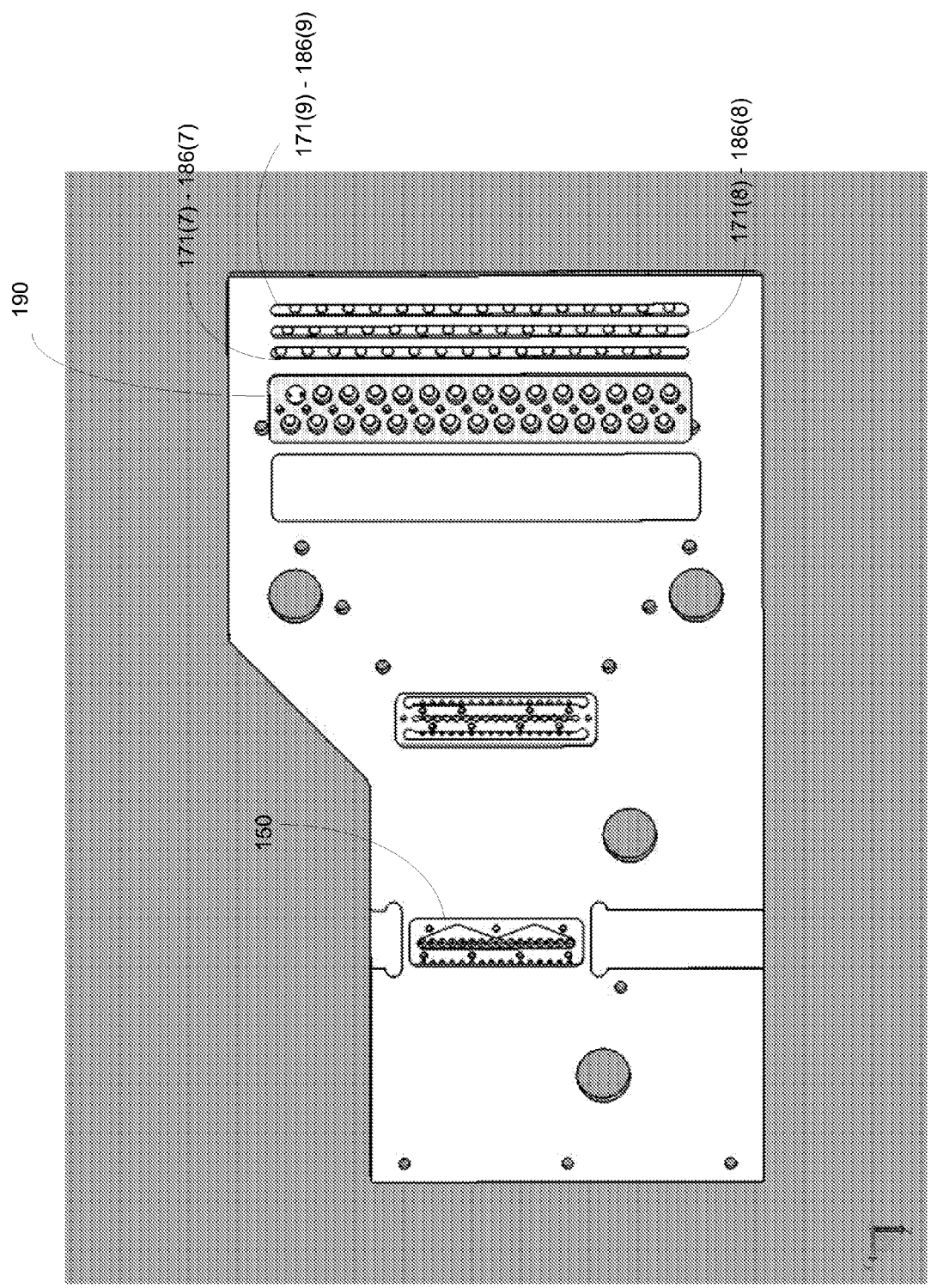

FIG. 6d illustrates the bottom of sorting unit 170 and delay unit 150. It includes two columns of openings 190 for placing second group of control elements includes control elements 171(2)-186(2) and third group of control elements includes control elements 171(3)-186(3) It also include three columns of outlets—a first column that includes output outlets 171(7)-186(7), a second column that includes output outlets 171(8)-186(8), and a third column that includes output outlets 171(9)-186(9).

Figure 7:
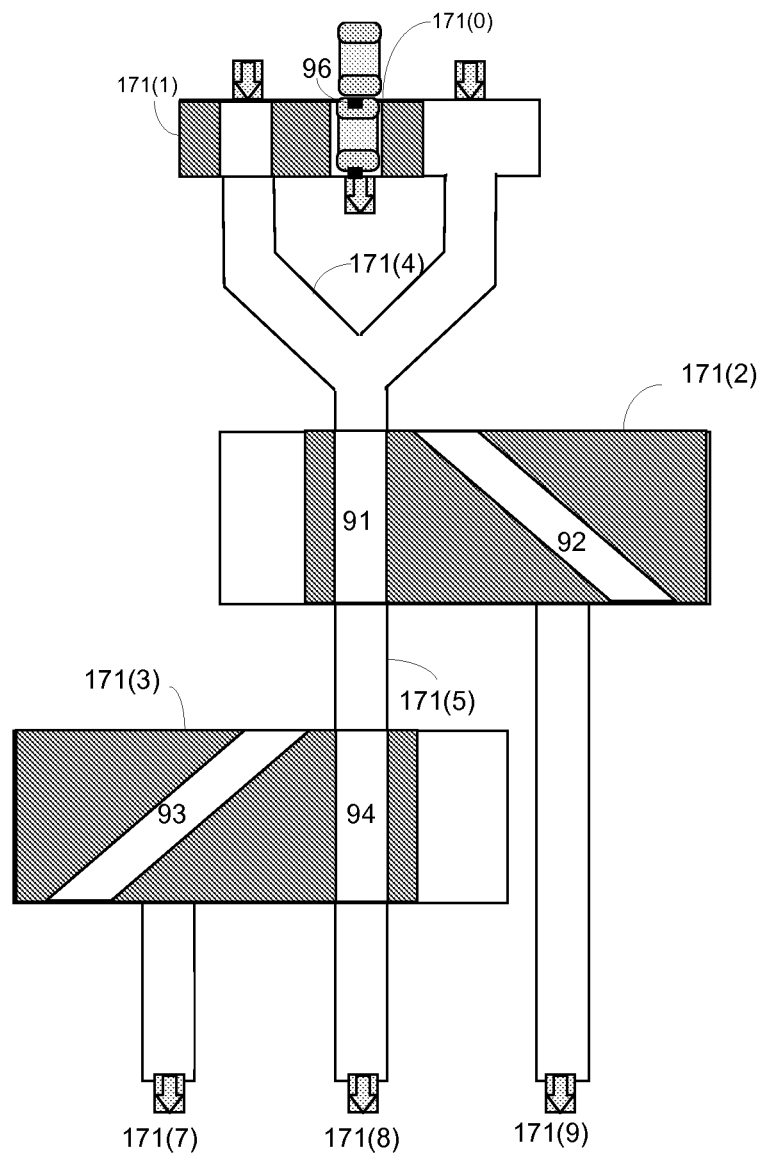
FIGS. 7-9 illustrate various configurations of a sorting element according to various embodiments of the invention.
Figure 8:
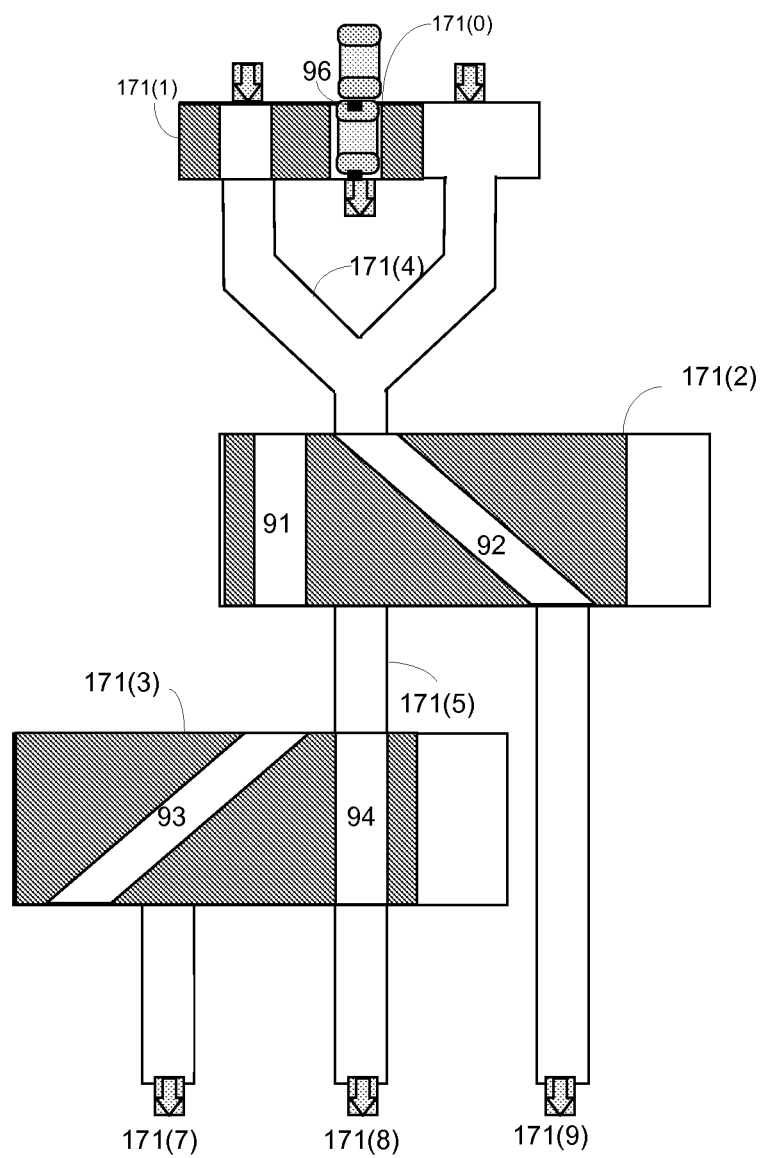
Figure 9:
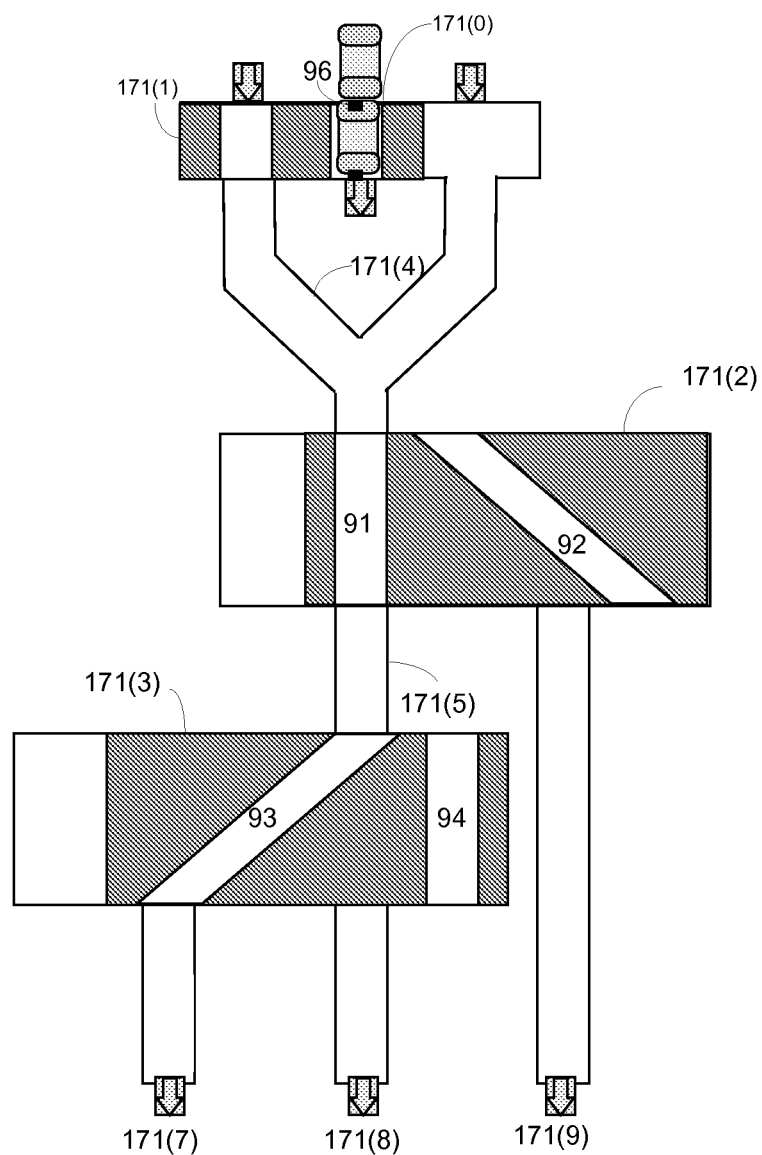

FIGS. 7, 8 and 9 illustrate the positions of three control elements of a single channel 171 of sorting unit 170 when sorting a good object, a bad object and a questionable object.

Channel 171 has an input 171(0) that receives objects from tunnels of delay unit 150.

The first movable element 171(1) has an opening that can include a single object. When it is positioned at a center position it can receive an object. When it is positioned in either one of a rightmost position and a leftmost position it can release that object towards tunnels 171(4). First movable element 171(1) alternates between a rightmost position and a left most position. The rotation is performed in a periodical manner regardless of the functionality of the object. This alternating movement allows a single object to be sent toward control element 171(2) of channel 171. First control element 171(2) includes two tunnels—91 and 92. Second control element 171(3) includes two tunnels—93 and 94. These two directional elements can be moved so that these tunnels receive an object and direct it towards one of the three outlets of channel 171—"questionable" output outlet 171(7), "good" output outlet 171(8) and "bad" output outlet 171(9). The location of these directional elements is determined by processor 160—in view of the functionality of the electrical element that is received by first movable element 171(1).

For example, if the object is "bad" then first control element 171(2) is placed so that tunnel 92 faces tunnel 171(4) and an object that exits tunnel 171(4) is directed towards "bad" output outlet 171(9).

Yet for another example, if the object is "good" or "questionable" then first control element 171(2) is placed so that tunnel 91 faces tunnel 171(4) and an object that exits tunnel 171(4) is directed second control element 171(3). If the object is "good" then second control element 171(3) is placed so that tunnel 93 faces tunnel 91 and an object that exits tunnel 91 is directed towards "good" output outlet 171(8). If the object is "questionable" then second control element 171(3) is placed so that tunnel 94 faces tunnel 91 and an object that exits tunnel 91 is directed towards "questionable" output outlet 171(7).

Conveniently, an object that is received by first movable element 171(1) is electrically tested—using electrical connections that contact the object. This can require placing first movable element 171(1) in a position that differs from its central position, rightmost position and leftmost position. This position can be between the center position and any out of the rightmost and leftmost positions. This can require two sets of electrodes—one per each intermediate position.

FIG. 7 also illustrates a pair of electrodes 96 that are positioned so as to contact an object when placed at the central position. It is noted that electrodes can be positioned to contact the object when it is placed at a right intermediate position and when placed at a left intermediate position.

Figure 10A:
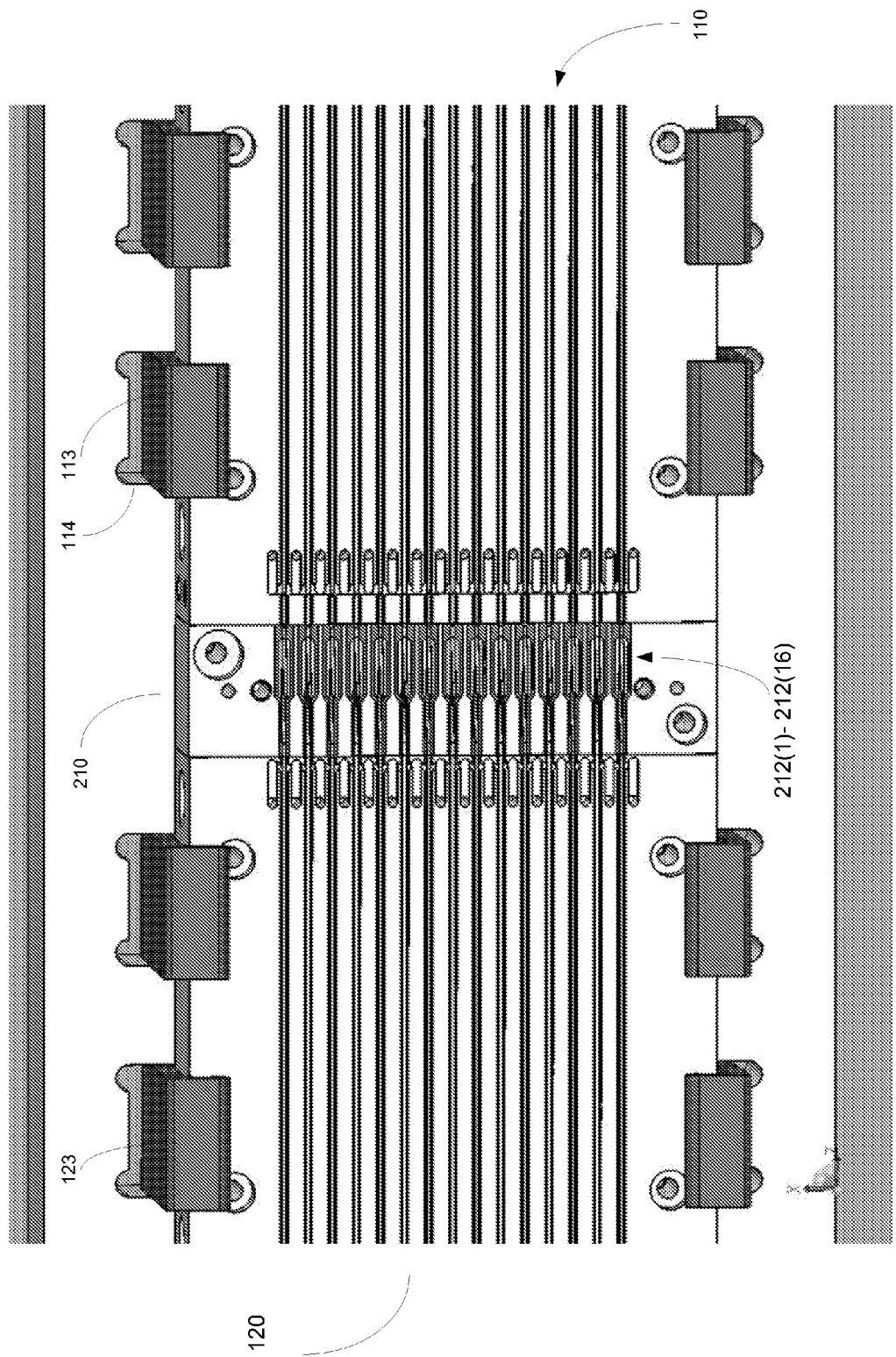
FIG. 10a-10b illustrate rotation modules according to an embodiment of the invention.

FIG. 10a illustrates rotation elements 212(1)-212(16) of first rotation module 210 and portions of first and second longitudinal transferors 110 and 120 various tunnels according to an embodiment of the invention.

Rotation module 210 includes sixteen rotation elements 212(1)-212(16)—one per each tunnel of first longitudinal transferor 210. Tunnel 5101 is connected via first rotation element 212(1) to tunnel 5201. Tunnel 5201 is connected via second rotation element 212(2) to tunnel 5202 and so fourth—till tunnel 5116 that is connected via rotation element 212(16) to tunnel 5216.

Figure 10B:
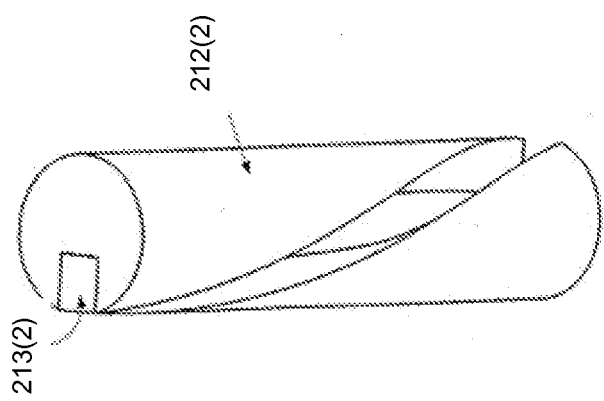

FIG. 10b illustrates rotation element 212(1) according to an embodiment of the invention.

Rotation element 212(1) includes a spiral groove 213(1) that performs a rotation of about ninety degrees. Objects from a tunnel of first longitudinal transferor 110 enter one end of spiral grove, and are rotated at about ninety degrees about their longitudinal axis before exiting the spiral groove 213(2) to enter a corresponding tunnel of second longitudinal transferor 120.

Figure 11:
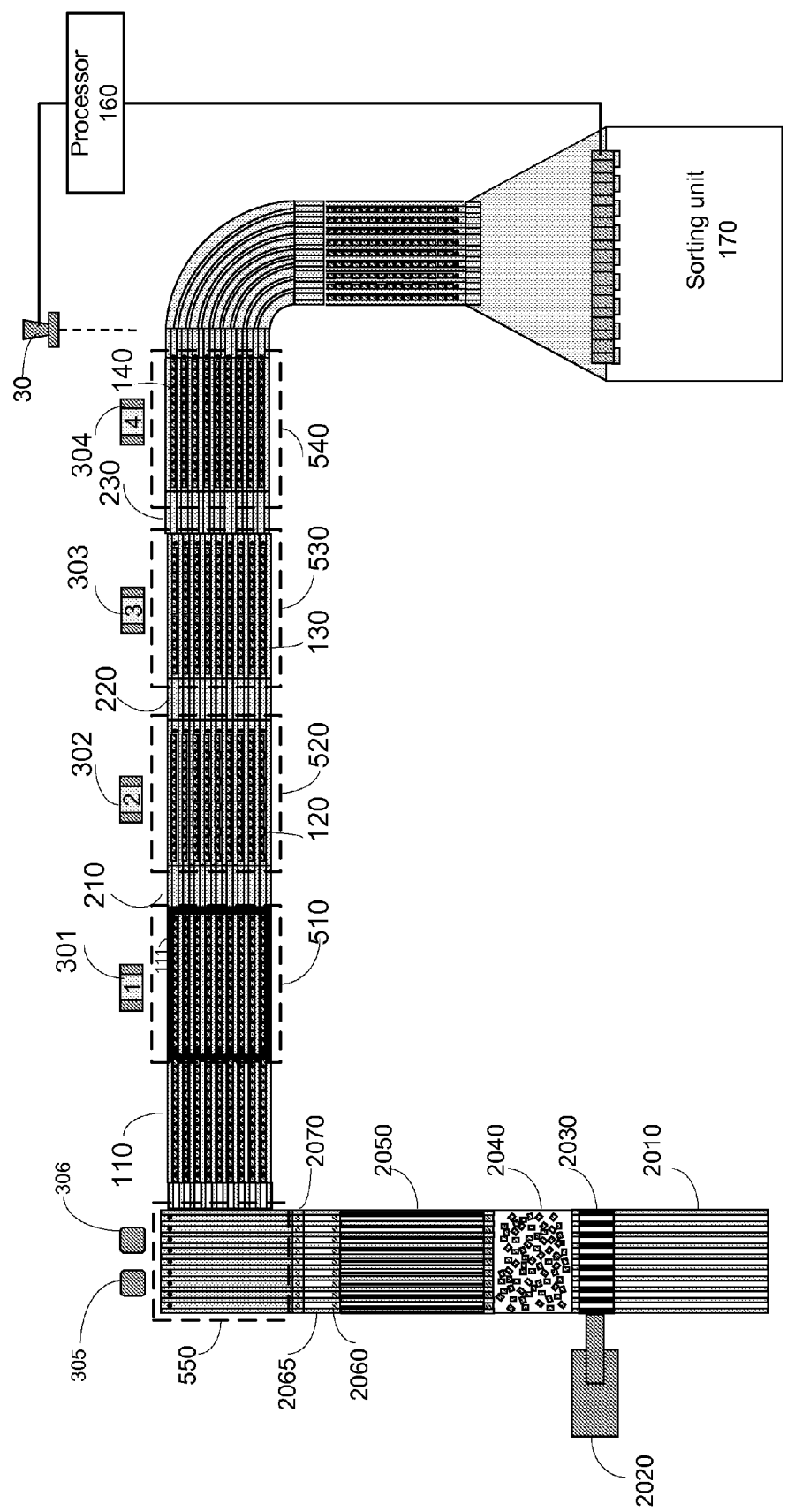
FIG. 11 illustrates a portion of a system according to another embodiment of the invention.

FIG. 11 illustrates system 2000 according to another embodiment of the invention.

System 2000 of FIG. 11 includes a lateral transferor that is adapted to transfer the objects to lateral imaging area (also referred to as additional imaging area) 550 in a lateral manner. Imager 30 is configured to obtain images of two opposite sides of the objects that differ from sides of the objects that are imaged at the four imaging areas 510, 520, 530 and 540.

Conveniently, the additional imaging area includes illuminating sloped mirrors positioned so that the objects are positioned between the sloped mirrors. Light scattered or reflected from opposite sides of the objects are directed from these sloped mirrors towards the imager.

System 2000 includes object receivers such as buses push—pull stripes 2010; bus motor 2020; multi-clutch 2030; container 2040 that is connected to a feeder (not shown); bus platform 2050; load element such as load bus 2060 (also referred to loading element 812 of FIG. 12); additional imaging area 550; bus un-loader (also illustrated as unloading element 832 in FIG. 12) 2065; first longitudinal transferor 110; first rotation element 210, second longitudinal transferor 120, second rotation element 220, third longitudinal transferor 130, third rotation element 230, fourth longitudinal transferor 140, delay unit 150; processor 160 and sorting unit 170.

Buses push—pull stripes 2010 are multiple lateral transferor elements that can also be referred to as object receivers. They are moved by so called transfer elements. A transfer element can include, for example, a portion of bus motor 2020 and a portion of multi-clutch 2030. A transfer element moves the object receiver towards an imaging area unless encountering a resistance that is above a predefined resistance. The resistance can indicate that an object is stuck between the object receiver and the feeding element. This stuck object prevents the object receiver from reaching lateral imaging area 550. Applying excessive force can break the stuck object and additionally or alternatively damage the lateral transferor portion. In order to prevent these unwanted consequences the transfer element does not force the object receiver to move if it encounters a certain resistance. The multi-clutch can disengage an object receiver from the rotating motor if such a problem occurs.

Figure 25A:
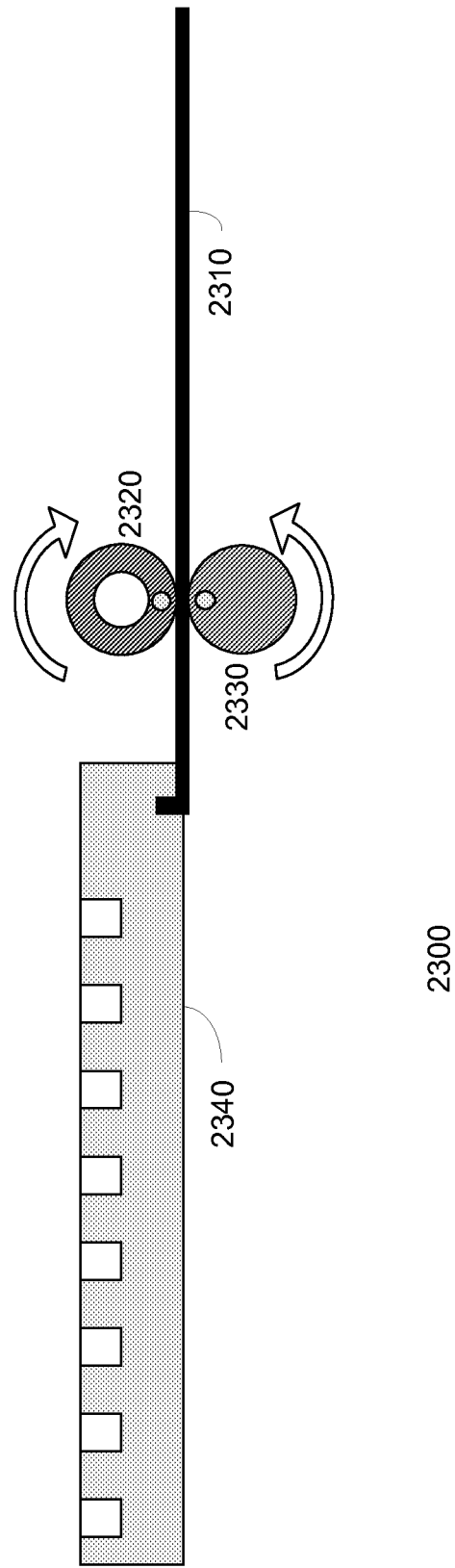
FIGS. 25a-25d illustrate a lateral transferor element according to an embodiment of the invention.
Figure 25B:
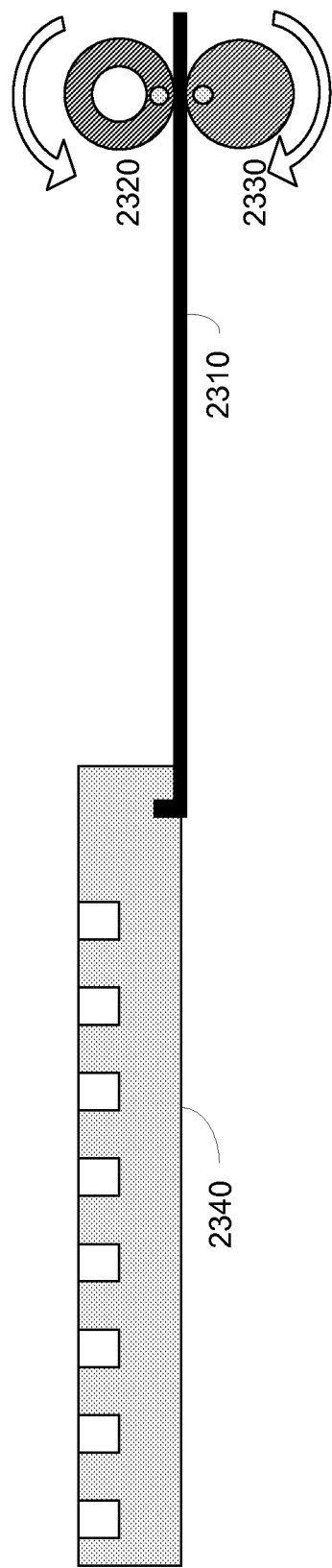
Figure 25C:
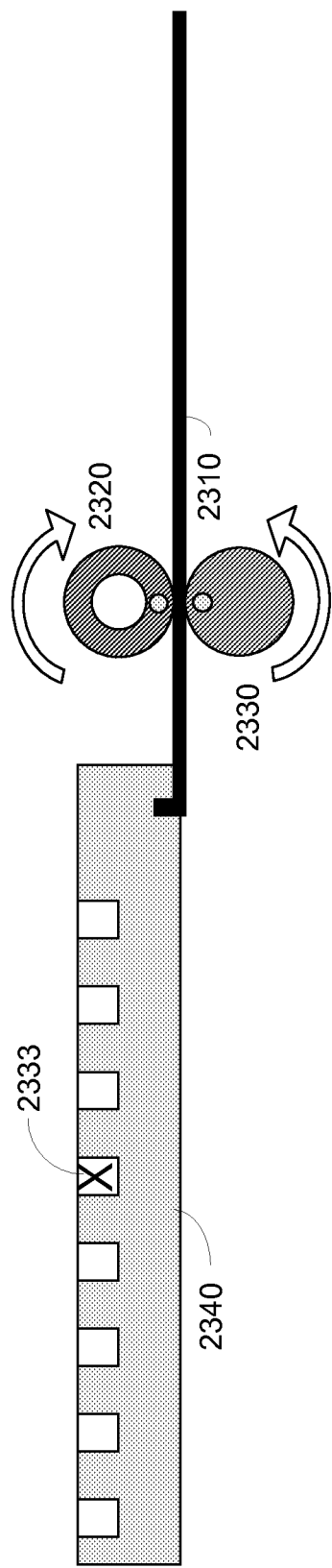
Figure 25D:
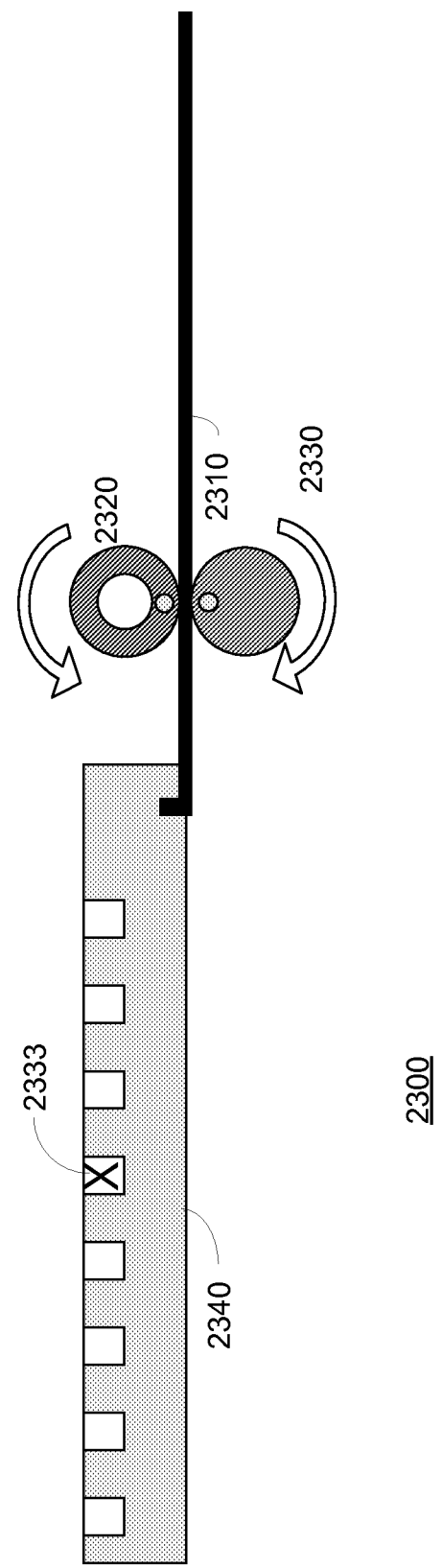
Figure 25E:
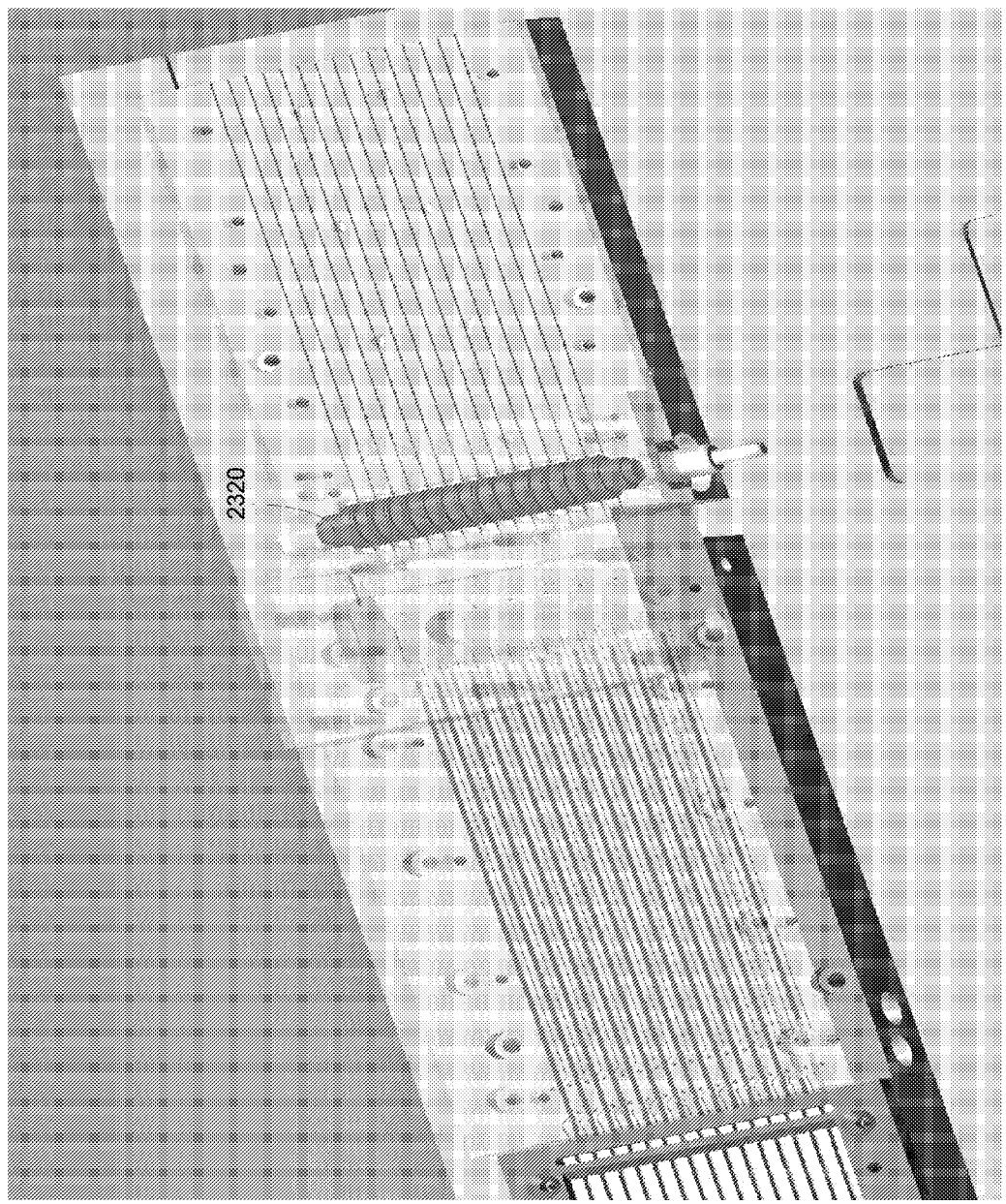
FIG. 25e illustrates a rotating element and multiple tunnels according to an embodiment of the invention.

FIGS. 25a-25d illustrate lateral transferor portion 2300 according to an embodiment of the invention. FIG. 25e illustrates rotating element 2320 and multiple tunnels according to an embodiment of the invention.

Lateral transferor portion 2300 includes object receiver 2340 and a transfer element that includes a rotational movement to linear movement converter. The rotational movement to linear movement converter includes rotating elements 2320 and 2330 and linear structural element 2310. Linear structural element 2310 touches rotating elements 2320 and 2330 but is not connected to them—is it loosely connected to these rotating elements. The rotational movement of rotating elements 2320 and 2330 is converted to a linear movement of linear structural element 2310 and hence to a linear movement (right to left or vice verse) of object receiver 2340. If object receiver 2340 encounters a resistance (as illustrated in FIGS. 23c and 23d—in which an object 2333 is stuck) the loose connection between linear structural element 2310 and rotating elements 2330 and 2320 does not allow rotating elements 2330 and 2320 to force the linear structural element to continue moving object receiver to the lateral imaging area.

Either one (or both) of rotating elements can be rotated by a motor although one rotating element can be allowed to rotate about its axis due to the movement of the other rotating element.

In order to release the stuck object the transfer element can move the object receiver in a reciprocating manner and move it to a position that is more objects. For example—if the leftmost position of object receiver 2340 (for example—the position illustrated in FIG. 25a) brings object receiver 2340 to the lateral imaging area and it can receive objects when located in initial positions such as the position illustrated in FIG. 25a then after the object receiver 2340 returns from the lateral imaging area it can be mover to a rightmost position that can assist in releasing object 2333. The object receiver 2349 can be brought to a rightmost position in response to a previously stuck object but this is not necessarily so.

The object receiver 2340 can be brought to the rightmost position after each imaging sequence or each multiple imaging sequences.

Multiple lateral transferor portions can share one or more components such as share one or more rotating elements.

Although FIGS. 25a-25d do not illustrate a sensor a sensor that tracks stuck objects or a force or pressure sensor that senses a resistance to linear movement can be used and in response to a detection of a resistance that is above a threshold can stop the movement of the object receiver.

Buses push—pull stripes 2010 are multiple lateral transferor elements that form a lateral transferor that moves electrical objects to the right (to be imaged) and then to the left (after being imaged) and the push—pull stripes push move these buses to the left and to the right.

Bus motor 2020 and multi-clutch 2030 move the stripes 2010 to the left and to the right unless encountering at least a predefined resistance and the multi-clutch 2030 converts the mechanical movement of bus motor 2020 to left and right movements. Container 2040 included the electrical objects. Bus platform 2050 includes multiple buses—each bus has a long base and a sequence of evenly spaced projections whereas each pair of adjacent projections defined a space that can support a single electrical object. Load bus 2060 loads the electrical objects to the buses so that their longitudinal axis is normal to the transferring axis of the buses. Bus un-loader 2065 unloads the electrical objects after they were imaged by imager 30 to be rotated (by 90 degrees) and are transferred (conveniently below the first imaging area) to first longitudinal transferor 110.

Objects are provided to additional imaging area 550 and then return to their position before this imaging to be unloads and provided (conveniently under the buses) to first longitudinal conveyor 110.

Two different sides of the objects are obtained at different imaging areas. For example—assuming that the six sides are referred to as sides A, B, C, D, E, and F then sides A and C are imaged at the first imaging area, sides B and D are imaged at the second imaging area and sides E and F are imaged at the third imaging area. These images are illustrated by boxes 305 and 306 while the images obtained in the other four imaging areas 510-540 are illustrated by boxes 301-302, 303 and 304.

Figure 12:
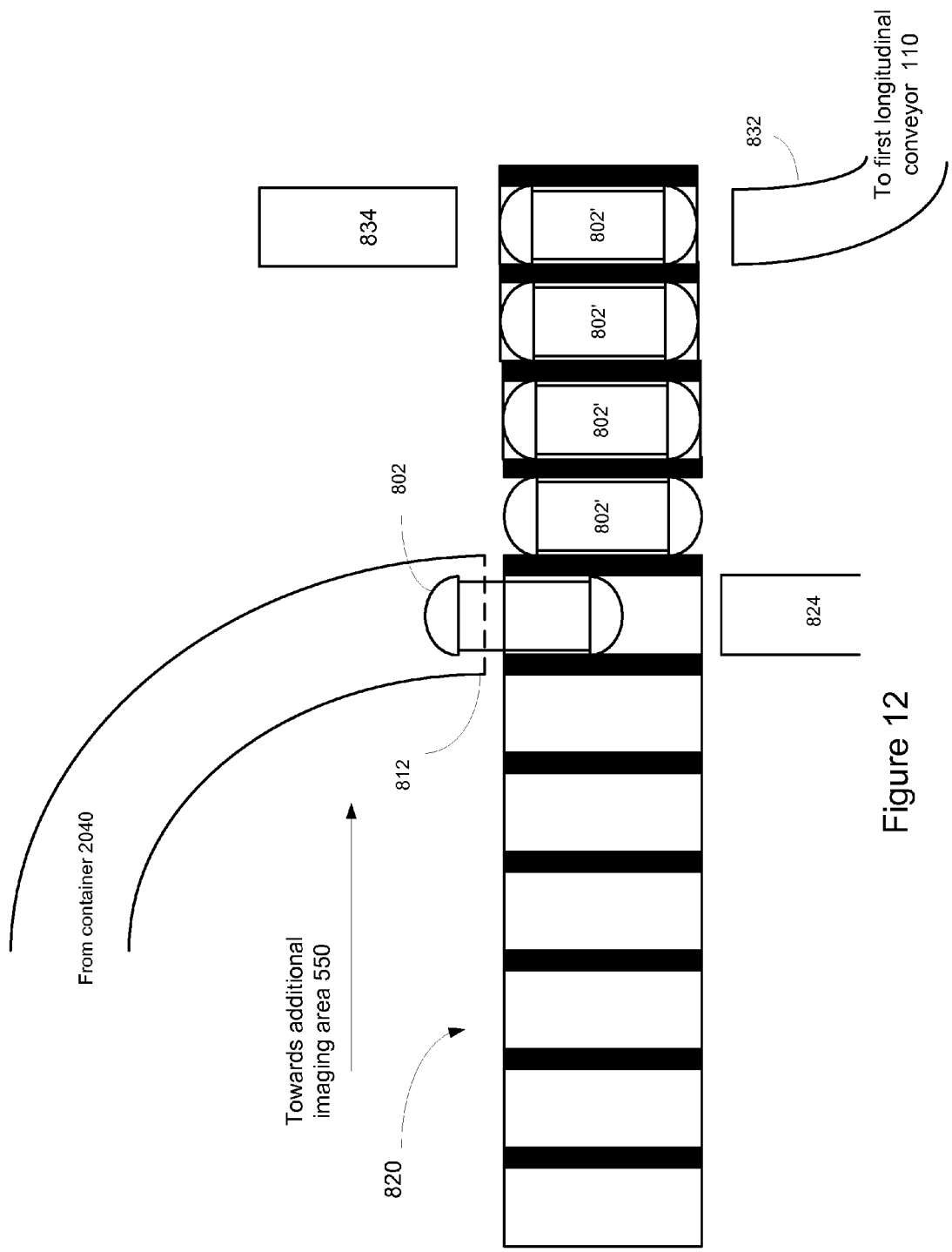
FIGS. 12 and 13 illustrate transferring elements, a suction element, a object conduit and few objects according to an embodiment of the invention.
Figure 13:
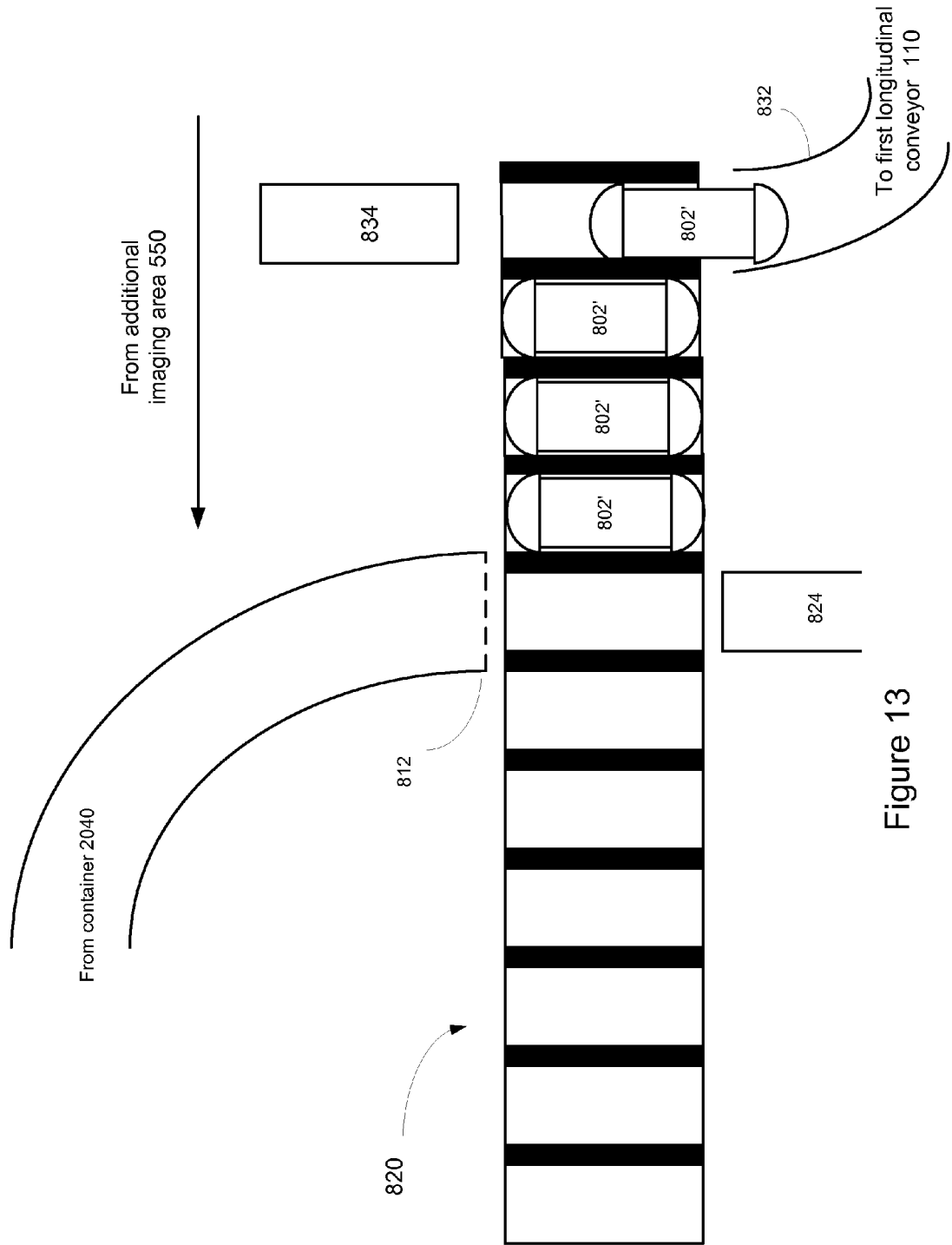

FIGS. 12 and 13 illustrate a bus 820, loading elements of loader 2060 and unloading elements of un-loader 2065 according to an embodiment of the invention.

It is assumed that additional imaging area 550 is located at the right of bus 820.

FIG. 12 illustrates loading elements 812 and 824 that load objects to bus before the imaging takes place and bus 820 (loaded within objects such as objects 802') moves to the right. After the imaging is completed bus 820 returns to its initial position (moved to the left—as illustrated in FIG. 13) and unloading elements 832 and 834 unload the imaged objects from bus 820.

Loading element 812 is a tunnel that starts near container 2040 and loading element 824 sucks the elements (by introducing a low gas pressure) towards bus 820.

Un-loading element 832 is a tunnel that extends (preferably below bus 820) towards first longitudinal transferor 110. Loading element 834 generates gas pulses that push the objects from bus 820 towards un-loading element 832.

Bus 820 conveys the objects so that their longitudinal axis is substantially orthogonal to the movement of the bus.

Bus 820 or other transferring element can be a part of a conveyor belt, can include multiple partitions, or can be moved towards additional imaging area 550 by mechanical, magnetic or gas pressure based means.

According to another embodiment of the invention, loading and unloading elements can operate in parallel—to remove already imaged objects from bus while loading objects to be imaged.

Figure 14:
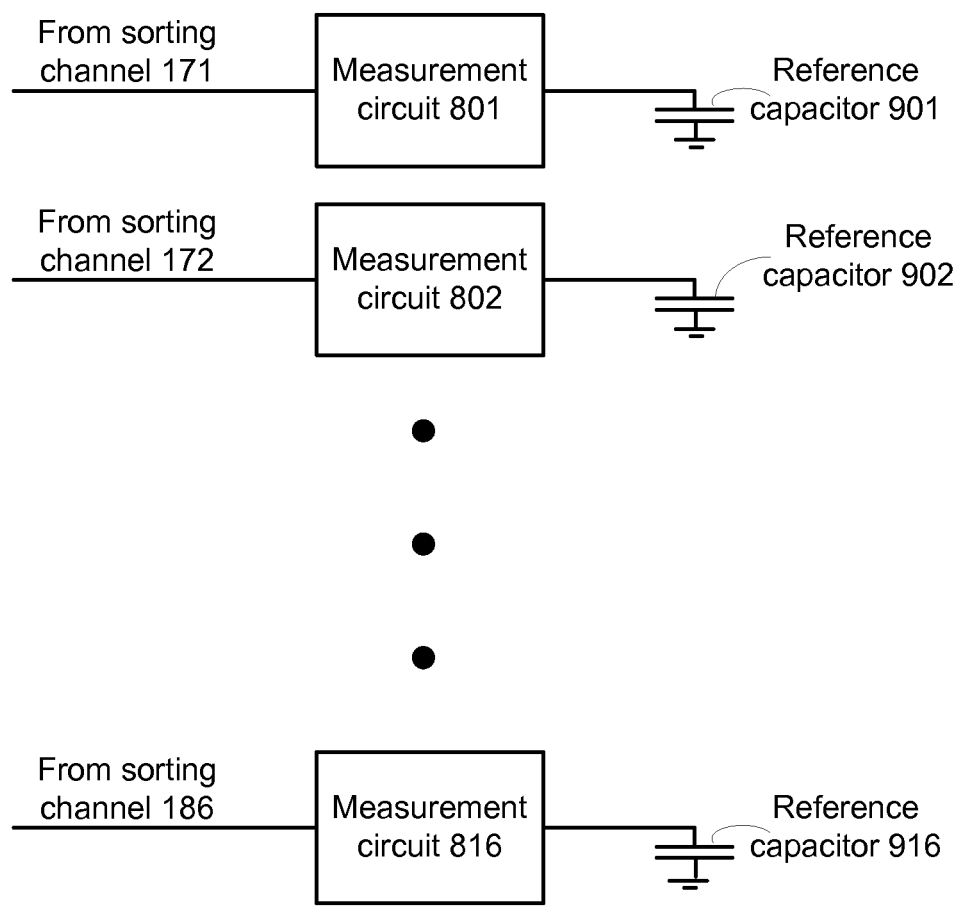
FIG. 14 illustrates an electrical tester, according to an embodiment of the invention.

FIG. 14 illustrates an electrical tester 180 according to an embodiment of the invention.

Electrical tester 160 include sixteen measurement circuits 801-816 that are connected to sixteen reference capacitors 901-916 on one hand and to test points (electrodes) of sixteen sorting channels 171-186 of sorting unit 170.

Measurement circuits 801-816 can include capacitance comparators such as PS021 of ACAM mass electronics. They compare very quickly between the capacitance of imaged capacitors (of sorting channels) and the reference capacitors 901-916. The comparison can indicate deviations from required capacitance.

Reference capacitors 901-916 should be kept at substantially the same conditions (temperature, humidity) as the imaged capacitors—so that the comparison is as accurate as possible. Placing the reference capacitors in close proximity to sorting unit 170 can assist in obtaining this goal.

Figure 15:
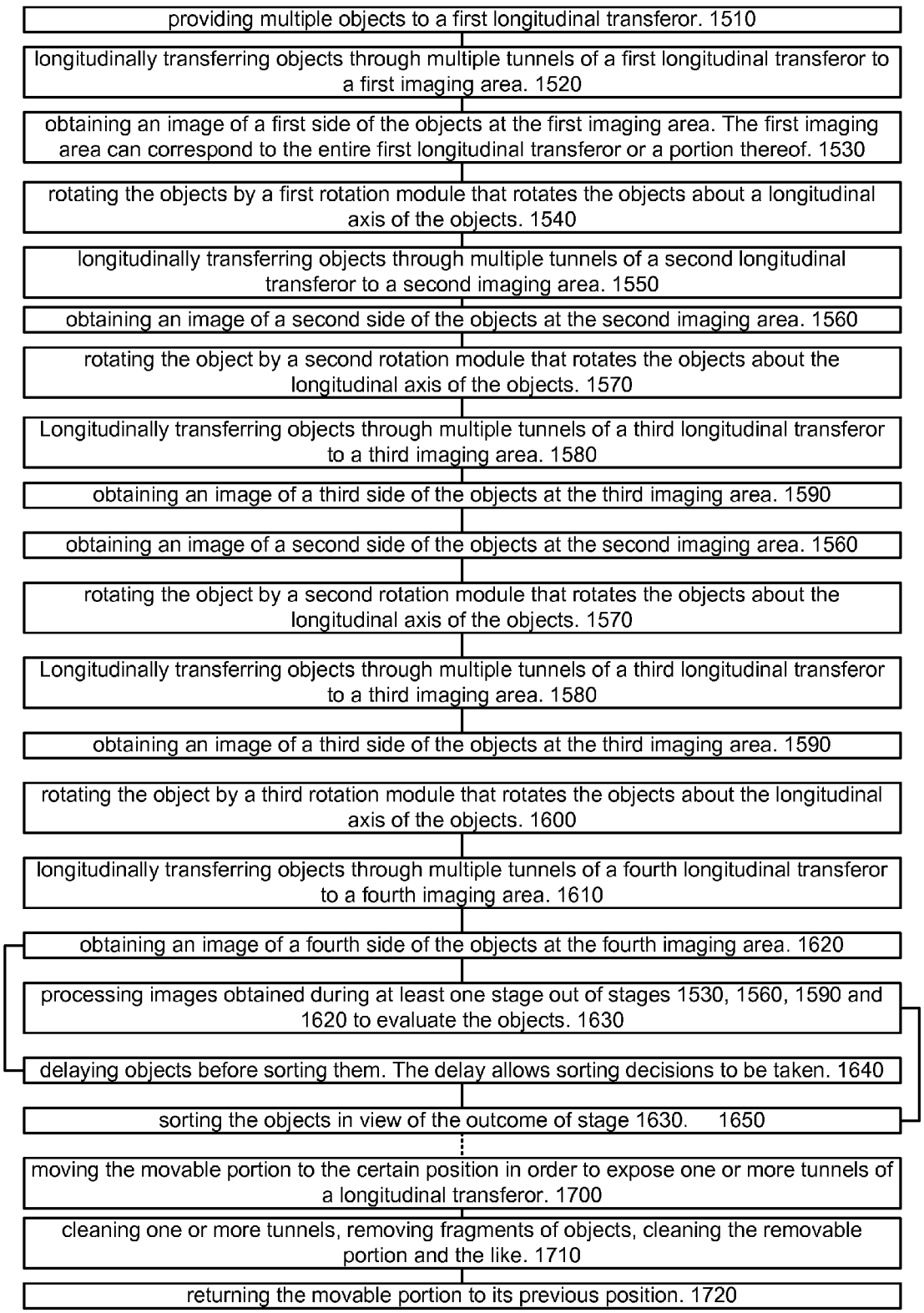
FIG. 15 is a flow chart of a method for imaging objects according to an embodiment of the invention.

FIG. 15 illustrates method 1500 according to an embodiment of the invention.

Method 1500 starts by stage 1510 of providing multiple objects to a first longitudinal transferor.

These objects can be sucked (or otherwise provided) to an inlet of a supply element and allowing the objects to fall through an outlet of the supply element towards tunnels of the first longitudinal transferor. The supply Stage 1510 is followed by stage 1520 of longitudinally transferring objects through multiple tunnels of a first longitudinal transferor to a first imaging area. Conveniently, once enough objects are gathered stage 1520 can be followed by stage 1530.

Stage 1520 can include positioning stopping elements of the first longitudinal transferor at a stopping position so that they prevent objects to be sent to the first rotation module. This positioning is followed by sucking the objects so that they form a column of objects per tunnel. The positioning can include moving these stopping elements into the tunnels of the first longitudinal transferor.

Stage 1530 includes obtaining an image of a first side of the objects at the first imaging area. The first imaging area can correspond to the entire first longitudinal transferor or a portion thereof. Accordingly, all or only some of the objects located within the longitudinal transferor can be imaged.

Stage 1530 includes imaging one side of the electrical objects. It can include obtaining the image via a transparent portion of the first longitudinal transferor.

Stage 1530 is followed by stage 1540 of rotating the objects by a first rotation module that rotates the objects about a longitudinal axis of the objects.

Stage 1540 can include rotating the objects by ninety degrees but this is not necessarily so. The rotation can involve rotating by less than ninety degrees, more then ninety degrees and the like.

Stage 1540 can be preceded by changing the position of the stopping elements of the first longitudinal transferor to enable the objects that were imaged in the first imaging area to move to the first rotation module. This re-positioning can include removing these stopping elements from the tunnels of the first longitudinal transferor.

Stage 1540 is followed by stage 1550 of longitudinally transferring objects through multiple tunnels of a second longitudinal transferor to a second imaging area.

Stage 1540 can include positioning stopping elements of the second longitudinal transferor at a stopping position so that they prevent objects to be sent to the second rotation module. This positioning is followed by sucking the objects so that they form a column of objects per tunnel. The positioning can include moving these stopping elements into the tunnels of the second longitudinal transferor. Typically, the stopping elements are placed at a stopping position before the objects are allowed to be sent from the first longitudinal transferor.

Stage 1550 is followed by stage 1560 of obtaining an image of a second side of the objects at the second imaging area.

Stage 1560 is followed by stage 1570 of rotating the object by a second rotation module that rotates the objects about the longitudinal axis of the objects.

Stage 1560 can be preceded by changing the position of the stopping elements of the second longitudinal transferor to enable the objects that were imaged in the second imaging area to move to the second rotation module. This re-positioning can include removing these stopping elements from the tunnels of the second longitudinal transferor.

Stage 1570 is followed by stage 1580 of longitudinally transferring objects through multiple tunnels of a third longitudinal transferor to a third imaging area.

Stage 1580 can include positioning stopping elements of the third longitudinal transferor at a stopping position so that they prevent objects to be sent to the third rotation module. This positioning is followed by sucking the objects so that they form a column of objects per tunnel. The positioning can include moving these stopping elements into the tunnels of the third longitudinal transferor.

Stage 1580 is followed by stage 1590 of obtaining an image of a third side of the objects at the third imaging area.

Stage 1590 is followed by stage 1600 of rotating the object by a third rotation module that rotates the objects about the longitudinal axis of the objects.

Stage 1540 can be preceded by changing the position of the stopping elements of the third longitudinal transferor to enable the objects that were imaged in the third imaging area to move to the third rotation module. This re-positioning can include removing these stopping elements from the tunnels of the third longitudinal transferor.

Stage 1600 is followed by stage 1610 of longitudinally transferring objects through multiple tunnels of a fourth longitudinal transferor to a fourth imaging area.

Stage 1610 can include positioning stopping elements of the fourth longitudinal transferor at a stopping position so that they prevent objects to be sent to the fourth rotation module. This positioning is followed by sucking the objects so that they form a column of objects per tunnel. The positioning can include moving these stopping elements into the tunnels of the fourth longitudinal transferor.

Stage 1610 is followed by stage 1620 of obtaining an image of a fourth side of the objects at the fourth imaging area.

Stage 1620 is followed by stages 1630 and 1640. Stage 1630 includes processing images obtained during at least one stage out of stages 1540, 1570 and 1620 to evaluate the objects. Stage 1630 can include searching for visible defects, searching from deviations from expected size or shape, and the like. Stage 1630 can include determining the functionality of the objects and especially classifying them to functionality classes such as but not limited to "functional", "defective" or "questionable functionality". This classification will determine how these objects will be sorted.

Stage 1640 includes delaying objects before sorting them. The delay allows sorting decisions to be taken.

Stages 1640 and 1630 are followed by stage 1650 of sorting the objects in view of the outcome of stage 1630.

At least one longitudinal transferor has a movable portion that when placed in a certain position exposes at least a substantial portion of at least one tunnel.

Conveniently, each of stages 1520, 1540, 1550, 1570, 1580 and 1610 utilizes gas pressure differentials to transfer the objects.

Conveniently, each of stages 1520, 1540, 1550, 1570, 1580 and 1610 includes laterally transferring objects through multiple tunnels, each including substantially vertical sidewalls.

Conveniently, stages 1520, 1540, 1550, 1570, 1580 and 1610 include transferring objects through multiple tunnels of the four longitudinal transferor that form four imaging areas and each of the four longitudinal transferor is much longer than each rotation module.

Conveniently, each of stages 1530, 1560, 1590 and 1620 includes obtaining an image of a single side of the objects and these stages do not include utilizing sloped mirrors or other optical elements that can assist in projecting more than a single side view per object towards an imager.

Gas differentials can introduced in a pulsed manner and in multiple places simultaneously. Typically, the mentioned above stages are executed in a pipelined manner—to enable an acquisition of images of multiple groups of electrical circuits that are located at different imaging areas. These gas pulses can be applied in synchronization with the movement of stopping elements.

Either one of stages can include imaging the objects via a transparent portion (either movable or not) of the longitudinal transferor.

Conveniently, the mentioned above stage are executed in a pipelined manner. For example, while one group of objects is imaged at the first imaging area yet another group of objects is images at another imaging area. These groups of objects should be (once the imaging is completed) move to a next imaging area while the fourth group is send to a delay unit or to a sorting unit. This requires moving the group that is positioned at later stages of the system before another group of objects can take its place. Conveniently this achieved by maintaining time differences between the positioning of stopping elements of different longitudinal transferors. For example, method 1500 can include the following sequence of stages: (i) placing the stopping elements of the fourth longitudinal transferor in a non-stopping position and allowing electrical elements to be sucked towards a delay unit or a sorting unit; (ii) placing the stopping elements of the fourth longitudinal transferor in a stopping position and placing the stopping elements of the third longitudinal transferor in a non-stopping position and allowing electrical elements to be sucked from the third imaging area to the fourth imaging area; (iii) placing the stopping elements of the third longitudinal transferor in a stopping position and placing the stopping elements of the second longitudinal transferor in a non-stopping position and allowing electrical elements to be sucked from the second imaging area to the third imaging area; (iv) placing the stopping elements of the second longitudinal transferor in a stopping position and placing the stopping elements of the first longitudinal transferor in a non-stopping position and allowing electrical elements to be sucked from the first imaging area to the second imaging area; and (v) placing the stopping elements of the first longitudinal transferor in a stopping position and allowing electrical elements to be sucked from the second imaging area to the first imaging area.

After one or more (usually many more) iterations of stages 1510-1620, and additionally or alternatively after a pre-defined event occurs (for example—one or more tunnels are stuck, one or more tunnels are too dirty) method 150 proceeds to cleaning the tunnels and removing objects or object fragments from the tunnels.

Accordingly, stage 1620 is followed by stage 1700 of moving the movable portion to the certain position in order to expose one or more tunnels of a longitudinal transferor.

Stage 1700 can include removing a movable portion that is detachably connected to other portions of one or more longitudinal transferor or moving the movable portion without detaching it. The latter movement can include sliding, rotating, folding and the like.

Stage 1700 is followed by stage 1710 of cleaning one or more tunnels, removing fragments of objects, cleaning the removable portion and the like. The cleaning can be assisted by vacuum but this is not necessarily so.

Stage 1710 is followed by stage 1720 of returning the movable portion to its previous position. Stage 1720 can be followed by stage 1010.

Transferring the objects during stages such as 1520 can require vacuum and the tunnels should be substantially sealed. Accordingly, movable portion should be returned to its previous position in a manner that facilitates additional iterations of stages 1520-1630. This can be achieved by pressing movable portions against other portions of the system, using elastic members or other sealing elements and the like.

Conveniently, the movable portion is rigid and it is tightened to other portions of the systems by clips.

Figure 16:
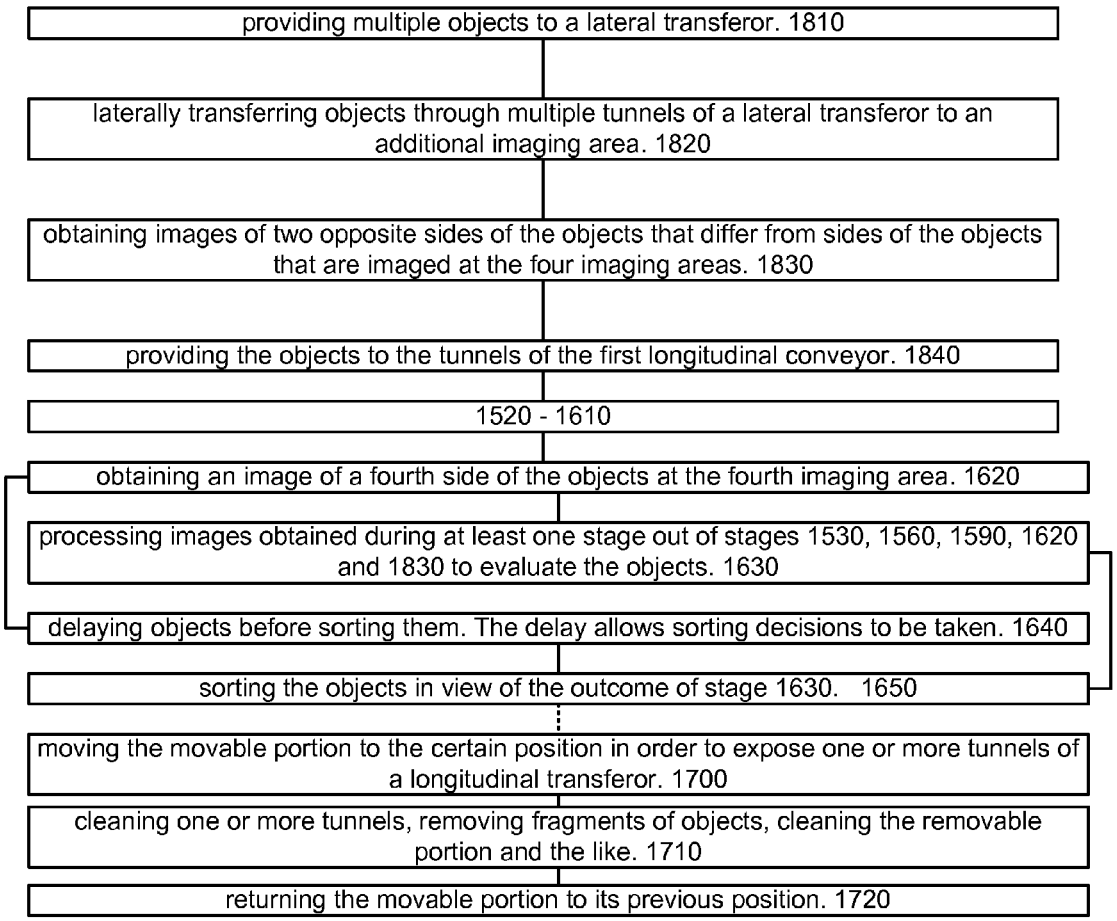
FIG. 16 is a flow chart of a method for imaging objects according to an embodiment of the invention.

FIG. 16 illustrates method 1800 according to an embodiment of the invention. Method 1800 allows to image six sides of the objects. In addition to stages 1620-1730 of method 1600 it includes stages 1810, 1820, 1830, 1840 and 1850.

FIG. 16 illustrates stages 1810-1850 as preceding stage 1620 but this is not necessarily so.

Stage 1810 includes providing multiple objects to a lateral transferor. This can include allowing electrical objects to propagate along multiple tunnels in a longitudinal manner and sucking then out of these tunnels from an inlet formed at the side of the tunnels to provide them to lateral transferors.

This can involve placing these objects on buses that have regularly spaced trajectories that separate one object from another.

Examples of such lateral transferors are illustrated in PCT patent application WO 2007/129322 titled "System and method for imaging objects" which is incorporated herein by reference.

Stage 1810 is followed by stage 1820 of laterally transferring objects through multiple tunnels of a lateral transferor to an additional imaging area. This can be achieved by a bus that receives one object after the other until it positions the electrical circuits at another imaging area.

Stage 1820 can include laterally transferring the objects between pairs of sloped mirrors that allow imaging two opposite sides of the objects.

Stage 1820 is followed by stage 1830 of obtaining images of two opposite sides of the objects that differ from sides of the objects that are imaged at the four imaging areas.

Conveniently, stage 1830 includes at least one of the following or a combination thereof: (i) illuminating at least one pair of sloped mirrors adapted to direct light towards opposite sides of the objects and to direct light reflected or scattered from the opposite sides of the objects towards the imager; (ii) illuminating objects from multiple angles; (iii) illuminating the objects in multiple illumination manners, wherein the different manners can include different wavelength, different polarization, different intensity, and the like; (iv) illuminating a pair of sloped mirrors per each longitudinal transferor, wherein the pair of sloped mirrors is adapted to direct light towards opposite sides of the objects and to direct light reflected or scattered from the opposite sides of the objects towards an imager; (vi) illuminating multiple sloped mirrors that are oriented in forty five degrees.

Stage 1830 is followed by stage 1840 of providing the objects to the tunnels of the first longitudinal conveyor.

Stage 1840 can include moving the bus to its initial position while electrical objects are forced to propagate towards tunnels of the first longitudinal transferor.

It is noted that stage 1630 can also be responsive to images obtained during stage 1830.

It is further noted that method 1800 can include moving at least one movable portion of the lateral transferor to expose at least one tunnel of the lateral transferor so that this tunnel can be cleaned.

Figure 17:
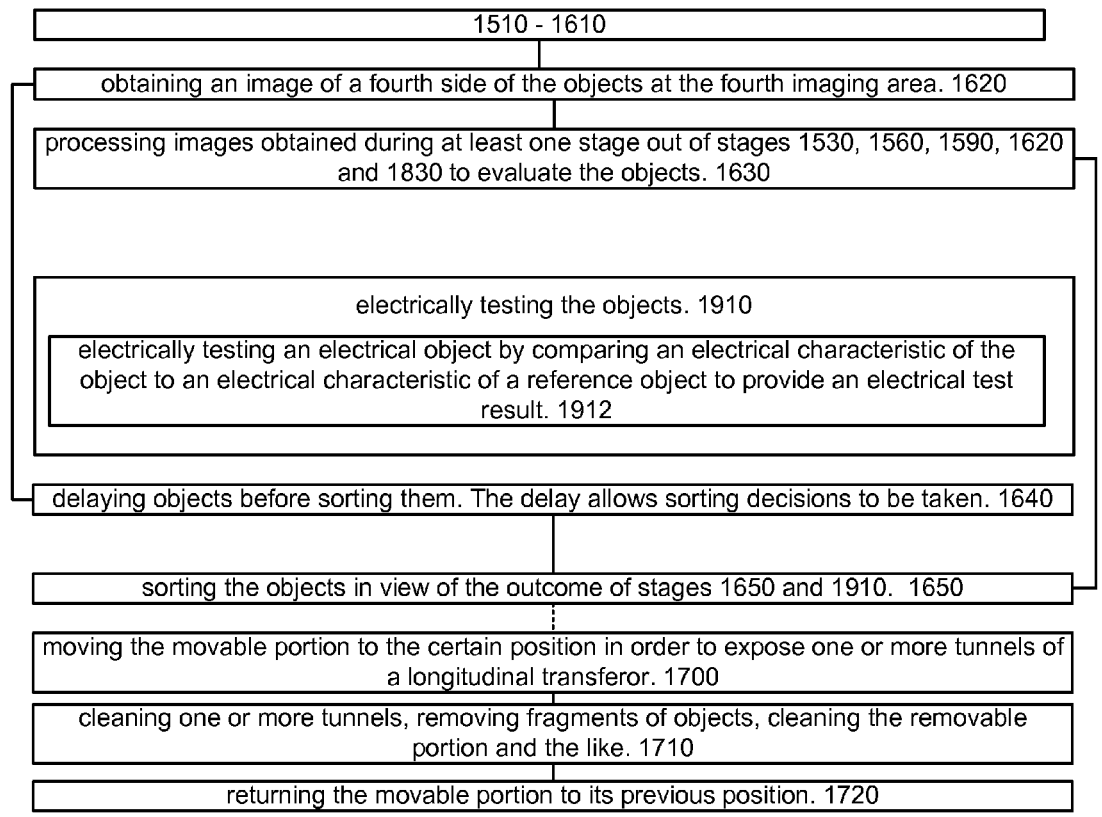
FIG. 17 is a flow chart of a method for imaging objects according to an embodiment of the invention.

FIG. 17 illustrates method 1900 according to an embodiment of the invention. Method 1900 includes stages 1610-1730 of method 1600 but also includes stage 1910 of electrically testing the objects. Stage 1910 should precede stage 1630. It can follow stage 1620 but this is not necessarily so.

Stage 1630 can be responsive to the results of these electrical testing.

Stage 1910 includes stage 1912 of electrically testing an electrical object by comparing an electrical characteristic of the object to an electrical characteristic of a reference object to provide an electrical test result.

If the objects are capacitors then stage 1910 can include comparing a capacitance of a capacitor to a capacitance of a reference capacitor. This comparison can be executed in a very short time—especially in comparison to absolute capacity measurements.

It is noted that stage 1910 can be included in method 1800.

It is also noted that the electrical testing can be executed only to some of the objects—based upon their functionality. Thus, if the image analysis indicates that an object is faulty the electrical testing can be skipped. Yet for another example—an object can be classified as functional only after both image processing and electrical tests indicate that it is functional.

Stage 1910 can be executed by utilizing electrical test points located in a system that generated the images. These electrical testing points can be located within the lateral transferor, within a longitudinal transferor, within a sorting unit, within a rotation module and the like. The location of these test points determines the relative order of the electrical testing and the image acquisition stages.

Figure 18:
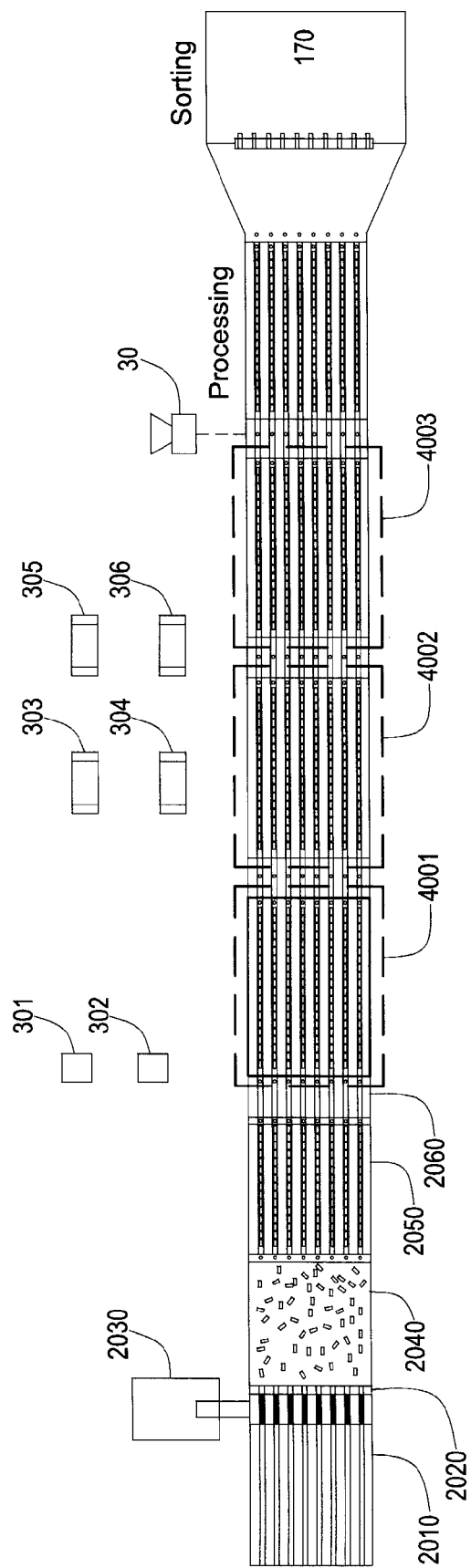
FIG. 18 illustrates a system for imaging objects according to an embodiment of the invention.

FIG. 18 illustrates system 2000 according to an embodiment of the invention.

System 2000 includes (from left to right): (i) buses push—pull stripes 2010—the buses are multiple lateral transferors that move electrical objects to the right (to be imaged) and then to the left (after being imaged) and the push—pull stripes push move these buses to the left and to the right; (ii) bus motor 2020 and multi-clutch 2030 that move the stripes 2010 to the left and to the right and the multi-clutch 2030 converts the mechanical movement of bus motor 2020 to left and right movements; (iii) a container 2040 that included the electrical objects; (iv) bus platform 2050 that includes multiple buses—each bus has a long base and a sequence of evenly spaced projections whereas each pair of adjacent projections defined a space that can support a single electrical object; (v) a load element (referred to as load bus 2060) that loads the electrical objects to the buses so that their longitudinal axis is normal to the transferring axis of the buses; (vi) first imaging area 2070 that is imaged by imager 30 to obtain images of two opposite ends (for example—the two opposite ends of a capacitor—illustrated by boxes 2202 and 2204); (vii) bus un-loader 2080 that unloads the electrical objects after they are were imaged by imager 30 to be rotated (by 90 degrees) and are transferred (conveniently below the first imaging area) to the right to be elevated (by elevator 2090) towards the second imaging area 2100; (vii) second imaging area 2100 that is imaged by imager 30 to provide images of two sides (illustrated by boxes 2206 and 2208) of the objects; (viii) half flip unit 2110; (ix) third imaging area 2120 that is imaged by imager 30 to provide images of two other sides (illustrated by boxes 2210 and 2212); (x) delay unit 2130 (denoted processing) in which the objects are delayed while their images are processed; and (xi) sorting unit 170.

Two longitudinal transferors 2102 and 2112 are positioned at second and third imaging areas 3220 and 2120 and are used to longitudinally convey objects to the second imaging area, from the second imaging area to the third imaging area and out of the third imaging area.

Two different sides of the objects are obtained at different imaging areas. For example—assuming that the six sides are referred to as sides A, B, C, D, E, and F then sides A and C are imaged at the first imaging area, sides B and D are imaged at the second imaging area and sides E and F are imaged at the third imaging area.

Figure 19:
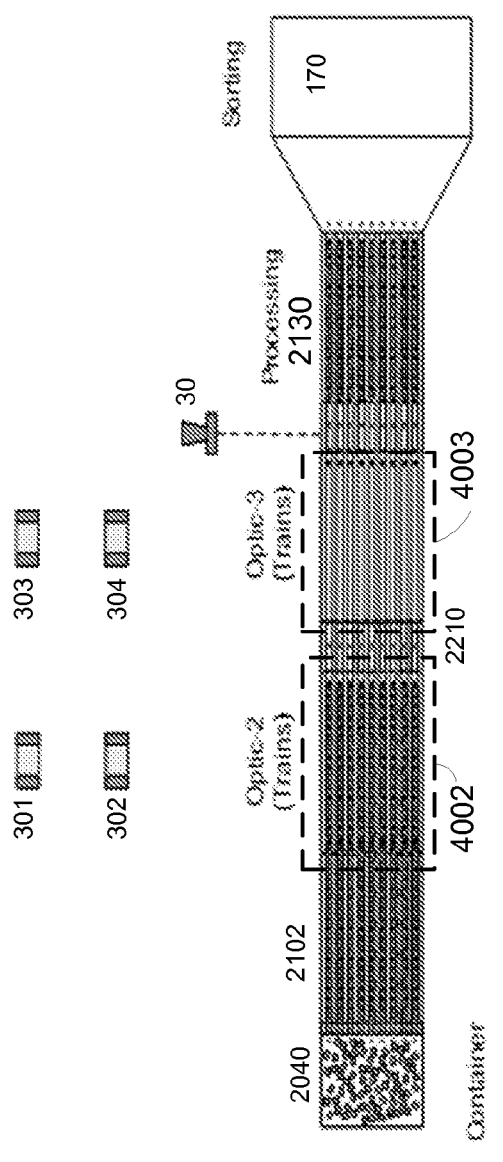
FIG. 19 illustrates a system for imaging objects according to an embodiment of the invention.

FIG. 19 illustrates system 2001 that images only four sides of the electrical objects thus does not include bus push—pull stripes; bus motor and multi-clutch; and first imaging area.

System 2001 includes (from left to right): (i) container 2040 that included the electrical objects; (iv) first longitudinal transferor 2102; (ii) second imaging area 2100 that is imaged by imager 30 to provide images of two sides (illustrated by boxes 2206 and 2208) of the objects; (viii) half flip unit 2110; (ix) third imaging area 2120 that is imaged by imager 30 to provide images of two other sides (illustrated by boxes 2210 and 2212); (x) delay unit 2130 (denoted processing) in which the objects are delayed while their images are processed; and (xi) sorting unit 170.

Figure 20:
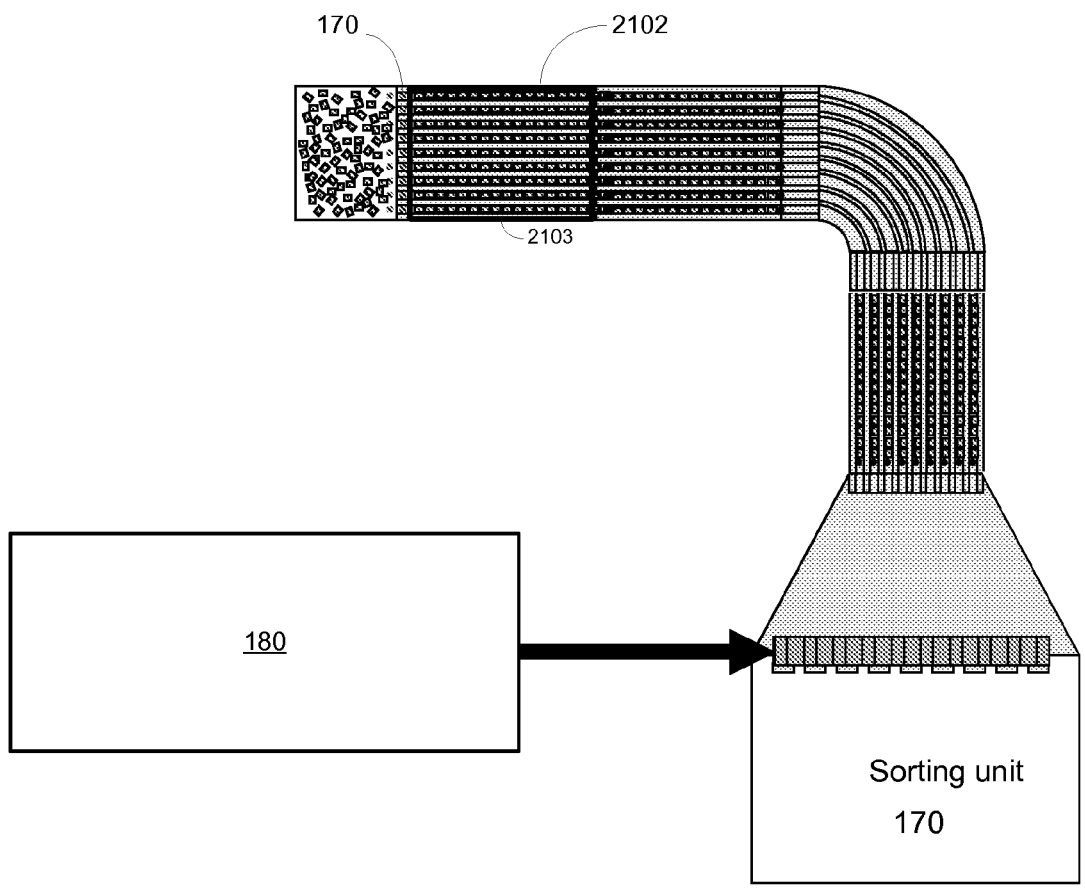
FIG. 20 illustrates a system for electrical testing according to an embodiment of the invention.

FIG. 20 illustrates system 3000 according to an embodiment of the inventor. System 3000 performs electrical testing of capacitors and sorts them according to their functionality.

System 3000 includes supply unit 170, longitudinal transferor 2102 and a sorting unit 170 that is equipped with test points that can electrically connect objects provided to sorting unit 170 and measurement devices 180 such as measurement device 3200.

Figure 21:
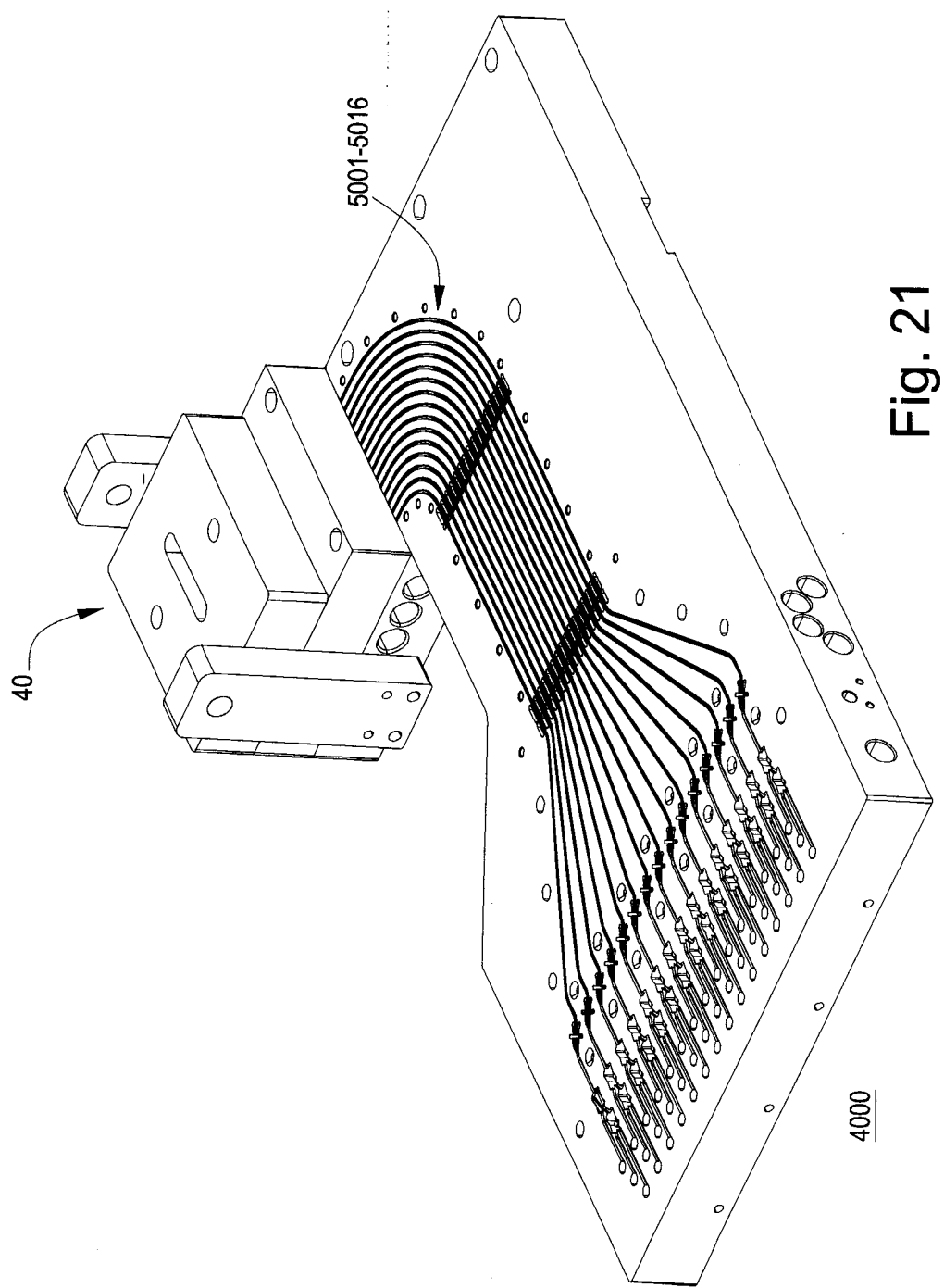
FIGS. 21-22 illustrate systems according to various embodiments of the invention.

FIG. 21 illustrates system 4000 according to an embodiment of the invention.

System 4000 is used to filter out objects that are wider then required. Such objects as well as fractions of objects are directed toward tunnels that can be slightly wider then (or almost exactly the size of) the allowable width. Objects that are wider then this width get stuck. They can later be sucked out of the system or evacuated by other means. System 4000 includes supply element 40, multiple channels 5001-5016 and sorting unit 170.

Figure 22:
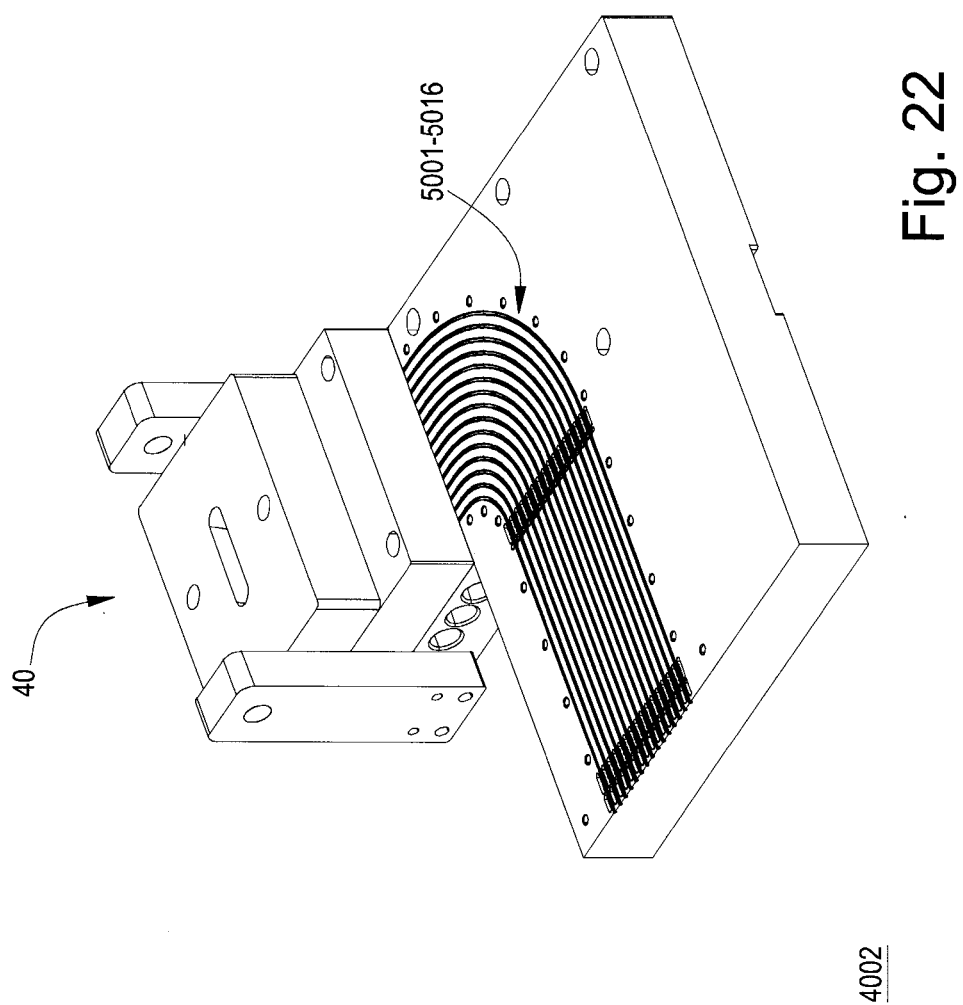

FIG. 22 illustrates system 4002 according to an embodiment of the invention. System 4002 does not include sorting unit. If objects are stuck they can be evacuated. It can include a movable portion that once removed exposed tunnels 5001-5016. System 4000 can also include such movable portion.

System 4000 is used to filter out objects that are wider then required. Such objects as well as fractions of objects are directed toward tunnels that can be slightly wider then (or almost exactly the size of) the allowable width. Objects that are wider then this width get stuck. They can later be sucked out of the system or evacuated by other means. System 4000 includes supply element 40, multiple channels 5001-5016 and sorting unit 170.

Figure 23:
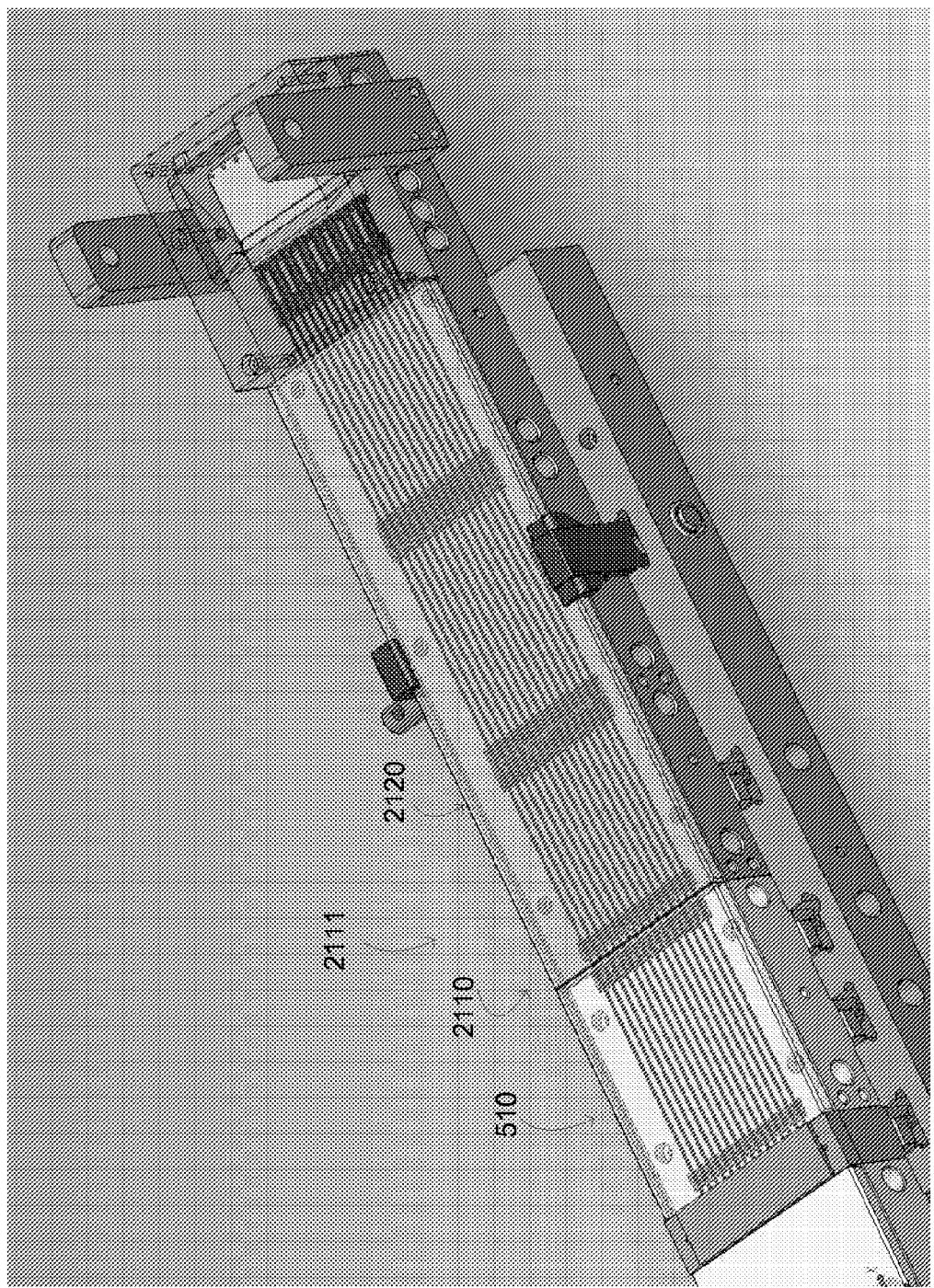
FIG. 23 illustrates a system for imaging objects according to an embodiment of the invention.

FIG. 23 illustrates a portion of system 2100 for acquiring multiple images of objects according to an embodiment of the invention.

The portion includes object grouping element 2111 that is located between a feeder (right side of the page) and tunnels of first imaging area 510.

Object grouping module 2111 receives objects and partitions the received objects to substantially fixed sized groups of objects and sends each of the substantially fixed sized groups a tunnel out of the multiple tunnels of longitudinal transferor 2120.

Figure 24:
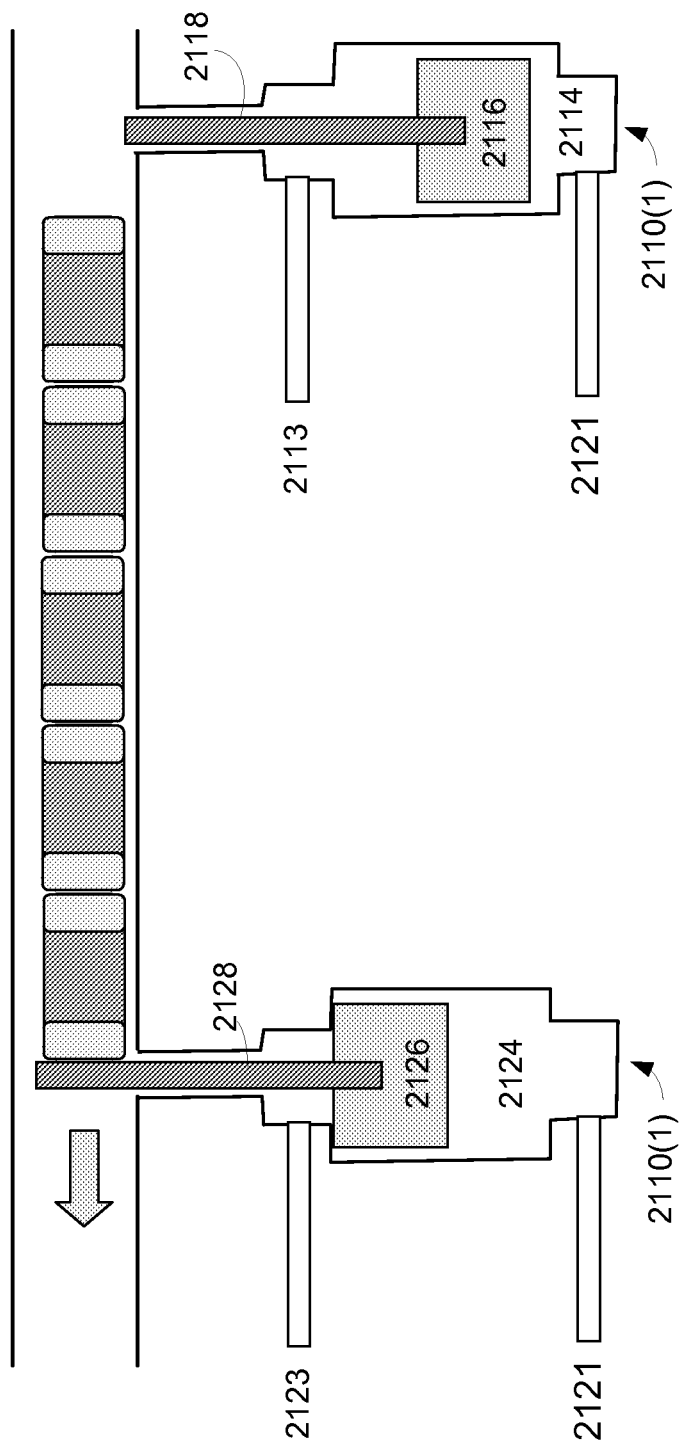
FIG. 24 illustrates two stopping elements according to an embodiment of the invention.

Object grouping module 2111 includes multiple pairs of stopping elements. The first stopping elements of each pair are denoted 2110 and the second stopping element of each pair are referred to as 2120. FIG. 24 illustrates a cross section of object grouping module 2111 along an axis that is parallel to the longitudinal axis of the tunnels of object grouping module 2111. This cross section illustrates first stopping element 2110(1) and second stopping element 2120(1). These stopping elements are spaced apart from each other—first stopping element 2110(1) is more downstream that second stopping element 2120(1).

Second stopping element 2120(1) allows a transfer of objects towards a tunnel of the longitudinal transferor during a fixed time period (also referred to as open period). It is assumed that during the open period it will allow a fixed number of objects to pass it. First stopping element 2110(1) is open (placed in an object unstopping position) to allow objects to aggregate between him and second stopping element 2120(1).

First stopping element 2110(1) is positioned in a stopping position to prevent objects from passing it during the open period. The duration between the open periods of second stopping element 2120(1) can be longer than the open period itself—in order to assist in the aggregation of objects between the two stopping elements.

Stopping elements 2120(1) and 2110(1) can be moved between an object stopping position to an object unstopping position by applying a gas differential.

FIG. 24 illustrates first stopping element 2110(1) as including piston 2116 that is connected to vertical rod 2118. Piston 2116 reciprocates within space 2114 that has an inlet 2111 and an outlet 2113. The inlet 2111 and outlet 2113 facilitate introduction of gas (as illustrated by arrows) to space 2114 and the evacuation of gas from space 2114 such as to induce the reciprocation of piston 2116. Piston 2116 reciprocates between an object stopping position in which vertical rod 2118 stops objects from passing it and an object unstopping position in which vertical rod 2118 allows objects to pass it. FIG. 24 illustrates second stopping element 2120(1) as including piston 2126 that is connected to vertical rod 2128. Piston 2126 reciprocates within space 2124 that has an inlet 2121 and an outlet 2123. The inlet 2121 and outlet 2123 facilitate introduction of gas (as illustrated by arrows) to space 2124 and the evacuation of gas from space 2124 such as to induce the reciprocation of piston 2126. Piston 2126 reciprocates between an object stopping position in which vertical rod 2128 stops objects from passing it and an object unstopping position in which vertical rod 2128 allows objects to pass it.

FIG. 24 illustrates first stopping element 2110(1) in an object unstopping position and second stopping element 2120(1) in an object stopping position.

FIGS. 26a-26c illustrates multiple objects and multiple tunnels 5001, 5002 and 5003 of a feeder according to an embodiment of the invention.

Figure 5A:
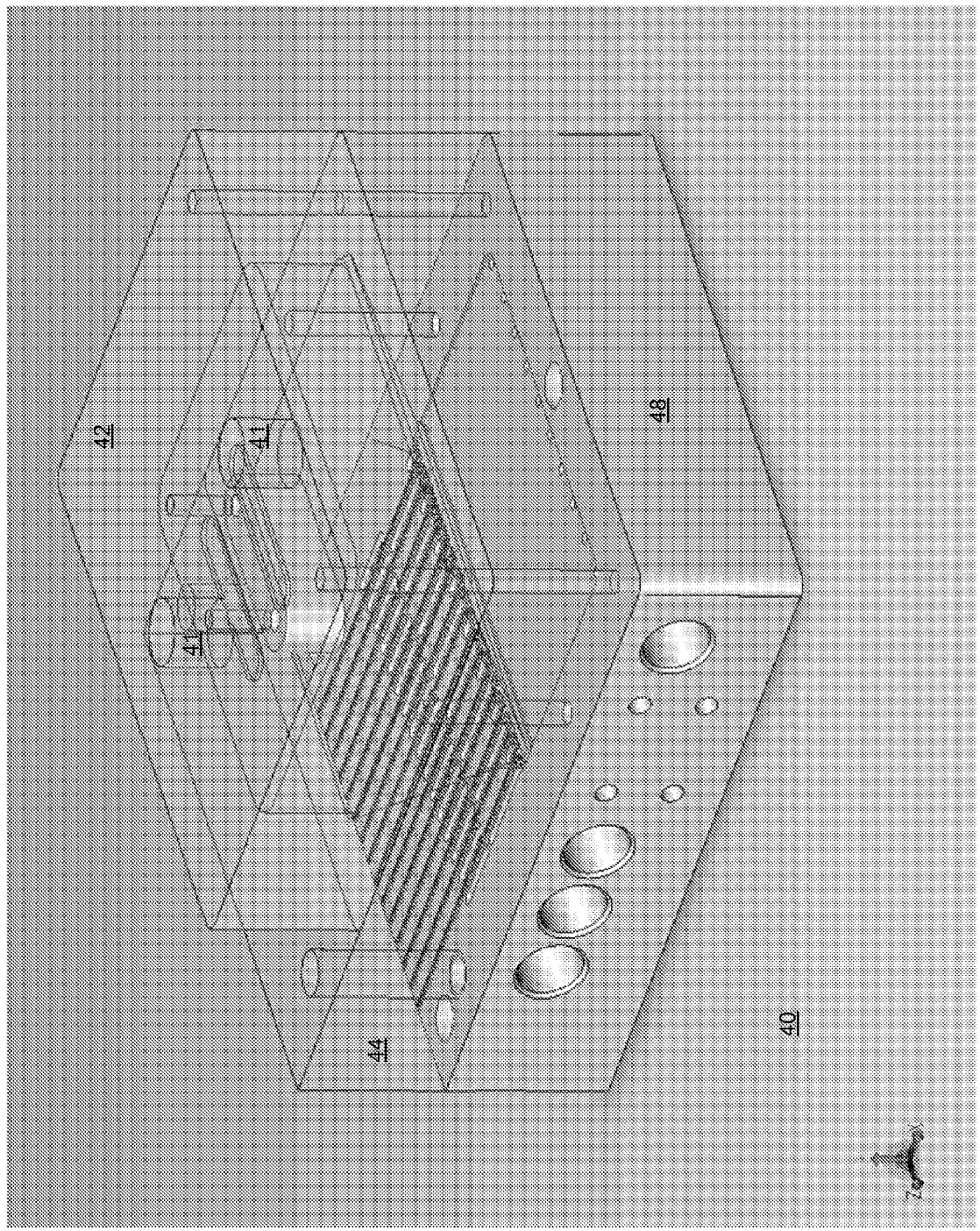
FIGS. 5a-5f illustrate a supply element according to an embodiment of the invention.
Figure 5B:
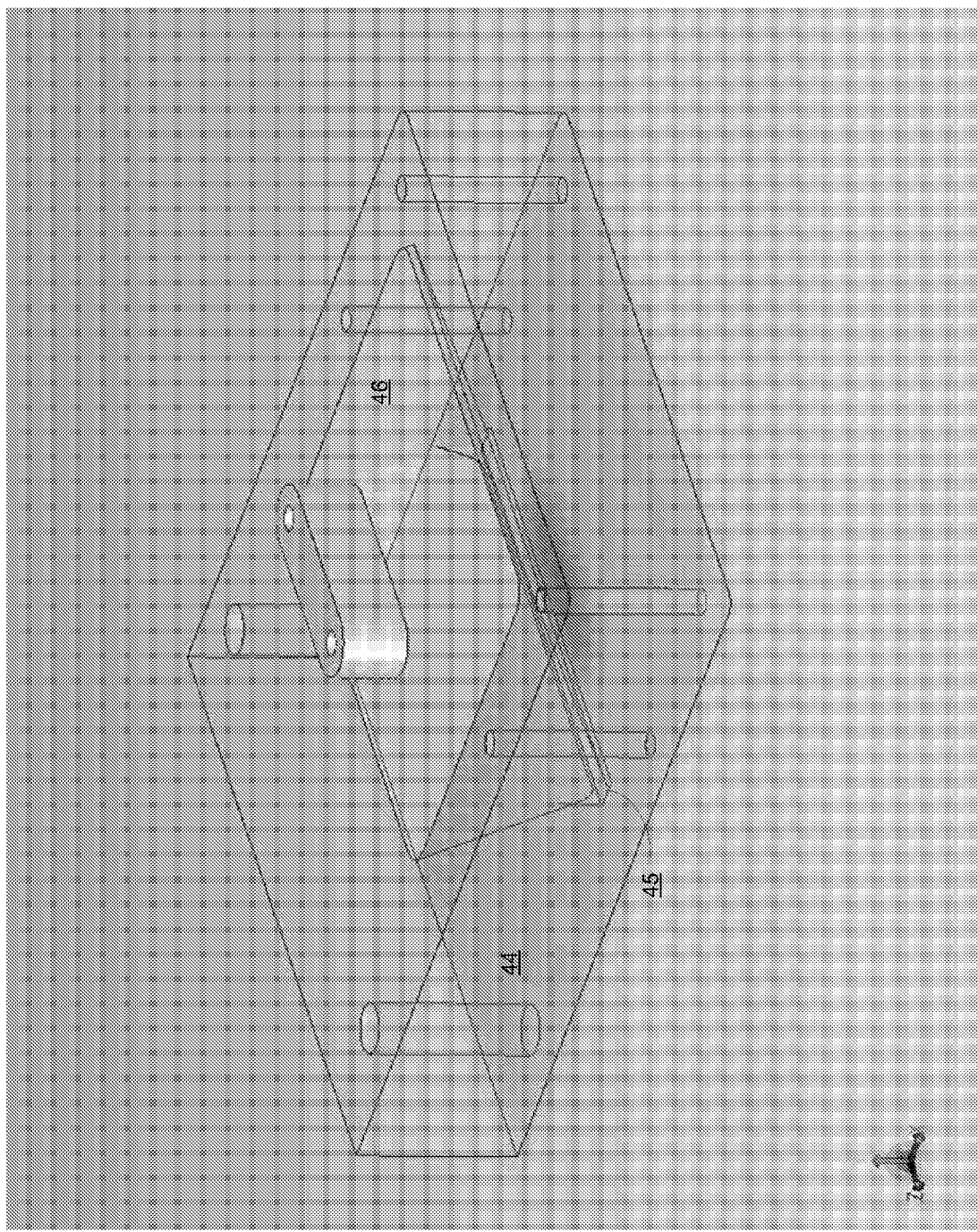
Figure 5C:
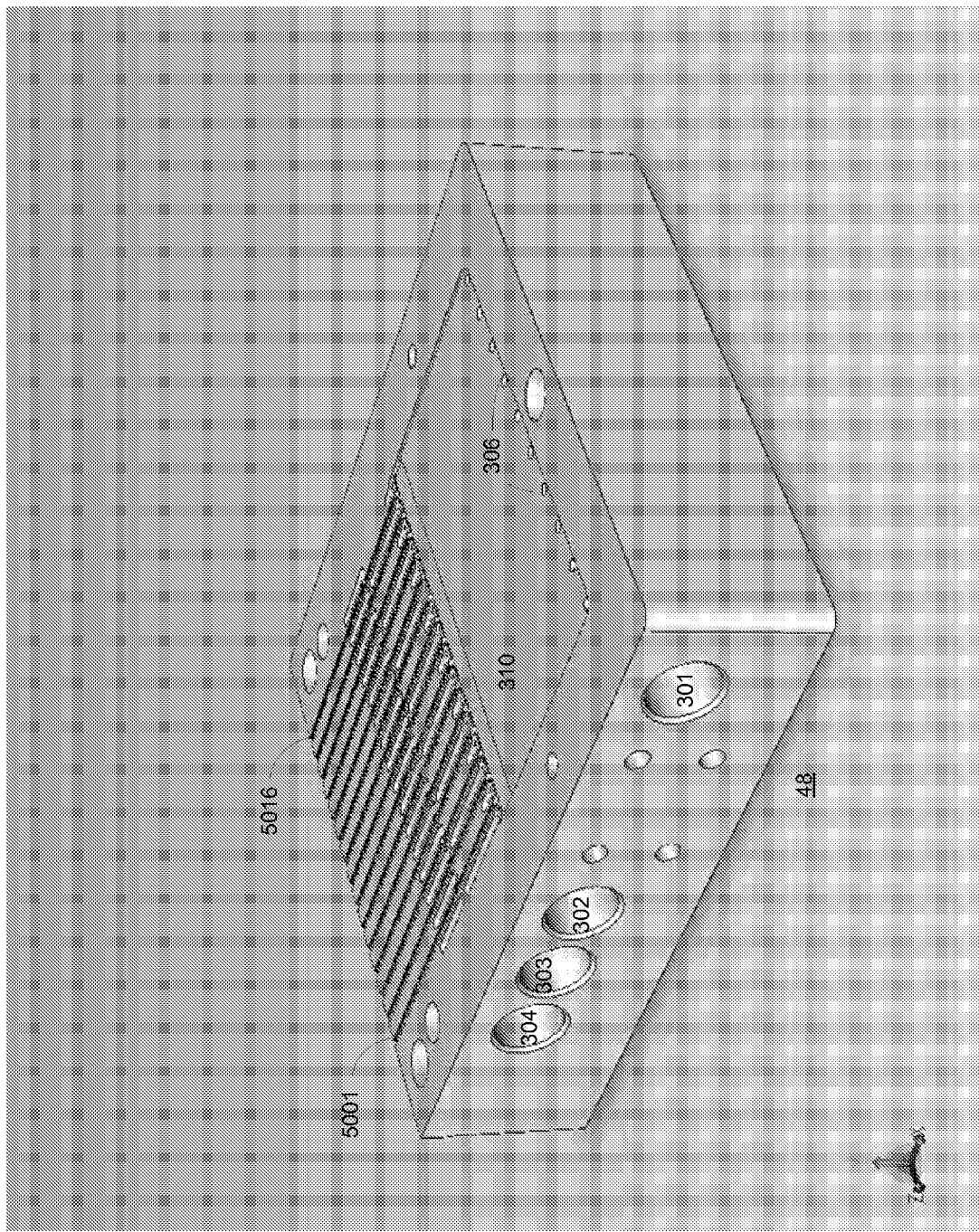
Figure 5D:
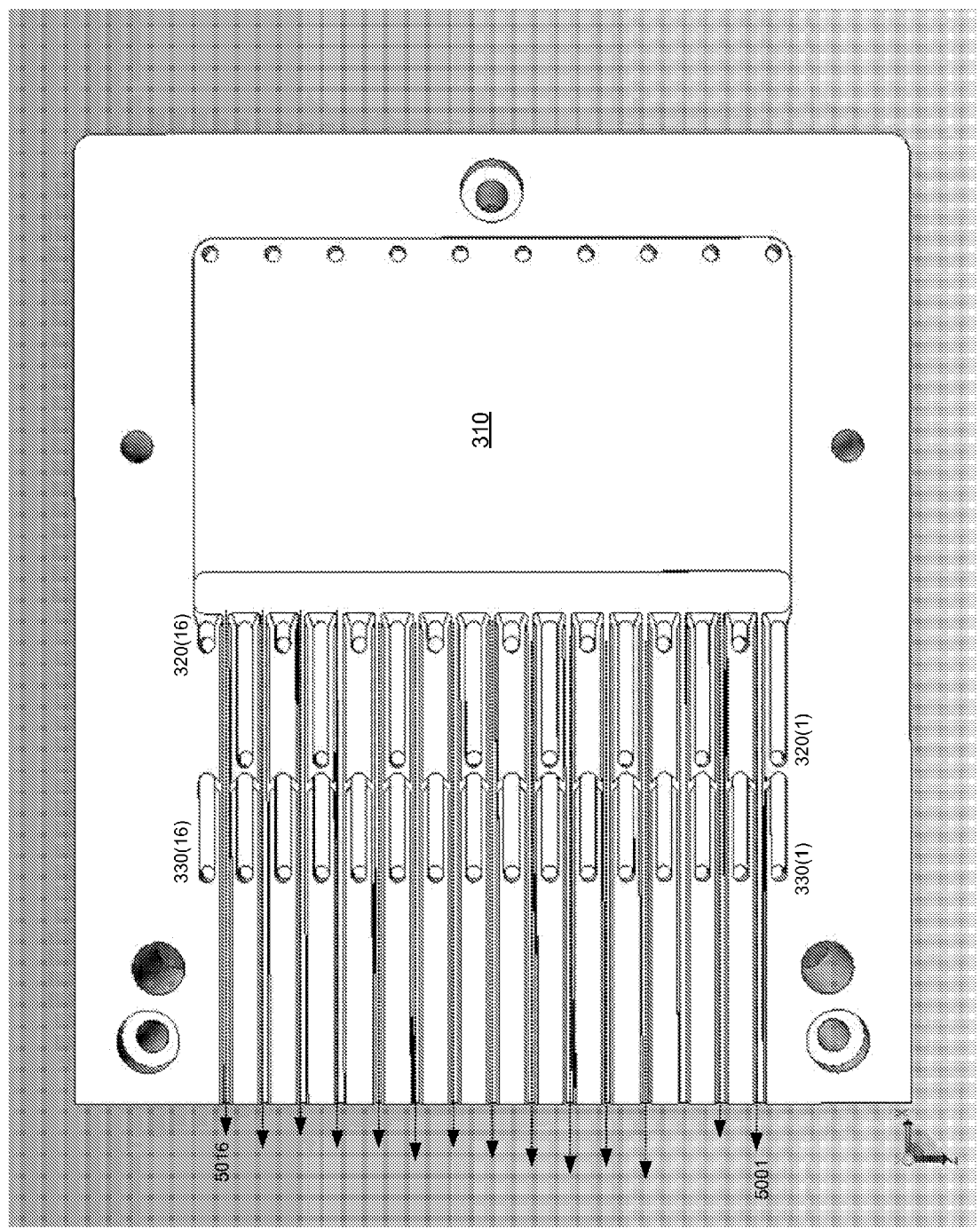
Figure 5E:
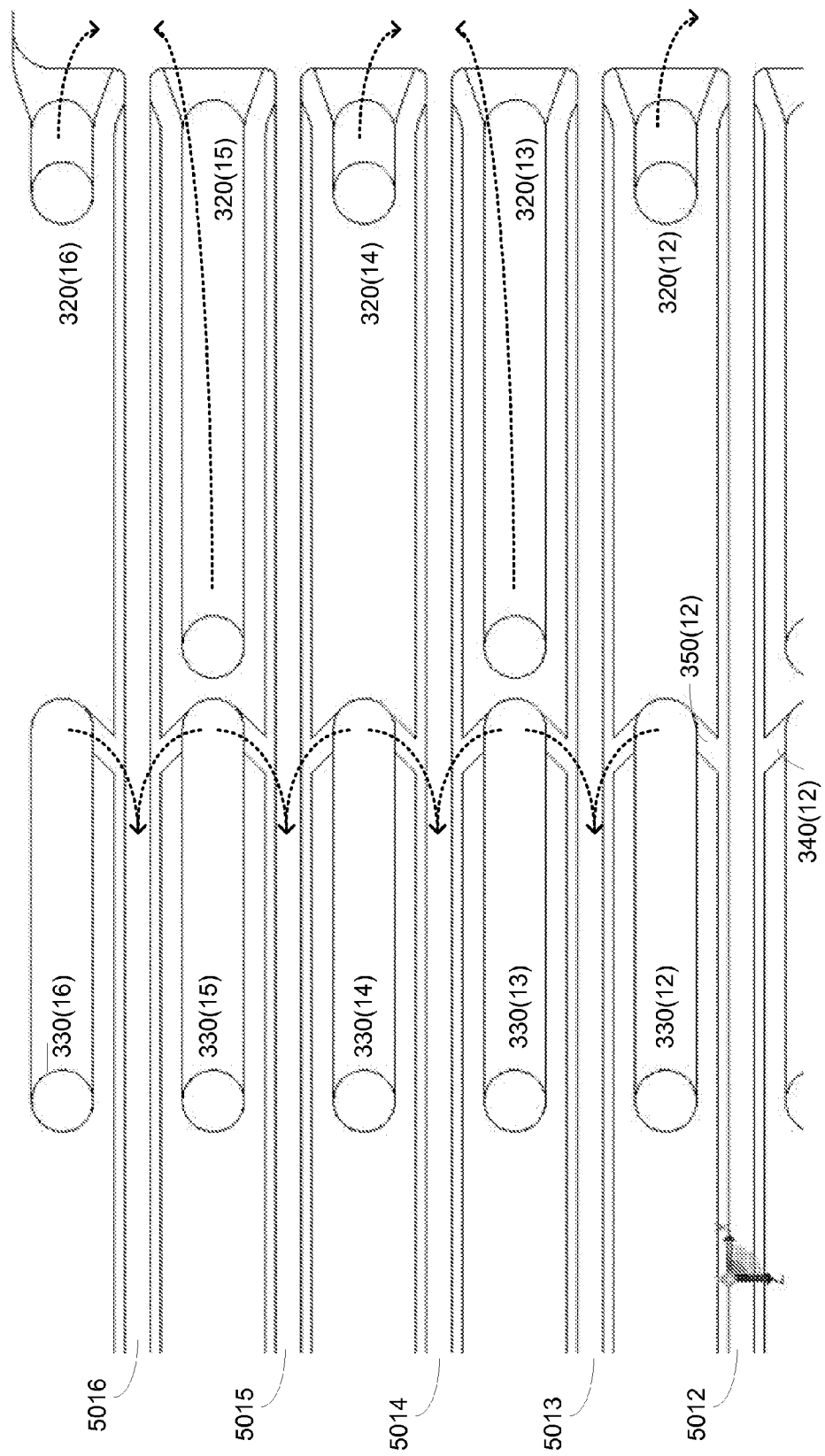
Figure 5F:
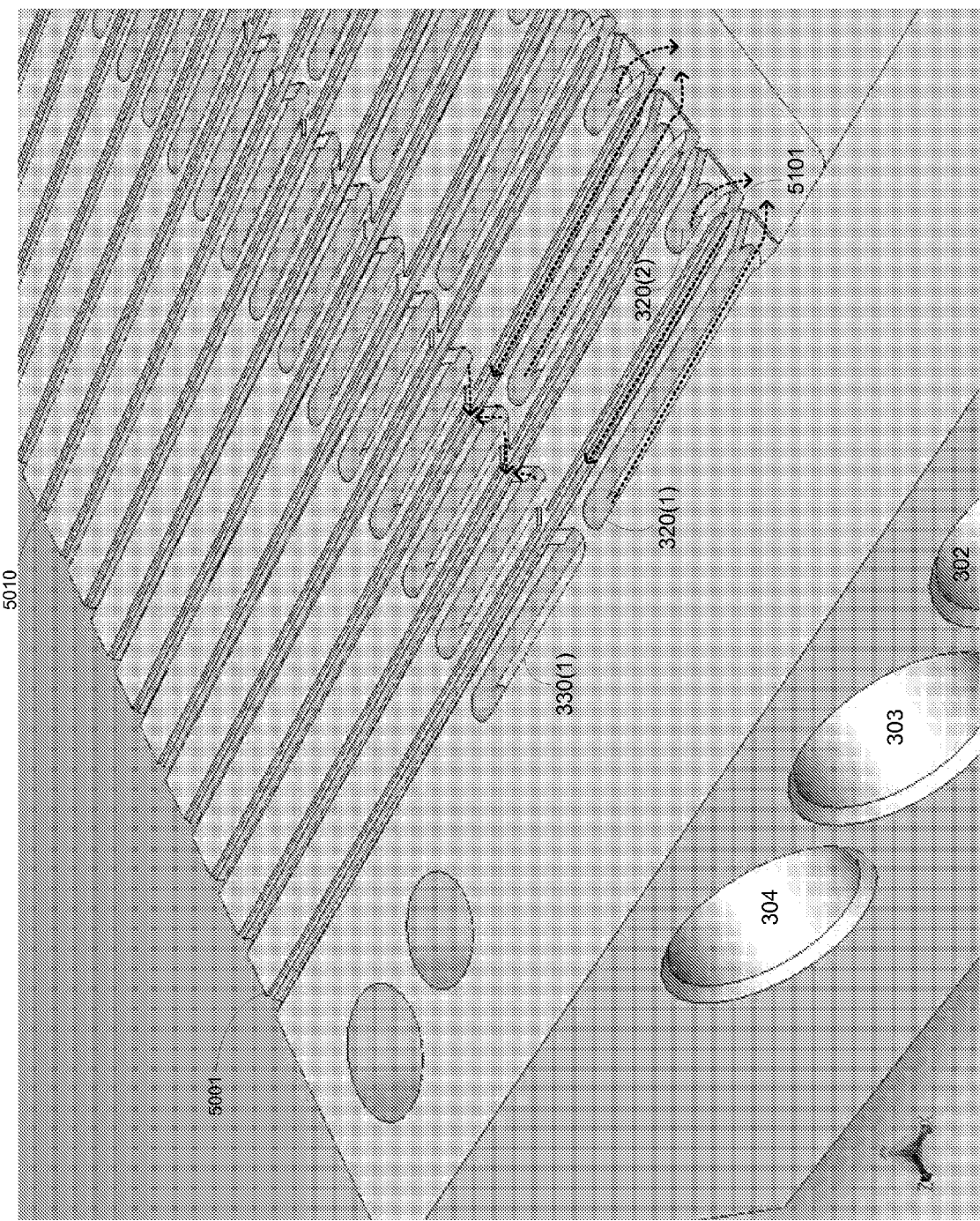

The feeder includes multiple tunnels such as tunnels 5001-5016 of FIGS. 5c and 5d. FIGS. 26a-26b illustrate only three of these tunnels—tunnels 5001-5003. Objects can be induced to enter these tunnels and propagate towards tunnels of transferors by inducing so called inducing gas pulses. These inducing gas pulses can be introduced by sucking gas from outlets formed in the tunnels or near these tunnels.

Usually, after a period of inducing objects to enter the tunnels of the feeders the remaining objects can be aggregated near the opening of these tunnels in a manner that prevents or at least slows down additional objects from being conveyed through these tunnels.

By introducing one or more gas pulses that reject the object from the tunnels this problem can be solved or at least reduced.

Accordingly, the feeder can perform the following sequence of stages and can repeat these stages many times: (i) introduce at least one inducing gas pulse that induces objects to enter the tunnels of the feeder; (ii) introduce at least one rejecting gas pulse that rejects objects from the tunnels of the feeder.

After introducing one or more rejecting gas pulses the feeder can repeat the mentioned above stages and start by introducing at least one inducing gas pulse.

It is noted that after introducing one or more rejecting gas pulses the pressure that is developed in the space in which the objects are located can be released through the tunnels and force the objects to enter the tunnels (after being rejected).

The feeder can repeat these stages in a periodical manner, and additionally or alternatively, in response to an event such as a reduction in the rate of provision of objects by the feeder, an aggregation of objects in a space that precedes the tunnels and the like. The provision of objects can be monitored by image sensors as well as contact sensors magnetic sensors or other sensors that can monitor toe tunnels of the feeder.

FIG. 26a illustrates an aggregation of objects near the opening of tunnels 5001, 5002 and 5003. These objects are aggregated while inducing gas pulses are applied—as illustrated by dashed arrows that point towards the tunnels.

FIG. 26b illustrates an rejection of objects from the opening 320(1), 320(2) and 320(3) that affect the air flow through tunnels 5001, 5002 and 5003 as a result of applying one or more rejecting gas pulses (as illustrated by dashed arrows).

The pressure differential introduced by an inducing gas pulse can differ from a pressure differential introduced by a rejecting gas pulse. The rejecting gas pulses can be stronger—induce a higher pressure differential.

The tunnels 5001, 5002 and 5003 can be preceded by space 310 that is arranged to receive the objects. The height of space 310 is designed to prevent objects from being positioned above another object—it is smaller than twice the height of a single object.

Figure 27:
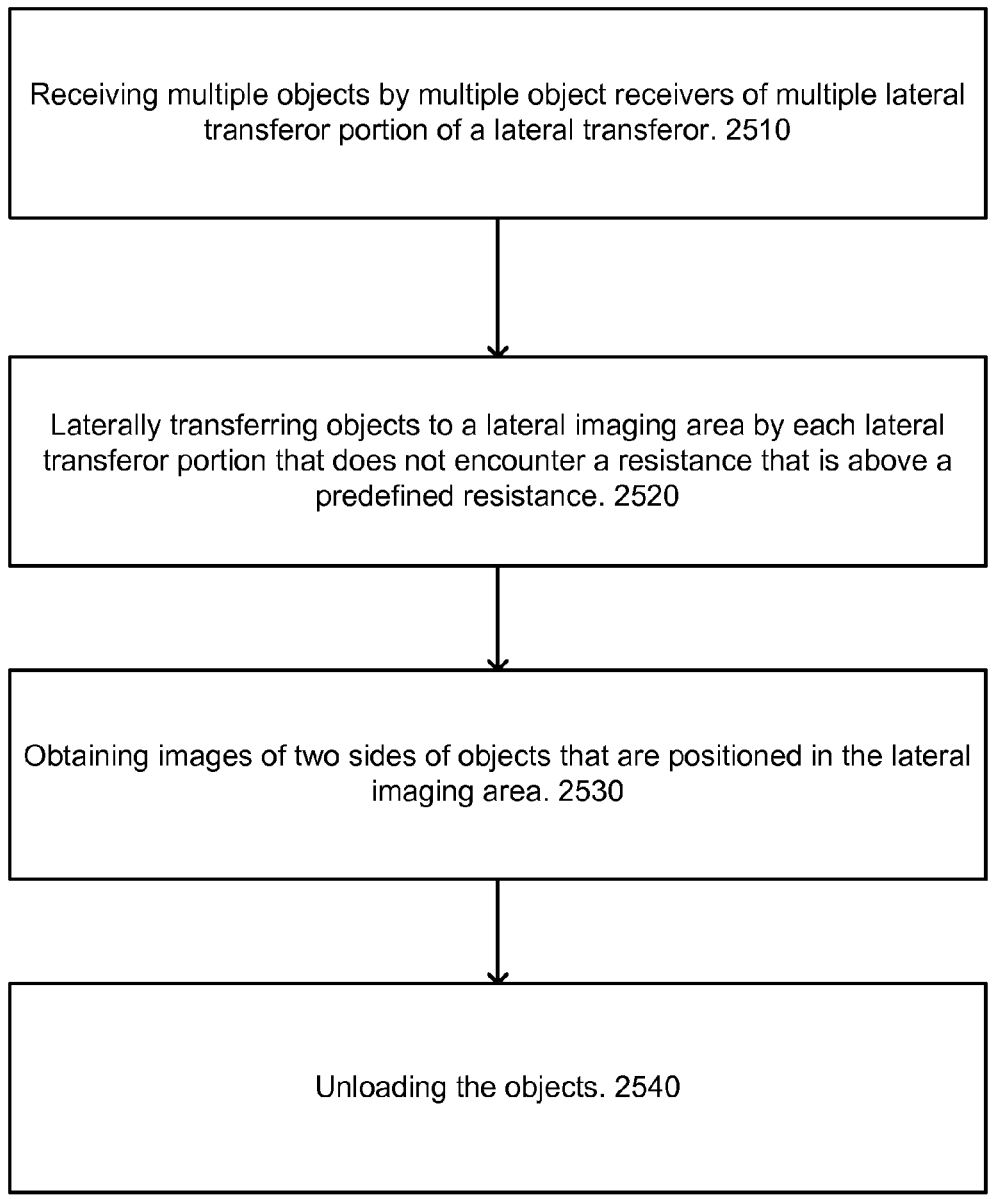
FIGS. 27-29 illustrate methods according to various embodiments of the invention.

FIG. 27 illustrates method 2500 for imaging objects, according to an embodiment of the invention.

Method 2500 starts by stage 2510 of receiving multiple objects by multiple object receivers of multiple lateral transferor portion of a lateral transferor.

Stage 2510 can include receiving multiple objects by multiple object receivers, wherein each bus receiver includes multiple spaces in which objects are positioned in a lateral manner.

Stage 2510 can include receiving multiple objects by multiple object receivers from loading elements that are substantially vertical to the bus receivers. Objects can move within the loading element in a longitudinal manner.

Stage 2510 can include moving, by the transfer element, the object receiver to one or more initial positions so that the object receiver receives multiple objects. Referring to the example of FIG. 12, an object receiver such as bus 820 is moved to the right in order to receive one object after another from loading unit 812. At each initial position a space of bus 820 faces the output of loading unit 812.

Stage 2510 is followed by stage 2520 of laterally transferring objects to a lateral imaging area by each lateral transferor portion that does not encounter a resistance that is above a predefined resistance.

Stage 2520 is followed by stage 2530 of obtaining images of two sides of objects that are positioned in the lateral imaging area.

Stage 2530 is followed by stage 2540 of unloading the objects. It can involve moving the lateral transferor portion towards an unloading unit and can even include performing at least one movement that can assist in releasing stuck objects.

Referring to the example of FIG. 12, an object receiver such as bus 820 is moved to the right in order to unload one object after another to unloading unit 832. At each unloading position a space of bus 820 faces the output of unloading unit 832.

Each lateral transferor portion can include an object receiver and a transfer element. Stage 2520 of laterally transferring can include moving object receivers by transfer elements that do not encounter a resistance that is above a predefined resistance. The predefined resistance can indicate that an object is stuck between the object receiver and a loading element.

Stage 2520 and 2540 can involve moving, by the transfer element, the object receiver in a reciprocating manner.

Stage 2520 can involve moving the object receiver to a lateral imaging position.

Stage 2540 can include moving the object receiver to an additional position—that is even more to the left that these initial position. Accordingly—the multiple initial positions are located between the additional position and the lateral imaging position.

Stages 2520 and 2540 can include converting, by each transfer element, a rotational movement of at least one rotating element to a linear movement of the object receiver unless encountering a resistance that is above the predefined resistance.

Stages 2520 and 2540 can include using a rotational movement to linear movement converter that includes at least one rotating element that is loosely connected to a linear structural element.

Stages 2520 and 2540 can include converting a rotational movement of a shared rotational element to a linear movement of each of the multiple transfer elements.

Stages 2520 and 2540 can include converting a rotational movement to a linear movement by a multi-clutch.

Method 2500 or at least various stages of method can be applied in combination with stages of other methods.

Figure 28:
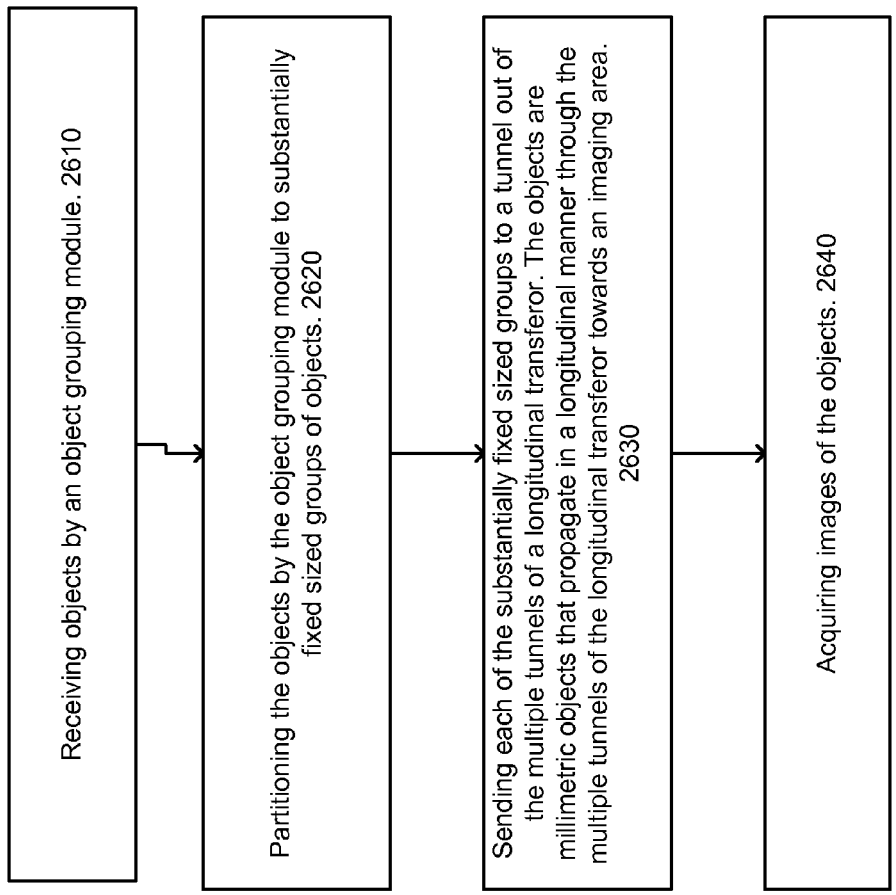

FIG. 28 illustrates method 2600 for imaging objects, according to an embodiment of the invention.

Method 2600 starts by stage 2610 of receiving objects by an object grouping module.

Stage 2610 is followed by stage 2620 of partitioning the objects by the object grouping module to substantially fixed sized groups of objects.

Stage 2620 is followed by stage 2630 of sending each of the substantially fixed sized groups to a tunnel out of the multiple tunnels of a longitudinal transferor. The objects are millimeteric objects (Of at least one dimension that does not exceed few millimeters) that propagate in a longitudinal manner through the multiple tunnels of the longitudinal transferor towards an imaging area.

Stage 2630 is followed by stage 2640 of acquiring images of the objects.

Stage 2620 can include utilizing pairs of stopping elements. Each pair of stopping elements includes a first stopping element and a stopping element that are spaced apart from each other.

Stage 2620 can include allowing, by the second stopping elements, a transfer of objects towards a tunnel of the longitudinal transferor during a fixed time period and preventing, by the first stopping element, objects from passing it during the fixed time period.

Stage 2620 can include utilizing multiple pairs of stopping elements. It can include moving stopping elements that form the pairs of stopping elements from an object stopping position to an object unstopping position by applying a gas differential.

Stage 2620 can include utilizing multiple pairs of stopping elements wherein each stopping element includes a piston that is connected to a vertical rod. The partitioning includes reciprocating the piston within a space that has an inlet and an outlet by introducing gas to the space. The piston reciprocates between an object stopping position in which the vertical rod stops objects from passing it and an object unstopping position in which the vertical rod allows objects to pass it.

Figure 29:
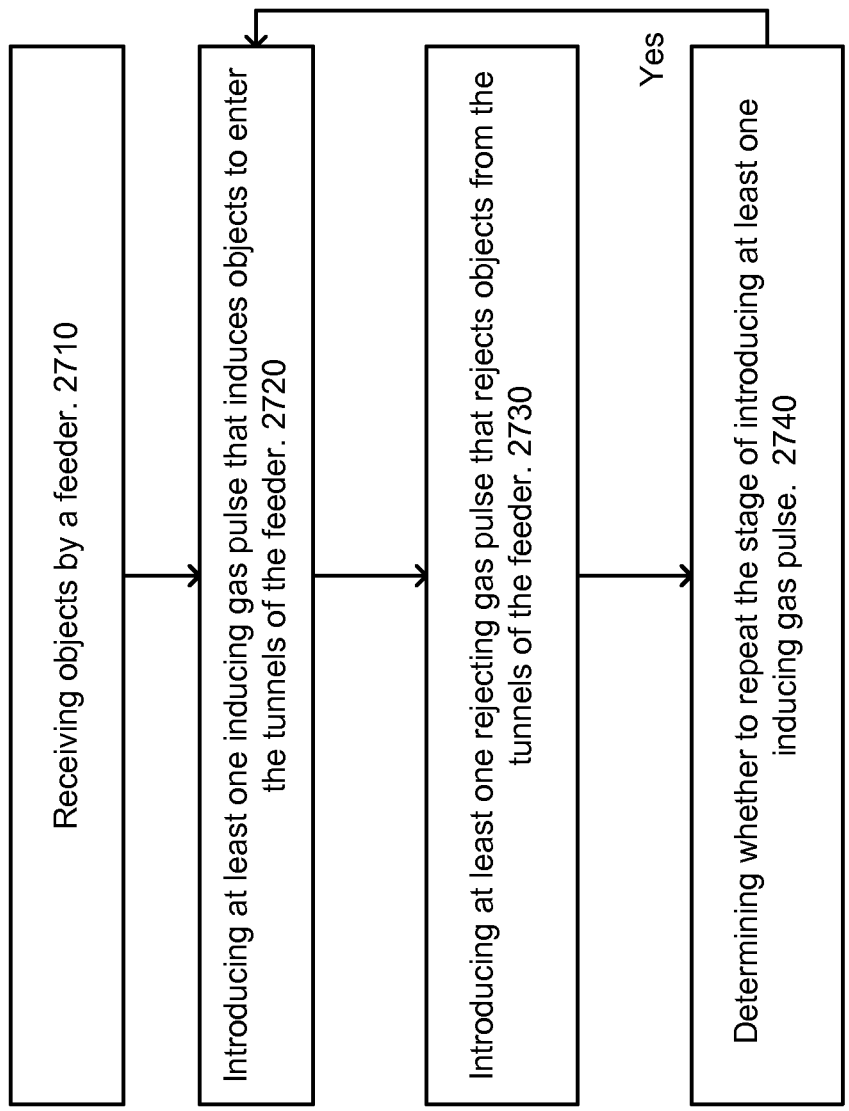

FIG. 29 illustrates method 2700 for imaging objects, according to an embodiment of the invention.

Method 2700 starts by stage 2710 of receiving objects by a feeder.

Stage 2710 can include receiving the objects in a space that preceded the tunnels of the feeder. The height of the space can be designed to prevent objects from being positioned above another object.

Stage 2710 can be followed by repetitions of the stages 2720 and 2730.

Stage 2720 includes introducing at least one inducing gas pulse that induces objects to enter the tunnels of the feeder.

Stage 2730 includes introducing at least one rejecting gas pulse that rejects objects from the tunnels of the feeder.

Stage 2730 can be followed by a stage 2720 or by stage 2740 of determining whether to repeat stage 2720.

States 2720 and 2730 can be repeated in a periodic manner.

Stage 2740 can include determining to jump to stage 270 in response to at least one of the following parameters of a combination thereof: (i) a predefined period lapsed from the last time stage 2720 was executed; (ii) a number of iteration did reach a predefined threshold; (iii) an amount of objects transferred through the tunnels reaches a minimal threshold; (iv) the rate of objects that pass through the tunnels reached a predefined minimal threshold; (v) a gas pressure has been developed in the tunnels; (vi) objects were accumulated in a space that preceded the tunnels.

The pressure differential introduced by an inducing gas pulse can differ from a pressure differential introduced by a rejecting gas pulse.

Various stages of the mentioned above methods can be combined. For example, method 2700 can be followed by either one of methods 2600, 2500, 1900, 1500 and 1800. Yet for another example, method 2600 can be followed by either one of methods 1500, 1800, 1900 and 2500. Method 2500 can be executed before method 1500, after method 1500 or between stages of method 1500, and the like.

System components can be combined in various manners. For example, object grouping module can be included in any of the mentioned above systems. For example, it can precede first longitudinal transferor 110 of FIG. 1A. Any of the mentioned above systems can include one or more lateral transferors and one or more longitudinal transferors.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

In addition, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

However, other modifications, variations, and alternatives are also possible. The specifications and drawings are, accordingly, to be regarded in an illustrative rather than in a restrictive sense.

The word 'comprising' does not exclude the presence of other elements or steps then those listed in a claim. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

I claim:

1. A system for acquiring multiple images of objects, the system comprising: a lateral transferor that comprises multiple lateral transferor portions adapted to transfer the objects to a lateral imaging area in a lateral manner; wherein each lateral transferor portion comprises a object receiver and a transfer element; wherein the transfer element moves the object receiver towards an imaging area unless encountering a resistance that is above a predefined resistance; and an imager that is configured to obtain images of two opposite sides of the object when the objects are positioned at the lateral imaging area.

2. The system according to claim 1 wherein the predefined resistance indicates that an object is stuck between the object receiver and a loading element.

3. The system according to claim 1 wherein the transfer element moves the object receiver in a reciprocating manner.

4. The system according to claim 3, wherein the transfer element is arranged to move the object receiver in the reciprocating manner if an object carried by the object receiver is stuck.

5. The system according to claim 1 wherein the transfer element moves the object receiver to multiple initial positions so that the object receiver receives multiple objects, moves the object receiver to a lateral imaging position and then moves the object receiver to an additional position; wherein the multiple initial positions are located between the additional position and the lateral imaging position.

6. The system according to claim 1 wherein each transfer element comprises a rotational movement to linear movement converter that converts a rotational movement of at least one rotating element to a linear movement of the object receiver unless encountering a resistance that is above the predefined resistance.

7. The system according to claim 6 wherein the at least one rotating element is loosely coupled to a linear structural element.

8. The system according to claim 6 wherein multiple transfer elements share at least one rotational element that performs a rotational movement that is translated to a linear movement of each of the multiple transfer elements.

9. The system according to claim 8 wherein multiple transfer elements share a multi-clutch.

10. The system according to claim 1 wherein each bus receiver comprises multiple spaces in which objects are positioned in a lateral manner.

11. The system according to claim 10 wherein each bus receiver receives the objects from a loading element that is substantially vertical to the bus receiver; wherein objects move within the loading element in a longitudinal manner.

12. The system according to claim 1 wherein the objects are millimeteric capacitors.

13. The system according to claim 1 further comprising a sorting unit adapted to sort in parallel multiple objects according to their functionality.

14. The system according to claim 1 further comprising: multiple longitudinal transferors that comprise multiple tunnels through which the objects propagate to multiple imaging areas; wherein the multiple longitudinal transferors utilize gas pressure differentials to convey the objects through the tunnels; and a plurality of rotation modules configured to rotate objects about a longitudinal axis of the objects; wherein each rotating module is located between two longitudinal transferors; wherein the imager is configured to obtain, in each of the multiple imaging areas, an image of a side of the objects.

15. The system according to claim 1 further comprising a feeder that receives objects from an inlet and supplies objects to a lateral transferor via tunnels of the feeder, introduces at least one inducing gas pulse that induces objects to enter the tunnels of the feeder; introduces at least one rejecting gas pulse that rejects objects from the tunnels of the feeder; wherein the introduction of the at least one rejecting gas pulse is followed by introducing at least one inducing gas pulse.

16. The system according to claim 1 comprising a longitudinal transferor that comprises multiple tunnels through which the objects propagate to an imaging area; wherein the longitudinal transferor utilizes gas pressure differentials to convey the objects through the tunnels; and an object grouping module that receives objects and partitions the received objects to substantially fixed sized groups of objects and sends each of the substantially fixed sized groups a tunnel out of the multiple tunnels of the longitudinal transferor.

17. The system according to claim 16, wherein the object grouping module comprises multiple pairs of stopping elements; wherein each pair of stopping elements comprises a first stopping element and a stopping element that are spaced apart from each other; wherein the second stopping elements allows a transfer of objects towards a tunnel of the longitudinal transferor during a fixed time period; wherein the first stopping element prevents objects from passing it during the fixed time period.

18. The system according to claim 1, comprising a sensor for tracking stuck objects.

19. The system according to claim 1, comprising a force or pressure sensor that is arranged to sense a resistance to movement above the predefined resistance.

20. The system according to claim 1, wherein the lateral transferor comprises multiple tunnels through which the objects propagate to an imaging area; wherein the system further comprises a feeder that receives objects from an inlet and supplies objects to the lateral transferor via tunnels of the feeder, introduces at least one inducing gas pulse that induces objects to enter the tunnels of the feeder; introduces at least one rejecting gas pulse that rejects objects from the tunnels of the feeder; wherein the introduction of the at least one rejecting gas pulse is followed by introducing at least one inducing gas pulse.

21. A method for imaging objects, the method comprises: receiving multiple objects by multiple object receivers of multiple lateral transferor portion of a lateral transferor; laterally transferring objects to a lateral imaging area by each lateral transferor portion that does not encounter a resistance that is above a predefined resistance; and obtaining images of two sides of objects that are positioned in the lateral imaging area.

22. The method according to claim 21, comprising sensing for tracking stuck objects.

23. The method according to claim 21, comprising sensing by a force or pressure sensor, a resistance to movement above the predefined resistance.

24. The method according to claim 21, comprising moving an object receiver in a reciprocating manner if sensing that an object carried by the object receiver is stuck.

25. The method according to claim 21, comprising converting, by a rotational movement to linear movement converter of each transfer element, a rotational movement of at least one rotating element to a linear movement of the object receiver unless encountering a resistance that is above the predefined resistance.

26. The method according to claim 25 wherein the at least one rotating element is loosely coupled to a linear structural element.

27. The method according to claim 25 wherein multiple transfer elements share at least one rotational element; wherein the method comprises performing by the at least one rotational element a rotational movement that is translated to a linear movement of each of the multiple transfer elements.

28. The method according to claim 27 wherein multiple transfer elements share a multi-clutch.

29. The method according to claim 21 wherein the predefined resistance indicates that an object is stuck between the object receiver and a loading element.

30. The method according to claim 21 further comprising receiving objects by an object grouping module; partitioning the objects by the object grouping module to substantially fixed sized groups of objects; and sending each of the substantially fixed sized groups to a tunnel out of the multiple tunnels of the longitudinal transferor.

\* \* \* \* \*